United States Patent
Sugimoto

(10) Patent No.: US 11,598,997 B2
(45) Date of Patent: Mar. 7, 2023

(54) ELECTRO-OPTICAL DEVICE AND ELECTRONIC APPARATUS

(71) Applicant: SEIKO EPSON CORPORATION, Tokyo (JP)

(72) Inventor: Yohei Sugimoto, Suwa-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 144 days.

(21) Appl. No.: 17/075,137

(22) Filed: Oct. 20, 2020

(65) Prior Publication Data

US 2021/0116766 A1 Apr. 22, 2021

(30) Foreign Application Priority Data

Oct. 21, 2019 (JP) .............................. JP2019-191773

(51) Int. Cl.
| | |
|---|---|
| *G02F 1/1362* | (2006.01) |
| *G02F 1/1368* | (2006.01) |
| *G02F 1/1333* | (2006.01) |
| *H01L 27/12* | (2006.01) |
| *H01L 29/66* | (2006.01) |

(Continued)

(52) U.S. Cl.
CPC ...... *G02F 1/136286* (2013.01); *G02F 1/1368* (2013.01); *G02F 1/133345* (2013.01); *G02F 1/136209* (2013.01); *G02F 1/136227* (2013.01); *H01L 27/1222* (2013.01); *H01L 27/1244* (2013.01); *H01L 27/1274* (2013.01); *H01L 29/4908* (2013.01); *H01L 29/66757* (2013.01); *H01L 29/78621* (2013.01); *H01L 29/78633* (2013.01); *H01L 29/78675* (2013.01)

(58) Field of Classification Search
CPC ......... G02F 1/136286; G02F 1/133345; G02F 1/136209; G02F 1/136227; G02F 1/1368; H01L 27/1222; H01L 27/1244; H01L 29/4908; H01L 29/78621; H01L 29/78633; H01L 29/78675
USPC ...................................................... 349/42–47
See application file for complete search history.

(56) References Cited

U.S. PATENT DOCUMENTS 6,493,046 B1 * 12/2002 Ueda ................. G02F 1/136213
349/38
6,583,828 B1 * 6/2003 Wada ................ G02F 1/136213
349/39

(Continued)

FOREIGN PATENT DOCUMENTS

| JP | H06-67027 A | 3/1994 |
| JP | H06-67207 A | 3/1994 |

(Continued)

*Primary Examiner* — Charles S Chang
(74) *Attorney, Agent, or Firm* — Oliff PLC

(57) ABSTRACT

A liquid crystal apparatus includes a scan line extending in a ±X direction, a data line extending in a ±Y direction that intersects with the ±X direction, a TFT having a semiconductor layer in which, at a position overlapping with the scan line in plan view, one source drain region and a channel region extend along the ±X direction, and at a position overlapping with the data line in plan view, another source drain region extends along the ±Y direction, and a first upper capacitance element and a second upper capacitance element provided at a position overlapping with the data line, so as to overlap with the other source drain region in plan view.

12 Claims, 50 Drawing Sheets

(51) Int. Cl.
  *H01L 29/49* (2006.01)
  *H01L 29/786* (2006.01)

(56) References Cited

U.S. PATENT DOCUMENTS

| | | | |
|---|---|---|---|
| 2007/0165147 | A1 | 7/2007 | Kamijima et al. |
| 2010/0289025 | A1* | 11/2010 | Nakagawa ............ H01L 27/124 |
| | | | 257/E29.291 |
| 2013/0270526 | A1* | 10/2013 | Kim .................... H01L 27/3265 |
| | | | 257/E51.019 |
| 2017/0186831 | A1* | 6/2017 | Nam .................. H01L 27/3272 |

FOREIGN PATENT DOCUMENTS

| JP | 2000-98409 A | 4/2000 |
|---|---|---|
| JP | 2001-66631 A | 3/2001 |
| JP | 2001-66633 A | 3/2001 |
| JP | 2007-187964 A | 7/2007 |
| JP | 2012-78624 A | 4/2012 |

* cited by examiner

ELECTRO-OPTICAL DEVICE AND ELECTRONIC APPARATUS

The present application is based on, and claims priority from JP Application Serial Number 2019-191773, filed Oct. 21, 2019, the disclosure of which is hereby incorporated by reference herein in its entirety.

BACKGROUND

1. Technical Field

The present disclosure relates to an electro-optical device and an electronic apparatus.

2. Related Art

In the past, as one of electro-optical devices, an active drive type liquid crystal apparatus including a transistor as a switching element for each pixel has been known. When such a liquid crystal device is used in a light modulating means such as a projector, incident light on the liquid crystal apparatus increases compared to a direct view type liquid crystal apparatus. The increased incident light makes it easier to generate light leakage current in a transistor region. The light leakage current may inhibit potential retention of pixels, and cause deterioration in display quality such as flickering, or display unevenness for each of the pixels. Thus, various attempts have been made to suppress the deterioration in display quality.

For example, JP-A-6-67207 discloses a liquid crystal display apparatus in which a pixel additional capacity is formed in a groove formed in a vertical direction with respect to a substrate, in order to increase a retention capacitor and improve potential retention characteristics of pixels. In addition, JP-A-2012-78624 proposes a retention capacitor that is a capacitance element provided so as to cover a Thin Film Transistor (TFT), in order to reduce light incident on a transistor region and increase the retention capacitor.

However, for the liquid crystal display apparatus described in JP-A-6-67207, there has been a problem in that it is difficult to increase the retention capacitor. In particular, it is desirable that a film thickness of a dielectric film is thin, in order to increase the retention capacitor. Compared to this, since a gate insulating film and the dielectric film are in an identical layer, it was difficult to reduce the film thickness of the dielectric film.

In addition, in the liquid crystal apparatus described in JP-A-2012-78624, there has been a problem in that structure becomes complex, the number of manufacturing steps are likely to increase, and manufacturing costs are difficult to reduce. In other words, there has been a demand for an electro-optical device that increases a retention capacitor and reduces manufacturing costs.

SUMMARY

An electro-optical device includes a scan line extending in a first direction, a data line extending in a second direction that intersects with the first direction, a transistor having a semiconductor layer in which, at a position overlapping with the scan line, one source drain region and a channel region extend along the first direction, and at a position overlapping with the data line, another source drain region extends along the second direction, and a capacitance element having a capacitance electrode provided, at a position overlapping with the data line, so as to overlap with the other source drain region.

The above electro-optical device may include a substrate, the substrate may include a recessed portion at a position overlapping with the data line, and the other source drain region may extend along a side surface and a bottom surface of the recessed portion.

The above electro-optical device may include an insulating layer in the recessed portion, and the other source drain region may extend on the insulating layer.

The above electro-optical device may include a pixel electrode provided corresponding to the transistor, and a first relay layer electrically coupled to the pixel electrode via a first contact hole, and the first contact hole may overlap with a second contact hole for electrically coupling a gate electrode of the transistor to the scan line.

In the above electro-optical device, a gate insulation layer of the transistor includes a silicon oxide film and a silicon nitride film, and a capacitance insulation layer of the capacitance element may be constituted only by a silicon nitride film.

In the above electro-optical device, a silicon nitride film may not be provided in a region of the semiconductor layer that does not overlap with the gate electrode and the capacitance electrode.

The above electro-optical device may include the pixel electrode provided corresponding to the transistor, the first relay layer electrically coupled to the pixel electrode, and a second relay layer electrically coupled to the first relay layer, the first relay layer and the second relay layer may each include a main body portion extending in the first direction, and overlapping with the semiconductor layer, and a protruding portion protruding in the second direction from the main body portion.

The above electro-optical device may include a capacitance wiring line electrically coupled to the capacitance electrode, and the capacitance wiring line and the capacitance electrode may each include a main body portion extending in the second direction, and overlapping with the data line, and a protruding portion protruding in the first direction from the main body portion, and overlapping with the semiconductor layer extending in the first direction.

In the above electro-optical device, the capacitance wiring line may include another protruding portion protruding toward an opposite side to the protruding portion, and overlapping with another semiconductor layer adjacent to the semiconductor layer.

The above electro-optical device may include a light shielding wall provided along a part of the semiconductor layer, and the light shielding wall may include an identical material to a material of the data line.

In the above electro-optical device, the gate electrode of the transistor may be electrically coupled to the scan line via the light shielding wall.

An electronic apparatus includes the above electro-optical device.

DESCRIPTION OF EXEMPLARY EMBODIMENTS

Here, in each of the following drawings, as necessary, X, Y, Z axes are assigned as mutually orthogonal coordinate axes, a direction indicated by each arrow is denoted as + direction, and a direction opposed to the + direction is denoted as a − direction. Note that, the a +Z direction may be referred to as an upper side and a −Z direction may be referred to as a lower side, and viewing in the +Z direction is referred to as viewing in plan view, or in a planar manner. Furthermore, in the following description, for example, a description for a substrate of "on the substrate" indicates any one of a case in which a component is disposed on the substrate in contact therewith, a case in which a component is disposed on the substrate via another structure, or a case in which a part of a component is disposed on the substrate in contact therewith, and another part is disposed on the substrate via another structure.

1. First Exemplary Embodiment

In the present exemplary embodiment, an active drive type liquid crystal apparatus including a thin film transistor as a transistor for each pixel will be described as an example of an electro-optical device. Note that, hereinafter, the thin film transistor is abbreviated as TFT. The liquid crystal apparatus can be used favorably as a light modulation device in a projection-type display apparatus as an electronic apparatus described below, for example.

1.1. Configuration of Liquid Crystal Apparatus

Figure 1:
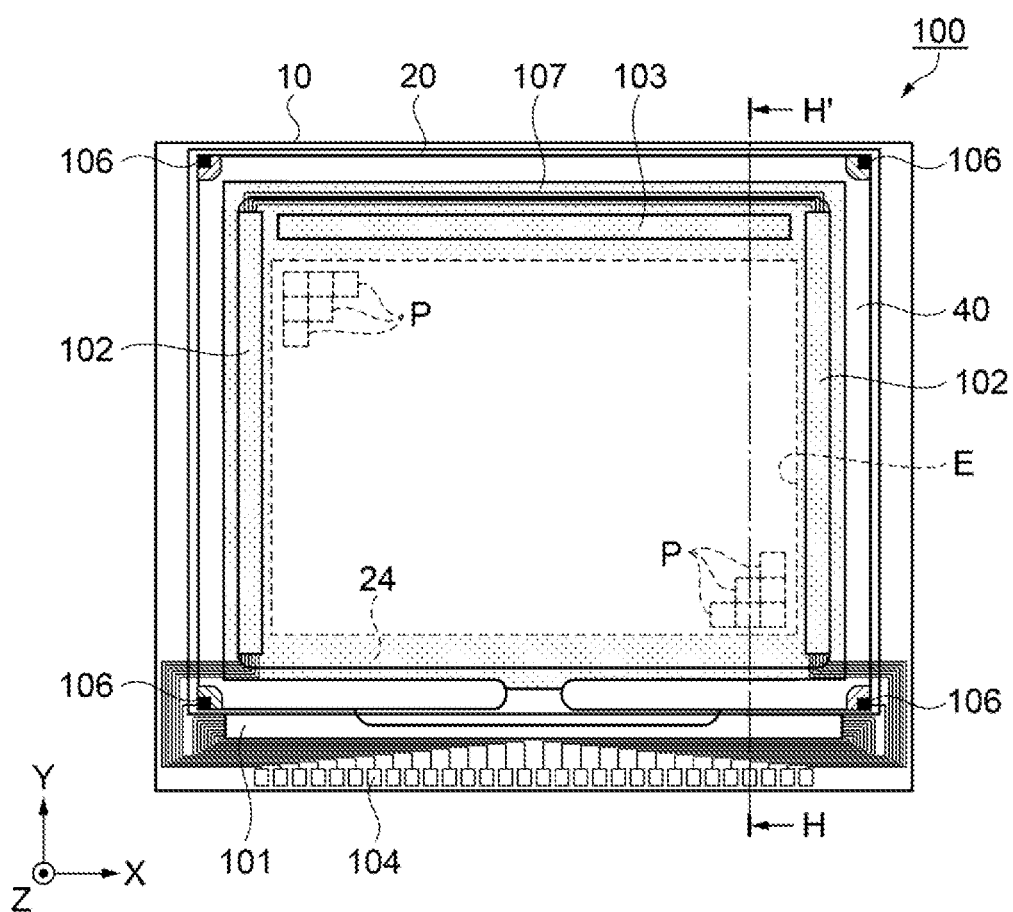
FIG. 1 is a schematic plan view illustrating a configuration of a liquid crystal apparatus as an electro-optical device according to a first exemplary embodiment.
Figure 2:
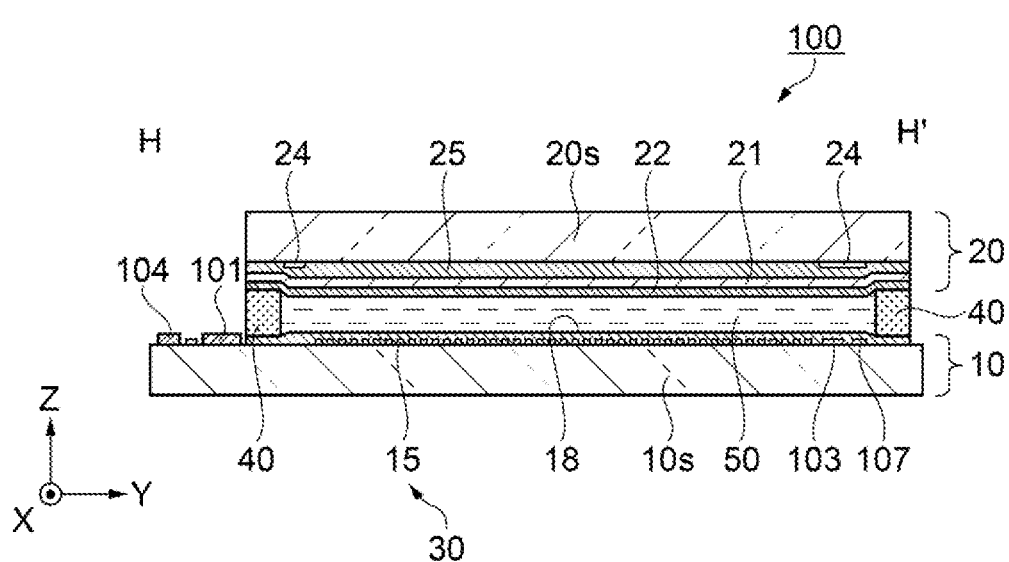
FIG. 2 is a schematic cross-sectional view illustrating structure of the liquid crystal apparatus.
Figure 3:
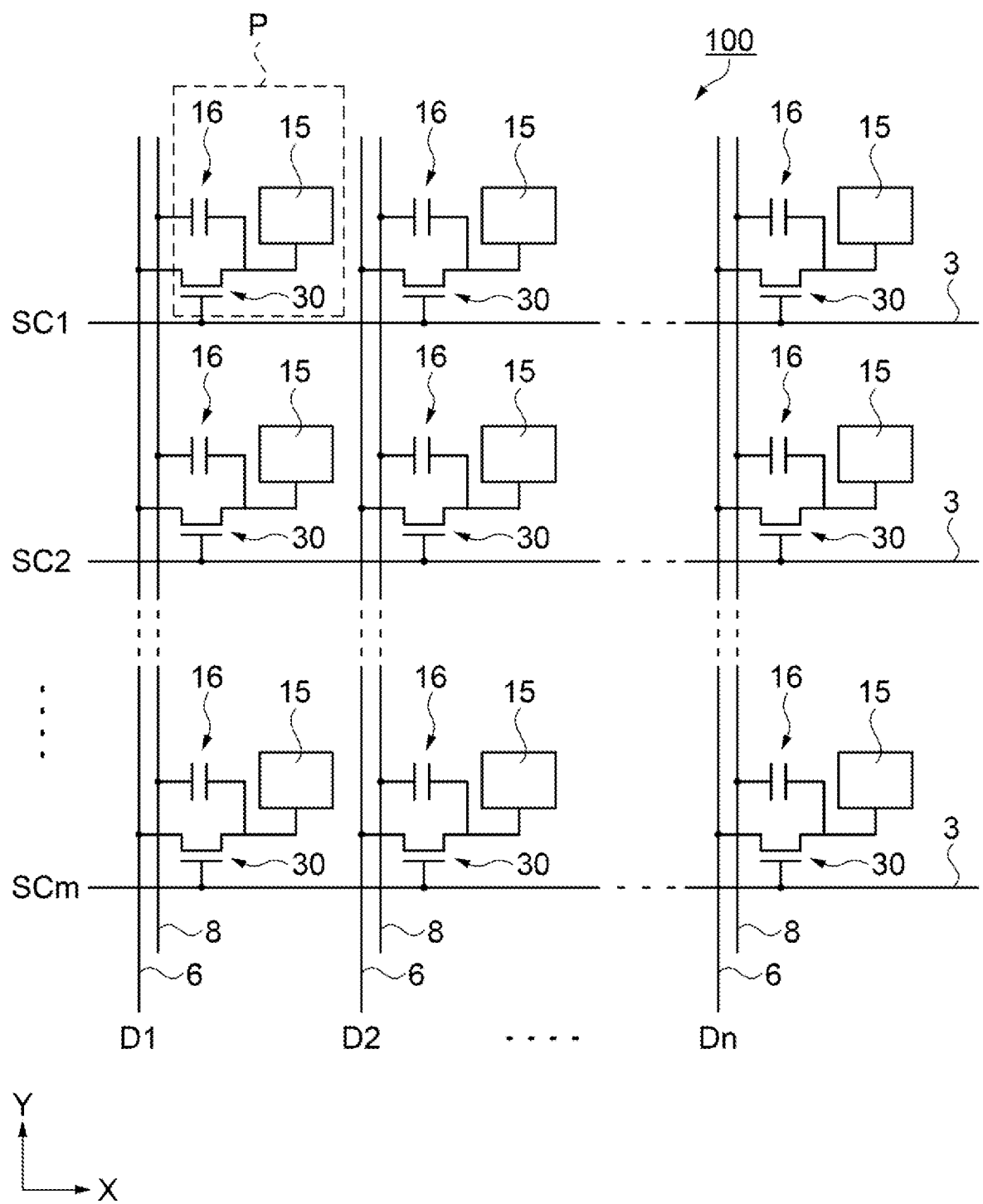
FIG. 3 is an equivalent circuit diagram illustrating an electrical configuration of the liquid crystal apparatus.

A configuration of the liquid crystal apparatus as an electro-optical device according to the present exemplary embodiment will be described with reference to FIG. 1 to FIG. 3. FIG. 1 is a schematic plan view illustrating a configuration of a liquid crystal apparatus as an electro-optical device according to a first exemplary embodiment. FIG. 2 is a schematic cross-sectional view illustrating structure of the liquid crystal apparatus. FIG. 3 is an equivalent circuit diagram illustrating an electrical configuration of the liquid crystal apparatus. Here, FIG. 2 illustrates a cross section along a YZ plane including a line segment H-H' in FIG. 1.

As illustrated in FIG. 1 and FIG. 2, a liquid crystal apparatus 100 of the present exemplary embodiment includes an element substrate 10, a counter substrate 20 disposed and facing the element substrate 10, and a liquid crystal layer 50 including liquid crystal sandwiched between the element substrate 10 and the counter substrate 20.

For a substrate 10s of the element substrate 10, for example, a substrate such as a glass substrate or a quartz substrate is used. For a substrate 20s of the counter substrate 20, for example, a transparent substrate such as a glass substrate or a quartz substrate is used.

A shape of the element substrate 10 in plan view is larger than that of the counter substrate 20. The element substrate 10 is bonded to the counter substrate 20, via a seal material 40 disposed along an outer edge of the counter substrate 20. Liquid crystal having positive or negative dielectric anisotropy is encapsulated in a gap between the element substrate 10 and the counter substrate 20 to provide the liquid crystal layer 50.

A display region E including a plurality of pixels P arrayed in a matrix is provided inside the seal material 40. A partition portion 24 is provided surrounding the display region E, between the seal material 40 and the display region E. A dummy pixel region (not illustrated) that does not contribute to display is provided around the display region E.

The element substrate 10 is provided with a terminal portion in which a plurality of external coupling terminals 104 are arrayed. A data line driving circuit 101 is provided between a first side portion along the terminal portion, and the seal material 40. In addition, an inspection circuit 103 is provided between the seal material 40 along a second side portion facing the first side portion and the display region E.

A pair of scan line driving circuits 102 are provided between the seal material 40 along a third side portion and a fourth side portion orthogonal to the first side portion and facing each other, and the display region E. Further, between the seal material 40 of the second side portion and the inspection circuit 103, a plurality of wiring lines 107 coupling the two scan line driving circuits 102 are provided.

Wiring lines linked to the data line driving circuit 101 and the scan line driving circuit 102 are coupled to the plurality of external coupling terminals 104 arrayed along the first side portion. Note that, the arrangement of the inspection circuit 103 is not limited to the above.

Here, in the present specification, a direction along the first side portion is a ±X direction as a first direction. Further, a second direction that intersects with the first direction is a ±Y direction, that is a direction orthogonal to the first side and along the third side portion and the fourth side portion facing each other. In addition, a direction orthogonal to the ±X direction and the ±Y direction that is a normal line direction of the element substrate 10 and the counter substrate 20 is a ±Z direction.

As illustrated in FIG. 2, on a surface of the element substrate 10s on a side of the liquid crystal layer 50, a light-transmitting pixel electrode 15 and a TFT 30 as a transistor being a switching element, that are provided for each of the pixels P, and signal wiring line, and an alignment film 18 covering these components are provided. The TFT 30 and the pixel electrode 15 are constituent elements of the pixel P. The element substrate 10 includes the substrate 10s, the pixel electrode 15, the TFT 30, the signal wiring line, and the alignment film 18 that are provided on the substrate 10s. The pixel electrode 15 is provided corresponding to the TFT 30.

The partition portion 24, an insulating layer 25 formed covering the partition portion 24, a counter electrode 21 as a common electrode provided covering the insulating layer 25, and an alignment film 22 covering the counter electrode 21 are provided on the surface of the substrate 20s on a side of the liquid crystal layer 50. The counter substrate 20 in the present exemplary embodiment includes at least the partition portion 24, the counter electrode 21, and the alignment film 22. Note that, in the present exemplary embodiment, the example in which the common electrode is disposed on a side of the counter substrate 20 as the counter electrode 21 is illustrated, but the present disclosure is not limited thereto.

As illustrated in FIG. 1, the partition portion 24 surrounds the display region E, and is provided at a position overlapping with the scan line driving circuit 102 and the inspection circuit 103 in a planar manner. Accordingly, light incident on these circuits from a side of the counter substrate 20 is shielded, and erroneous operation of the circuits due to the incident light is prevented. Further, unnecessary stray light is shielded so as not to be incident on the display region E, ensuring high contrast in display of the display region E.

The insulating layer 25 is formed of an inorganic material such as, for example, light-transmissive silicon oxide. The insulating layer 25 is provided so as to cover the partition portion 24 and such that a surface on a side of the liquid crystal layer 50 is flat.

The counter electrode 21 includes a transparent conductive layer such as an Indium Tin Oxide (ITO) film and an Indium Zinc Oxide (IZO) film, covers the insulating layer 25, and is electrically coupled to vertical conducting portions 106 provided at four corners of the counter substrate 20 respectively. The vertical conducting portion 106 is electrically coupled to a wiring line on a side of the element substrate 10.

The alignment film 18 covering the pixel electrode 15, and the alignment film 22 covering the counter electrode 21 are selected based on an optical design of the liquid crystal apparatus 100. Examples of a formation material of the alignment films 18 and 22 include an inorganic alignment film of silicon oxide or the like, and an organic alignment film of polyimide or the like.

The liquid crystal apparatus 100 thus configured is, for example, of a transmissive-type, and an optical design is adopted such as a normally white mode in which transmittance of the pixel P when voltage is not applied is larger than transmittance when voltage is applied, or a normally black mode in which the transmittance of the pixel P when voltage is not applied is smaller than the transmittance when voltage is applied. In the liquid crystal panel including the element substrate 10 and the counter substrate 20, a polarizing element is disposed on each of a light incident side and light exit side in accordance with the optical design.

In the present exemplary embodiment, an example is described, in which the optical design of the normally black mode is applied, using the inorganic alignment films described as the alignment films 18 and 22, and a liquid crystal material having negative dielectric anisotropy.

Next, an electrical configuration of the liquid crystal apparatus 100 will be described below with reference to FIG. 3. As illustrated in FIG. 3, the liquid crystal apparatus 100 includes a plurality of scan lines 3, a plurality of data lines 6, and a plurality of capacitance lines 8 disposed in parallel with the data lines 6, as signal wiring lines insulated from one another and orthogonal to one another at least in the display region E. The scan line 3 extends in the ±X direction as the first direction. The data line 6 extends in the ±Y direction as the second direction intersecting with the first direction. Note that, in FIG. 3, a direction in which the capacitance line 8 extends is the ±Y direction, but the present disclosure is not limited thereto.

The scan line 3, the data line 6, and the capacitance line 8, and the pixel electrode 15, the TFT 30, and a capacitance element 16 in a region partitioned by these signal wiring lines, are provided, and these wiring lines and components constitute a pixel circuit of the pixel P. The pixel electrode 15, the TFT 30, and the capacitance element 16 are disposed for each the pixel P.

The scan line 3 is electrically coupled to a gate of the TFT 30. Specifically, the data line 6 is electrically coupled to a data line side source drain region, that is one source drain region in the TFT 30. The scan line 3 has a function to simultaneously control on and off of the TFTs 30 provided in an identical line. The pixel electrode 15 is electrically coupled to a pixel electrode side source drain region, that is another source drain region in the TFT 30. A semiconductor layer including the source drain region of the TFT 30 will be described later.

The data lines 6 are electrically coupled to the above-described data line driving circuit 101, and supply image signals D1, D2, ..., and Dn supplied from the data line driving circuit 101 to the pixels P. The scan lines 3 are electrically coupled to the above-described scan line driving circuit 102, and supply scan signals SC1, SC2, ..., and SCm supplied from the scan line driving circuit 102 to the pixels P.

The image signal D1 to the image signal Dn supplied from the data line driving circuit 101 to the data lines 6 may be line-sequentially supplied in this order, or may be supplied to the plurality of respective data lines 6 adjacent to each other in groups. The scan line driving circuit 102 line-sequentially supplies the scan signal SC1 to the scan signal SCm to the scan lines 3 in a pulsed manner at predetermined timings.

In the liquid crystal apparatus 100, the TFT 30 as the switching element is turned on only for a certain period of time by being inputted with the scan signal SC1 to the scan signal SCm. Accordingly, the image signal D1 to the image signal Dn supplied from the data lines 6 are written to the pixel electrodes 15 at predetermined timing. Then, the image signal D1 to the image signal Dn having a predetermined level written into the liquid crystal layer 50 via the pixel electrodes 15 are held for a certain period of time between the pixel electrodes 15 and the counter electrodes 21 that are disposed facing the pixel electrodes 15 with the liquid crystal layer 50 interposed therebetween.

To prevent the image signal D1 to the image signal Dn held from leaking, the capacitance elements 16 are electrically coupled in parallel with liquid crystal capacitance provided between the pixel electrodes 15 and the counter electrodes 21. The capacitance element 16 is provided in a layer between the semiconductor layer described below of the TFT 30 and the capacitance line 8. Details of the semiconductor layer and the capacitance element 16 will be described later.

Here, although not illustrated in FIG. 3, the inspection circuit 103 described above is coupled to the data line 6. Thus, in a manufacturing process of the liquid crystal apparatus 100, the above image signals can be detected via the inspection circuit 103, and it is possible to check malfunction and the like of the liquid crystal apparatus 100.

Figure 4:
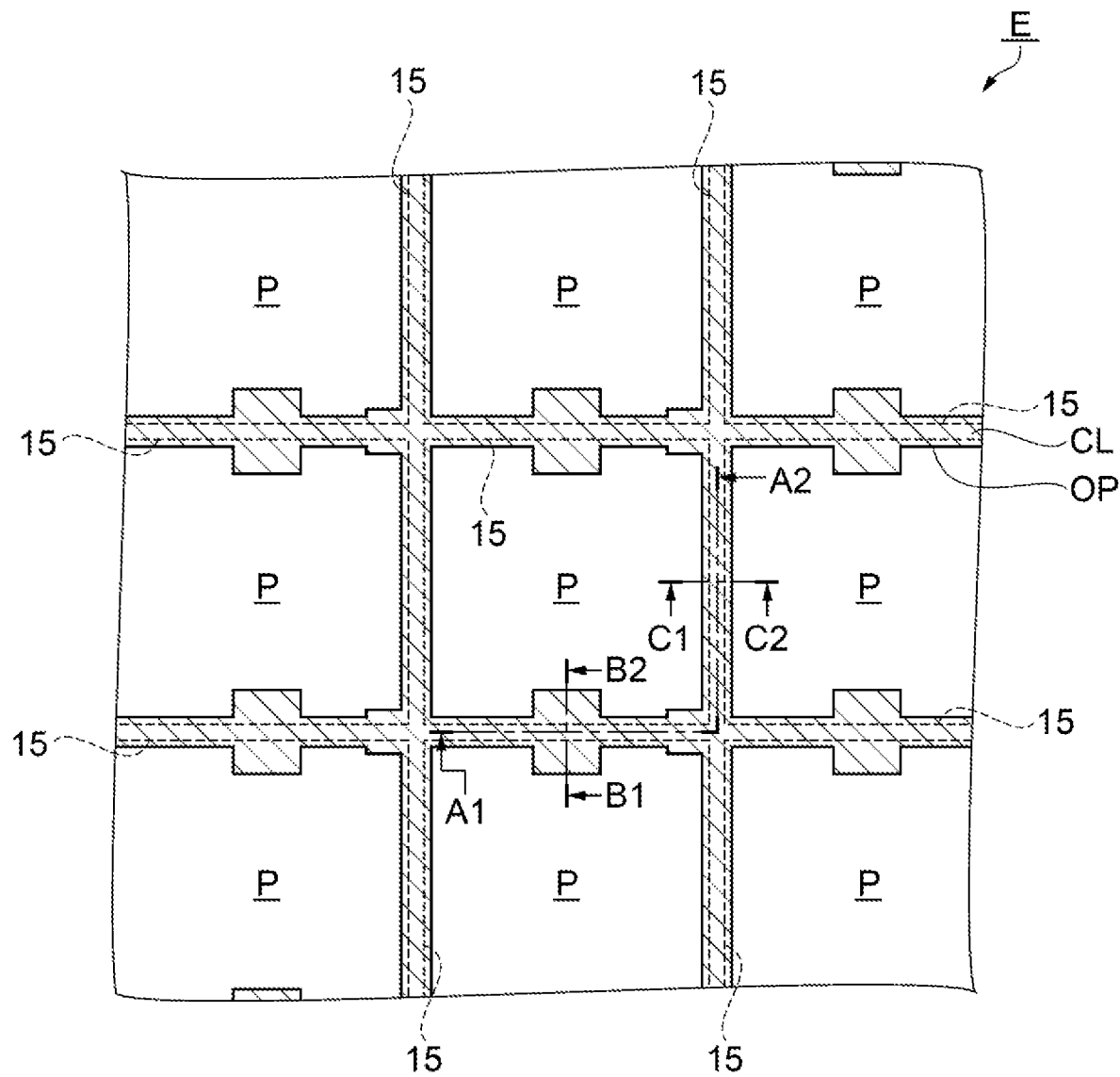
FIG. 4 is a schematic plan view illustrating arrangement of pixels.

Next, a configuration of the pixel P in the liquid crystal apparatus 100 will be described with reference to FIG. 4. FIG. 4 is a schematic plan view illustrating arrangement of the pixels.

As illustrated in FIG. 4, the pixels P in the liquid crystal apparatus 100 are arranged in a matrix in the ±X direction and the ±Y direction in the display region E. The pixel P has, for example, an opening area OP that is substantially rectangular in plan view. The opening area OP is surrounded by non-opening areas CL each having a light shielding property, extending in the ±X direction and in the ±Y direction, that are provided in a lattice pattern.

In the non-opening area CL extending in the ±X direction, the scan line 3 is provided. A conductive member having a light shielding property is used for the scan line 3, and a part of the non-opening area CL is constituted by the scan line 3.

In the non-opening area CL extending in the ±Y direction, the data line 6 is provided. A conductive member having a light shielding property is also used for the data line 6, and a part of the non-opening area CL is constituted by the data line 6.

The non-opening area CL is constituted by the scan line 3, the data line 6, the TFT 30, the capacitance line 8, and the like provided on the element substrate 10. Furthermore, the non-opening area CL may include a light shielding portion provided in an identical layer to the partition portion 24 illustrated in FIG. 2 and that is a black matrix patterned in a lattice shape, in the counter substrate 20.

In the non-opening area CL extending in the ±X direction, a contact hole is provided in a middle of the ±X direction corresponding to each of the pixels P, so as to sandwich the above-described TFT 30 in the ±Y direction. Thus, a width in the ±Y direction of the non-opening area CL is larger in the area where the contact hole is provided, compared to the other areas. In addition, in the non-opening area CL extending in the ±Y direction, the capacitance element 16 is provided between the pixels P adjacent to each other. Detailed structure of the pixel P including the contact hole and the capacitance element 16 described above will be described later.

The pixel electrode 15 that is substantially square in plan view is provided for each of the pixels P. The pixel electrode 15 is provided in the opening area OP such that an outer edge overlaps with the non-opening area CL. A plurality of the pixel electrodes 15 are arranged in a matrix corresponding to the pixels P.

The liquid crystal apparatus 100 of the present exemplary embodiment is of the transmissive-type as described above, and is configured assuming that light is incident from the side of the counter substrate 20. As such, the element substrate 10 is provided with structure that reduces not only light directly incident on the TFT 30, but also diffraction light, reflected light, and the like originating from the incident light. The liquid crystal apparatus 100 includes the capacitance element 16 with a retention capacitor increased.

Note that, an incident direction of light on the liquid crystal apparatus 100 is not limited from the side of the counter substrate 20, but light may be incident from a side of the element substrate 10. In addition, the liquid crystal apparatus 100 may have a configuration in which a focusing means such as a microlens that focuses incident light for each the pixel P is provided on a substrate on a side on which light is incident.

1.2. Configuration of Element Substrate

Figure 5:
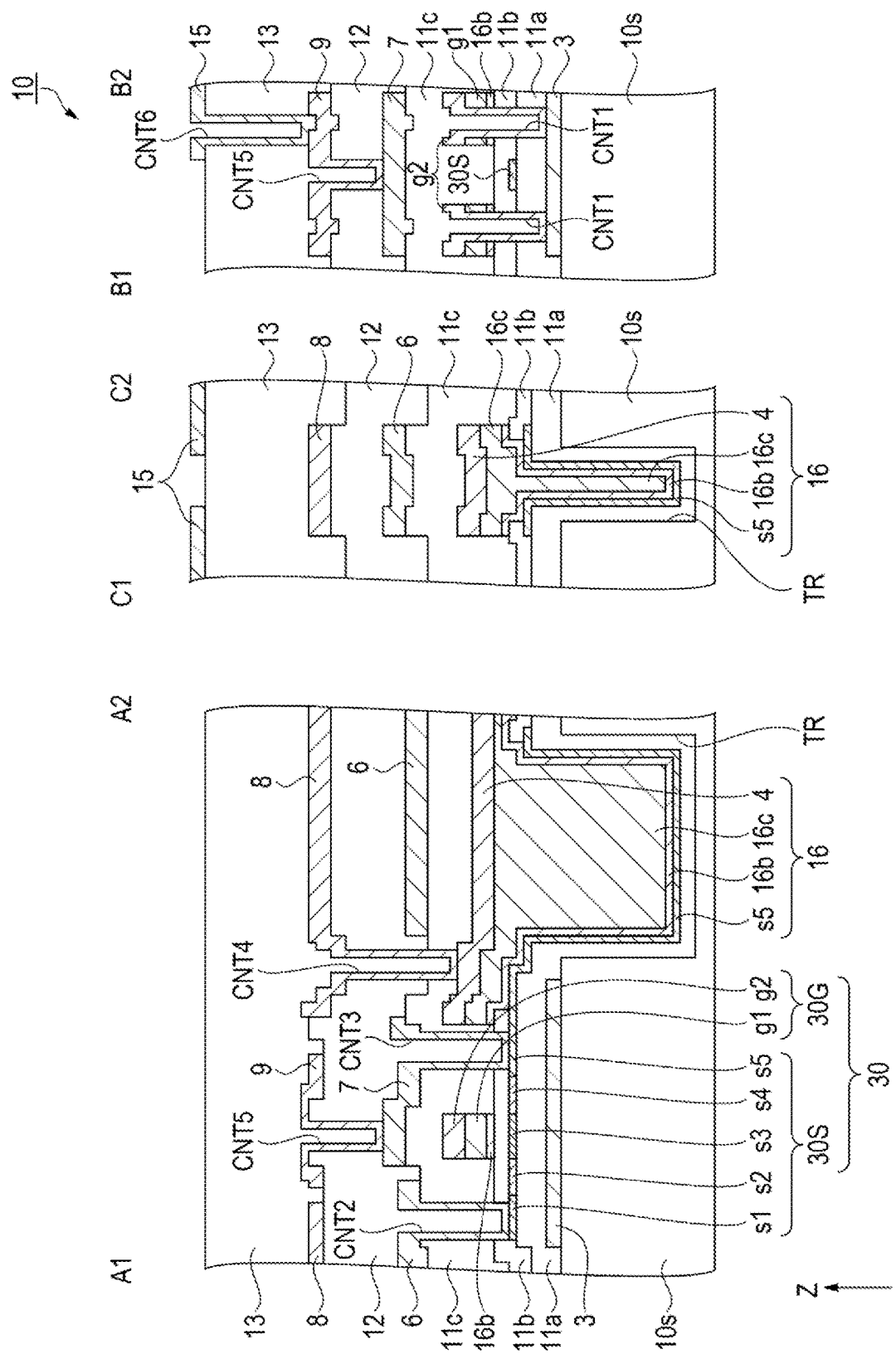
FIG. 5 is a schematic cross-sectional view illustrating structure of an element substrate.

Next, structure of the element substrate 10 included in the liquid crystal apparatus 100 will be described with reference to FIG. 5. FIG. 5 is a schematic cross-sectional view illustrating the structure of the element substrate. Note that, in FIG. 5, each of a line A1-A2, a line C1-C2, and a line B1-B2 in FIG. 4 is included, and three cross sections along the ±Z direction are illustrated side-by-side. Further, FIG. 5 does not illustrate the alignment film 18.

As illustrated in FIG. 5, the element substrate 10 of the liquid crystal apparatus 100 includes the substrate 10s, the scan line 3, the TFT 30 including a semiconductor layer 30S and a gate electrode 30G, the capacitance element 16, the data line 6, and a plurality of interlayer insulating layers described below. The substrate 10s of the element substrate 10 has a trench TR as a recessed portion. First layer to sixth layer are stacked as a plurality of layers on the substrate 10s.

The plurality of layers in the element substrate 10 include, in order from a lower side, the first layer including the scan line 3, the second layer including the semiconductor layer 30S, the third layer including the gate electrode 30G, the fourth layer including the data line 6, the fifth layer including the capacitance line 8 as a capacitance wiring line, and the sixth layer including the pixel electrode 15.

A first interlayer insulating layer 11a is provided between the first layer and the second layers, a gate insulation layer 11b and a capacitance insulation layer 16b are provided between the second layer and the third layer, a second interlayer insulation layer 11c is provided between the third layer and the fourth layer, and a third interlayer insulation layer 12 is provided between the fourth layer and the fifth layer, and a fourth interlayer insulation layer 13 is provided between the fifth layer and the sixth layer. This prevents occurrence of a short circuit between the layers. Here, the first interlayer insulating layer 11a is an example of an insulating layer on an inside of the trench TR in the present disclosure.

The scan line 3 is provided in the first layer on the substrate 10s. The scan line 3 is provided in the non-opening area CL illustrated in FIG. 4 in plan view. The scan line 3 includes a site extending in the ±X direction, and a site protruding in the ±Y direction from the extending site.

A known formation material having a light shielding property and electrical conductivity can be adopted for the scan line 3. Thus, the scan line 3 has a function to shield light incident on the semiconductor layer 30S primarily from the lower side. In the present exemplary embodiment, tungsten silicide is used as the formation material of the scan line 3. A thickness of the scan line 3 is not particularly limited, but is approximately 150 nm, for example. Note that, in the present specification, a thickness of each layer in the ±Z direction is also simply referred to as a "thickness".

The first interlayer insulating layer 11a is provided between the scan line 3 and the second layer. The first interlayer insulating layer 11a insulates the scan lines 3 and the TFT 30 from each other. Further, the first interlayer insulating layer 11a is provided extending to the inside of the trench TR described below.

A silicon-based oxide film or the like is adopted as a formation material of the first interlayer insulating layer 11a. Examples of the formation material include, for example, silicon oxide (None-doped Silicate Glass (NSG)), silicon nitride, and the like. In the present exemplary embodiment, silicon oxide is used as the formation material of the first interlayer insulating layer 11a. A thickness of the first interlayer insulating layer 11a is not particularly limited, but is approximately 200 nm, for example.

The second layer and the third layer on the first layer are provided with the TFT 30. The TFT 30 includes the semiconductor layer 30S provided in the second layer, and the gate electrode 30G provided in the third layer. A Lightly Doped Drain (LDD) structure is formed in the semiconductor layer 30S of the TFT 30.

The semiconductor layer 30S is provided in the non-opening area CL illustrated in FIG. 4 in plan view. Specifically, the semiconductor layer 30S is bent in the ±Y direction from the ±X direction, corresponding to a site where the ±X direction and the ±Y direction intersect in the non-opening area CL. One source drain region s1, one LDD region s2, a channel region s3, another LDD region s4, and a part of another source drain region s5 of the semiconductor layer 30S are provided at a position overlapping with the scan line 3 in plan view, and extending along the ±X direction.

Of the semiconductor layer 30S, the other source drain region s5 is bent in the ±Y direction from the ±X direction in plan view, and extends along the ±Y direction. In the other source drain region s5, a part of a site extending in the ±Y direction is at a position overlapping with the data line 6 in plan view, and is also provided on the inside of the trench TR described later. A part of the other source drain region s5 extending in the ±Y direction also functions as a lower capacitance electrode of the capacitance element 16.

The semiconductor layer 30S has the LDD regions s2 and s4 that have high electrical resistance with the channel region s3 interposed therebetween. Thus, leakage current when turned off is suppressed. In terms of the leakage current suppression when turned off, it is sufficient to adopt a configuration in which the LDD region s4 is included in a joint portion between the other source drain region s5 to which the capacitance element 16 and the pixel electrode 15 are electrically coupled, and the channel region s3. The semiconductor layer 30S is, for example, formed of a polysilicon film obtained by crystallization process is applied to an amorphous silicon film. A thickness of the semiconductor layer 30S is not particularly limited, but is approximately 50 nm, for example.

The gate insulation layer 11b is provided covering the semiconductor layer 30S. The gate insulation layer 11b is disposed between the semiconductor layer 30S and the gate electrode 30G along with the capacitance insulation layer 16b described below, and insulates the semiconductor layer 30S and the gate electrode 30G from each other. In other words, the gate insulation layer 11b and the capacitance insulation layer 16b are examples of the gate insulation layer of the present disclosure. The gate insulation layer 11b has, for example, double structure formed of two types of silicon oxide. A thickness of the gate insulation layer 11b is not particularly limited, but is approximately 75 nm, for example.

The capacitance insulation layer 16b is provided covering a part of the gate insulation layer 11b, and a part of the other source drain region s5. Of the capacitance insulation layer 16b, a site overlapping with the channel region s3 in plan view, insulates the semiconductor layer 30S from the gate electrode 30G along with the gate insulation layer 11b. A site of the capacitance insulation layer 16b that overlaps with the other source drain region s5 functions as a dielectric layer of the capacitance element 16.

A dielectric material is used for the capacitance insulation layer 16b. Examples of the dielectric material include, for example, hafnium oxide, aluminum oxide, silicon oxide, silicon nitride, tantalum oxide, and the like, and a single layer film of the material, or a combination of these films is used. In the present exemplary embodiment, silicon nitride is used as the dielectric material of the capacitance insulation layer 16b. A thickness of the capacitance insulation layer 16b may be smaller than the thickness of the gate insulation layer 11b, and is approximately 20 nm, for example.

The gate electrode 30G is provided in the third layer so as to face the channel region s3 of the semiconductor layer 30S in the ±Z direction. The gate electrode 30G includes a first gate electrode g1 and a second gate electrode g2. The first gate electrode g1 is disposed above the channel region s3 via the gate insulation layer 11b and the capacitance insulation layer 16b. The second gate electrode g2 is disposed above the first gate electrode g1.

Conductive polysilicon that is a degenerate semiconductor, metal silicide, metal, a metal compound, or the like, is used as a formation material of the first gate electrode g1. In the present exemplary embodiment, the first gate electrode g1 includes double structure of a conductive polysilicon film and a tungsten silicide film. A thickness of the first gate electrode g1 is not particularly limited, but is approximately 150 nm, for example.

Here, in the present exemplary embodiment, hereinafter, the conductive polysilicon film refers to a polysilicon film that is injected with phosphorus atoms and imparted with electrical conductivity. Note that, atoms to be injected are not limited to the phosphorus atoms.

A metal compound having a light shielding property such as tungsten silicide is used as a formation material of the second gate electrode g2. A thickness of the second gate electrode g2 is not particularly limited, but is approximately 60 nm, for example.

The second gate electrode g2 is electrically coupled to the scan line 3 via a pair of second contact holes CNT 1. The pair of second contact holes CNT 1 penetrate the first interlayer insulating layer 11a, the gate insulation layer 11b, the capacitance insulation layer 16b, and the first gate electrode g1. The pair of second contact holes CNT 1 are disposed and facing each other in the ±Y direction with a part of the semiconductor layer 30S interposed therebetween.

The trench TR is provided along a side of the +X direction of the pixel P in plan view, in the non-opening area CL described above. The trench TR is a substantially rectangular recessed portion in plan view. The trench TR includes a bottom surface along an XY plane and a side surface along the ±Z direction, and an upper side thereof is open.

On the inside of the trench TR, in addition to the first interlayer insulating layer 11a, the other source drain region s5, and the capacitance insulation layer 16b described above, a first upper capacitance electrode 16c is disposed. The capacitance element 16 is formed by each of these layers and a second upper capacitance electrode 4 above the trench TR. The capacitance element 16 has a function to increase the retention capacitor and improve potential retention characteristics in the pixel electrode 15.

The first interlayer insulating layer 11a is provided covering the side surface and the bottom surface of the trench TR. On the first interlayer insulating layer 11a, the part of the other source drain region s5 serving as the lower capacitance electrode of the capacitance element 16 is provided. The other source drain region s5 extends along the side surface and the bottom surface of the trench TR.

The capacitance insulation layer 16b serving as the dielectric layer of the capacitance element 16 is provided covering the other source drain region s5 on the inside of the trench TR. In other words, the role of the dielectric layer of the capacitance element 16 is not played by the gate insulation layer 11b, but is played by the capacitance insulation layer 16b. As described above, the gate insulation layer of the TFT 30 includes the gate insulation layer 11b of the silicon oxide film and the capacitance insulation layer 16b of the silicon nitride film. Compared to this, the capacitance insulation layer 16b of the capacitance element 16 only includes the silicon nitride film. In other words, two layers, that is, the gate insulation layer 11b and the capacitance insulation layer 16 interpose between the gate electrode 30G and the semiconductor layer 30S. Compared to this, only the capacitance insulation layer 16b being unilamellar interposes between the other source drain region s5 serving as the lower capacitance electrode and the first upper capacitance electrode 16c. As described above, in the present exemplary embodiment, the thickness of the capacitance insulation layer 16b is made smaller with respect to the thickness of the gate insulation layer 11b.

The first upper capacitance electrode 16c is provided covering the capacitance insulation layer 16b, and fills the inside of the trench TR, and the second upper capacitance electrode 4 is further provided on the first upper capacitance electrode 16c. The first upper capacitance electrode 16c is provided by patterning from an identical layer to the first gate electrode g1. The second upper capacitance electrode 4 is provided by patterning from an identical layer to the second gate electrode g2. The first upper capacitance electrode 16c and the second upper capacitance electrode 4 are examples of the capacitance electrode of the present disclosure. Note that, a part of the capacitance element 16 is provided on, in addition to the inside of the trench TR, an upper rim of the trench TR.

The second interlayer insulating layer 11c is provided above the gate electrode 30G, the second upper capacitance electrode 4, and the like, so as to cover the gate electrode 30G, the second upper capacitance electrode 4, and the like. The second interlayer insulating layer 11c is also provided at a position overlapping with the TFT 30 in a planar manner. The second interlayer insulating layer 11c is provided by using one or more types of silicon-based oxide films such as a Tetraethyl Orthosilicate (TEOS) film, an NSG film, a Phosphosilicate Glass (PSG) film containing phosphorus (P), a Borosilicate Glass (BSG) film containing boron, and a Borophosphosilicate Glass (BPSG) film containing boron and phosphorus. In the present exemplary embodiment, silicon oxide is used as a formation material of the second interlayer insulating layer 11c. A thickness of the second interlayer insulating layer 11c is not particularly limited, but is approximately 400 nm, for example.

Contact holes CNT 2 and CNT 3 are provided in the second interlayer insulating layer 11c. The contact holes CNT 2 and CNT 3 penetrate the second interlayer insulating layer 11c and the gate insulation layer 11b to reach the semiconductor layer 30S. Specifically, the contact hole CNT 2 electrically couples the one source drain region s1 of the semiconductor layer 30S to the data line 6 in an upper layer. The contact hole CNT 3 electrically couples the other source drain region s5 of the semiconductor layer 30S to a second relay layer 7 described later.

The data line 6 and the second relay layer 7 are provided in the fourth layer on the third layer so as to cover the second interlayer insulating layer 11c and the like. As described above, the data line 6 extends in the ±Y direction in the non-opening area CL of the pixel P. The data line 6 is electrically coupled to the one source drain region s1 of the semiconductor layer 30S via the contact hole CNT 2.

The second relay layer 7 is provided in a state of an independent island in plan view. The second relay layer 7 is electrically coupled to the other source drain region s5 of the semiconductor layer 30S via the contact hole CNT 3.

A formation material of the data line 6 and the second relay layer 7 is not particularly limited as long as the material is a low-resistance wiring line material having electrical conductivity, but examples include metal such as aluminum (Al) and titanium (Ti), and metal compounds thereof. In the present exemplary embodiment, the data line 6 and the second relay layer 7 each have four-layer structure of titanium (Ti) layer/titanium nitride (TiN) layer/aluminum (Al) layer/titanium nitride (TiN) layer. A thickness of each of the data line 6 and the second relay layer 7 is not particularly limited, but is approximately 350 nm, for example.

The third interlayer insulating layer 12 is provided covering the data line 6, the second relay layer 7, and the like. A formation material similar to that of the first interlayer insulating layer 11a, for example, is adopted for the third interlayer insulating layer 12. In the present exemplary embodiment, silicon oxide is used for the third interlayer insulating layer 12. A thickness of the third interlayer insulating layer 12 is not particularly limited, but is approximately 400 nm, for example.

Contact holes CNT 4 and CNT 5 are provided in the third interlayer insulating layer 12. The contact hole CNT 4 penetrates the second interlayer insulating layer 11c and the third interlayer insulating layer 12, and electrically couples the second upper capacitance electrode 4 of the capacitance element 16 to the capacitance line 8 above the third interlayer insulating layer 12.

The contact hole CNT 5 penetrates the third interlayer insulating layer 12, and electrically couples the second relay layer 7 to the first relay layer 9 that is an upper layer of the third interlayer insulating layer 12.

The capacitance line 8 and the first relay layer 9 are provided in the fifth layer on the fourth layer. The capacitance line 8 overlaps with the data line 6 extending in the ±Y direction in plan view. Although not illustrated, the capacitance line 8 is electrically coupled to the vertical conducting portion 106 of the counter substrate 20 described above. Accordingly, the capacitance line 8 is electrically coupled to the counter electrode 21, and is provided with a common potential. Accordingly, potential of the data line 6 and the scan line 3 is suppressed so as not to affect the pixel electrode 15, by the capacitance line 8. The capacitance line 8 is also electrically coupled to the first upper capacitance electrode 16c of the capacitance element 16 and the second upper capacitance electrode 4, via the contact hole CNT 4.

The first relay layer 9 is provided in a state of an independent island in plan view. The first relay layer 9 is electrically coupled to the second relay layer 7, via the contact hole CNT 5.

A formation material of the capacitance line 8 and the first relay layer 9 is, similar to the data line 6, not particularly limited as long as the material is a low-resistance wiring line material having electrical conductivity, but examples include metal such as aluminum (Al) and titanium (Ti), and metal compounds thereof. In the present exemplary embodiment, the capacitance line 8 and the first relay layer 9 each have four-layer structure of titanium (Ti) layer/titanium nitride (TiN) layer/aluminum (Al) layer/titanium nitride (TiN) layer. A thickness of each of the capacitance line 8 and the first relay layer 9 is not particularly limited, but is approximately 250 nm, for example.

The fourth interlayer insulating layer 13 is provided covering the capacitance line 8 and the first relay layer 9. Examples of a formation material of the fourth interlayer insulating layer 13 include a silicon-based oxide film similar to that of the first interlayer insulating layer 11a. In the present exemplary embodiment, silicon oxide is used for the fourth interlayer insulating layer 13. A thickness of the fourth interlayer insulating layer 13 is not particularly limited, but is approximately 300 nm, for example.

A first contact hole CNT 6 is provided in the fourth interlayer insulating layer 13. The first contact hole CNT 6 electrically couples the first relay layer 9 to the pixel electrode 15 that is an upper layer of the fourth interlayer insulating layer 13. The first contact hole CNT 6 overlaps with one in the +Y direction of the pair of second contact holes CNT 1 in plan view.

The pixel electrode 15 is provided in the sixth layer on the fifth layer. The pixel electrode 15 is electrically coupled to the other source drain region s5 also serving as the lower capacitance electrode of the capacitance element 16, via the first contact hole CNT 6, the first relay layer 9, the contact hole CNT 5, the second relay layer 7, and the contact hole CNT 3. The pixel electrode 15 is provided, for example, after forming a transparent conductive film of ITO, IZO, or the like, by performing patterning. In the present exemplary embodiment, ITO is used for the pixel electrode 15. A thickness of the pixel electrode 15 is not particularly limited, but is approximately 145 nm, for example.

Although not illustrated, the alignment film 18 is provided covering the pixel electrode 15. The alignment film 18 of the element substrate 10, and the alignment film 22 of the counter substrate 20 described above are each formed of an aggregate of columns each grown to be columnar by vapor-depositing an inorganic material such as silicon oxide from a predetermined direction such as an oblique direction. In addition, liquid crystal molecules included in the liquid crystal layer 50 illustrated in FIG. 2 have negative dielectric anisotropy with respect to the alignment films 18 and 22.

1.3. Method for Manufacturing Liquid Crystal Apparatus

Figure 6:
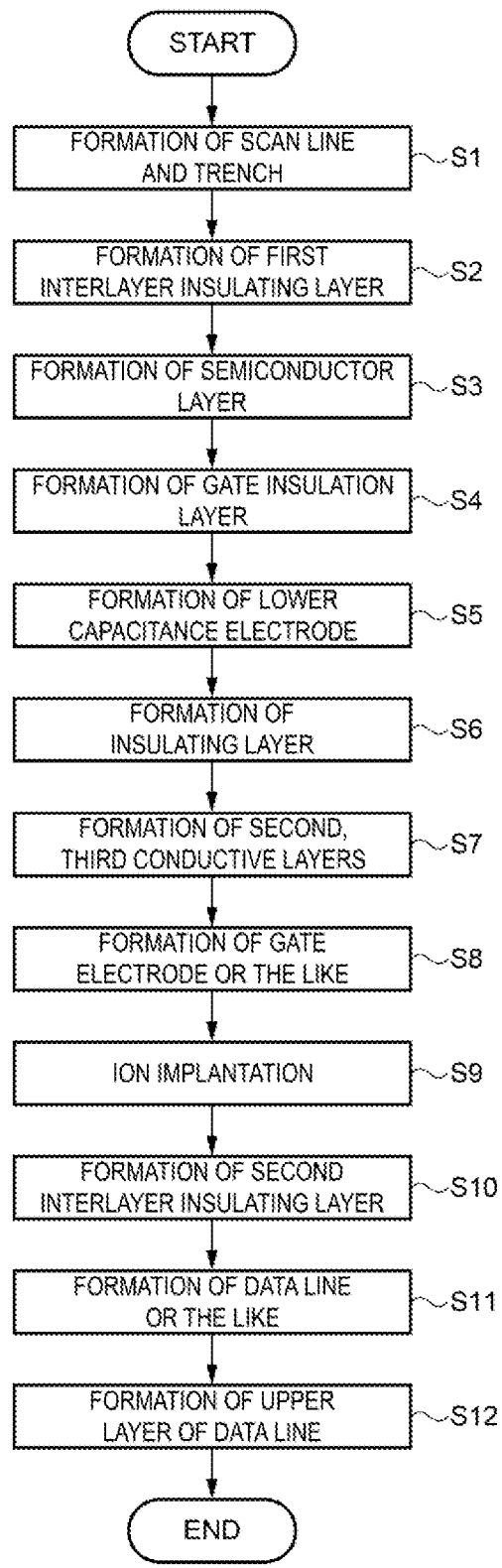
FIG. 6 is a process flow diagram illustrating a method for manufacturing the element substrate in a method for manufacturing the liquid crystal apparatus.

A method for manufacturing the liquid crystal apparatus 100 according to the present exemplary embodiment will be described with reference to FIG. 6 to FIG. 33. FIG. 6 is a process flow diagram illustrating a method for manufacturing an element substrate in the method for manufacturing the liquid crystal apparatus. FIG. 7, FIG. 9, FIG. 11, FIG. 13, FIG. 15A, FIG. 15B, FIG. 17, FIG. 19A, FIG. 19B, FIG. 21, FIG. 23, FIG. 25, FIG. 27, FIG. 29, and FIG. 31 are schematic cross-sectional views illustrating the method for manufacturing the element substrate. FIG. 8, FIG. 10, FIG. 12, FIG. 14, FIG. 16, FIG. 18, FIG. 20, FIG. 22, FIG. 24, FIG. 26, FIG. 28, FIG. 30, FIG. 32, and FIG. 33 are schematic plan views illustrating the method for manufacturing the element substrate. In the following description, FIG. 5 will also be referred to.

Here, in the schematic cross-sectional view described above, as in FIG. 5, respective three cross sections corresponding to the line segment A1-A2, the line segment C1-C2, and the line segment B1-B2 illustrated in FIG. 4 are illustrated side-by-side. Furthermore, in the schematic plan view described above, a periphery of one number of the opening area OP illustrated in FIG. 4 is enlarged and illustrated. Note that, hereinafter, unless otherwise noted, a state in plan view will be described in description of the schematic plan view.

The method for manufacturing the liquid crystal apparatus 100 of the present exemplary embodiment includes a method for manufacturing the element substrate 10 described below, and known techniques can be adopted except for steps included in the method for manufacturing the element substrate 10. Thus, in the following description, only the method for manufacturing the element substrate 10 will be described. Additionally, in the method for manufacturing the element substrate 10 as well, known techniques can be adopted unless otherwise noted.

As illustrated in FIG. 6, the method for manufacturing the element substrate 10 of the present exemplary embodiment includes steps S1 to S12. Hereinafter, the steps from step S1 to step S12 will be described. Note that, the process flow illustrated in FIG. 6 is an example, and the present disclosure is not limited thereto.

Figure 7:
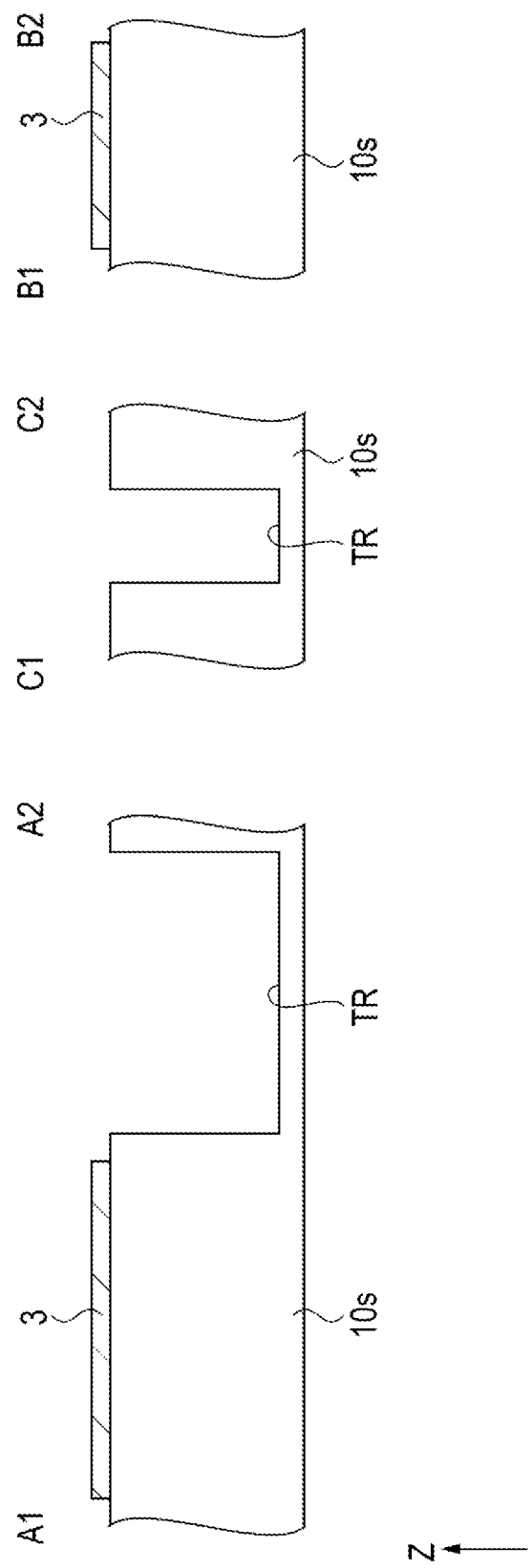
FIG. 7 is a schematic cross-sectional view illustrating a method for manufacturing the element substrate.

In step S1, as illustrated in FIG. 7, the scan line 3 and the trench TR are formed at the substrate 10s. First, the scan line 3 is provided on the substrate 10s. The scan line 3 has a site extending in the ±X direction, and a site protruding from the above site in the ±Y direction. The pair of second contact holes CNT 1 are provided in the site protruding in the ±Y direction. Patterning formation using, for example, a photolithography method is used for forming the scan line 3.

Figure 8:
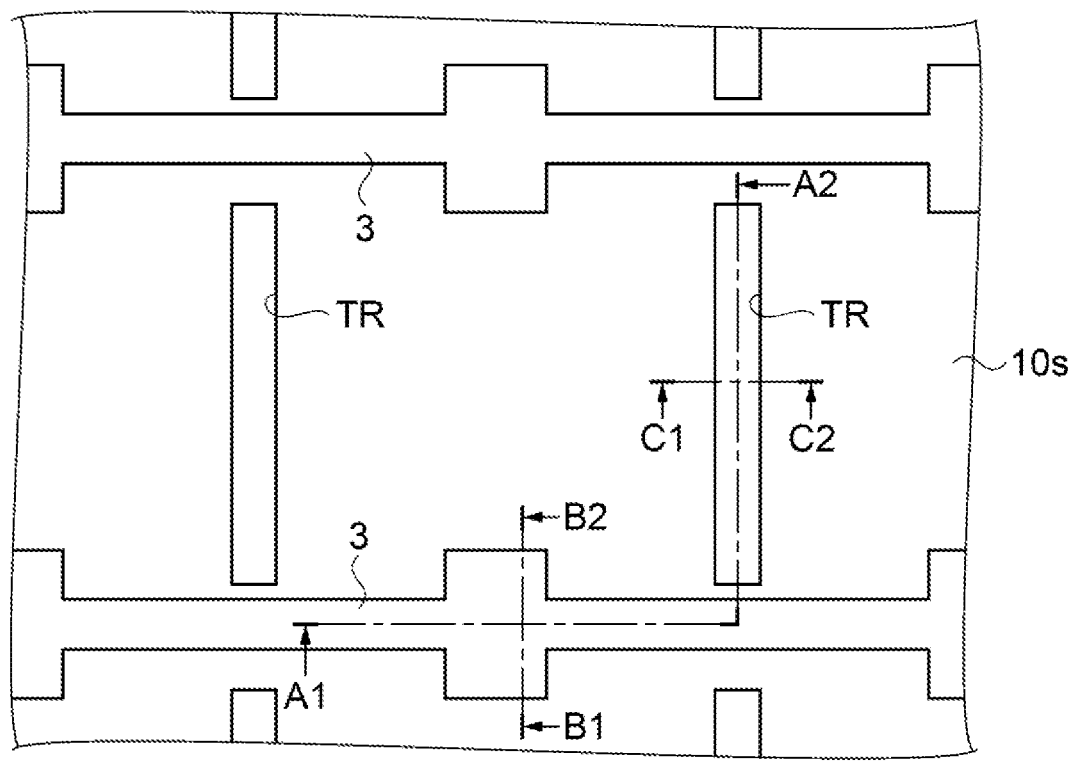
FIG. 8 is a schematic plan view illustrating the method for manufacturing the element substrate.
Figure 8:
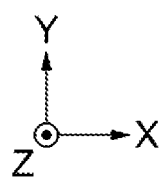

Next, the trench TR is provided. Specifically, as illustrated in FIG. 8, the trench TR is between pixels P adjacent to each other in the ±X direction, and is substantially rectangular that fits in the non-opening area CL. In the trench TR, although not particularly limited, for example, a depth in the ±Z direction is approximately 3 µm, and a width in the ±X direction is approximately 1 µm. Wet etching using, for example, a hard mask is used to form the trench TR. Then the processing proceeds to step S2.

Figure 9:
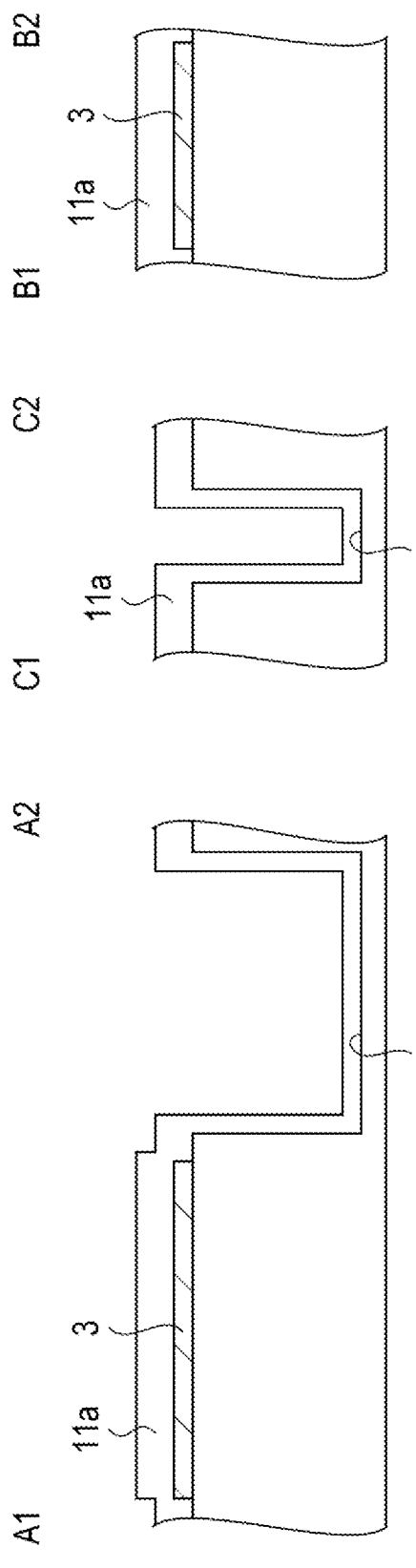
FIG. 9 is a schematic cross-sectional view illustrating the method for manufacturing the element substrate.
Figure 10:
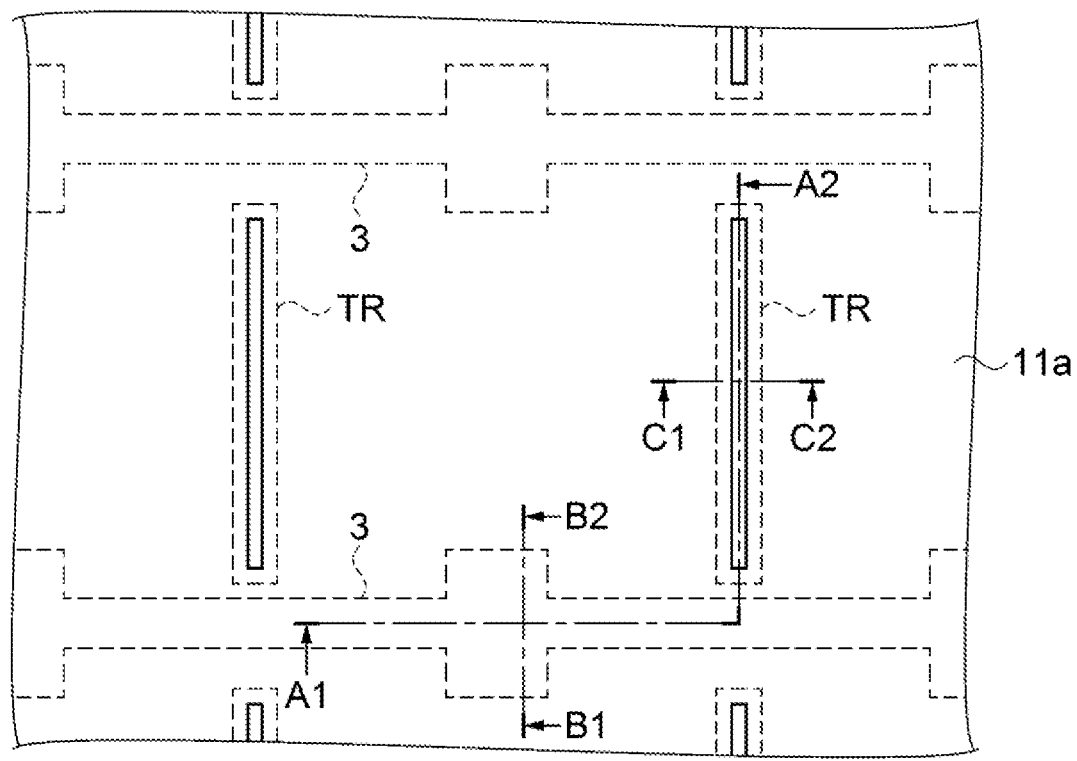
FIG. 10 is a schematic plan view illustrating the method for manufacturing the element substrate.

In step S2, as illustrated in FIG. 9 and FIG. 10, the first interlayer insulating layer 11a is provided in a solid form, on the substrate 10s including the scan line 3 and the inside of the trench TR. Examples of a method for forming the first interlayer insulating layer 11a include an atmospheric pressure Chemical Vapor Deposition (CVD) method, a reduced pressure CVD method, or a plasma CVD method using a processing gas such as monosilane ($SiH_4$), dichlorosilane ($SiH_2Cl_2$), orthosilicic acid tetraethyl (TEOS), and ammonia ($NH_3$).

At this time, the inside of the trench TR is also covered by the first interlayer insulating layer 11a, to adjust formation conditions so that a width in the ±X direction of the trench TR narrows. The width in the ±X direction of the trench TR covered with the first interlayer insulating layer 11a is, for example, approximately 0.3 µm, compared to an initial width of approximately 1 µm. In this way, the trench TR is filled with the capacitance element 16 and the like provided on the inside of the trench TR. Thus, the data line 6 and the like provided on an upper layer do not fall into an indentation originating from the trench TR, and disconnection of the data line 6 and the like can be prevented. Then the processing proceeds to step S3.

Figure 11:
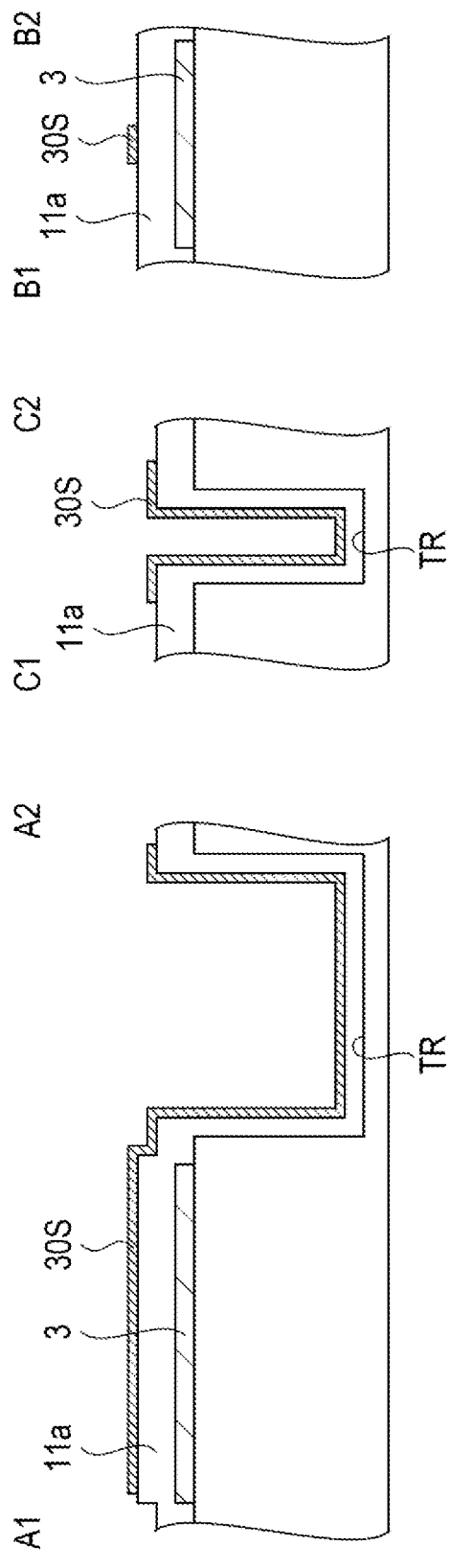
FIG. 11 is a schematic cross-sectional view illustrating the method for manufacturing the element substrate.

In step S3, a polysilicon layer is provided on the first interlayer insulating layer 11a including the inside of the trench TR. The polysilicon layer is an amorphous polysilicon film, and a reduced pressure CVD method or the like is used for formation. Next, as illustrated in FIG. 11, the polysilicon layer is patterned to provide the semiconductor layer 30S.

Figure 12:
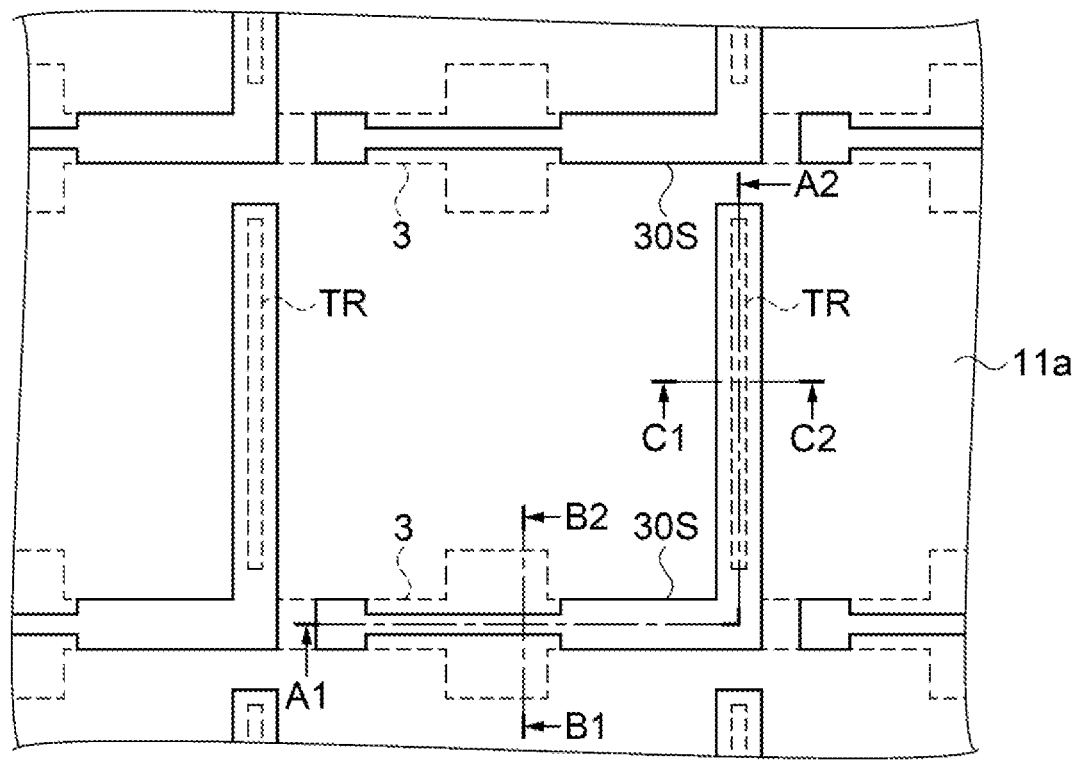
FIG. 12 is a schematic plan view illustrating the method for manufacturing the element substrate.

As illustrated in FIG. 12, the semiconductor layer 30S is provided by being bent in the ±Y direction from the ±X direction. Although not illustrated, the semiconductor layer 30S is overlapped and disposed on the non-opening area CL. Then the processing proceeds to step S4.

Figure 13:
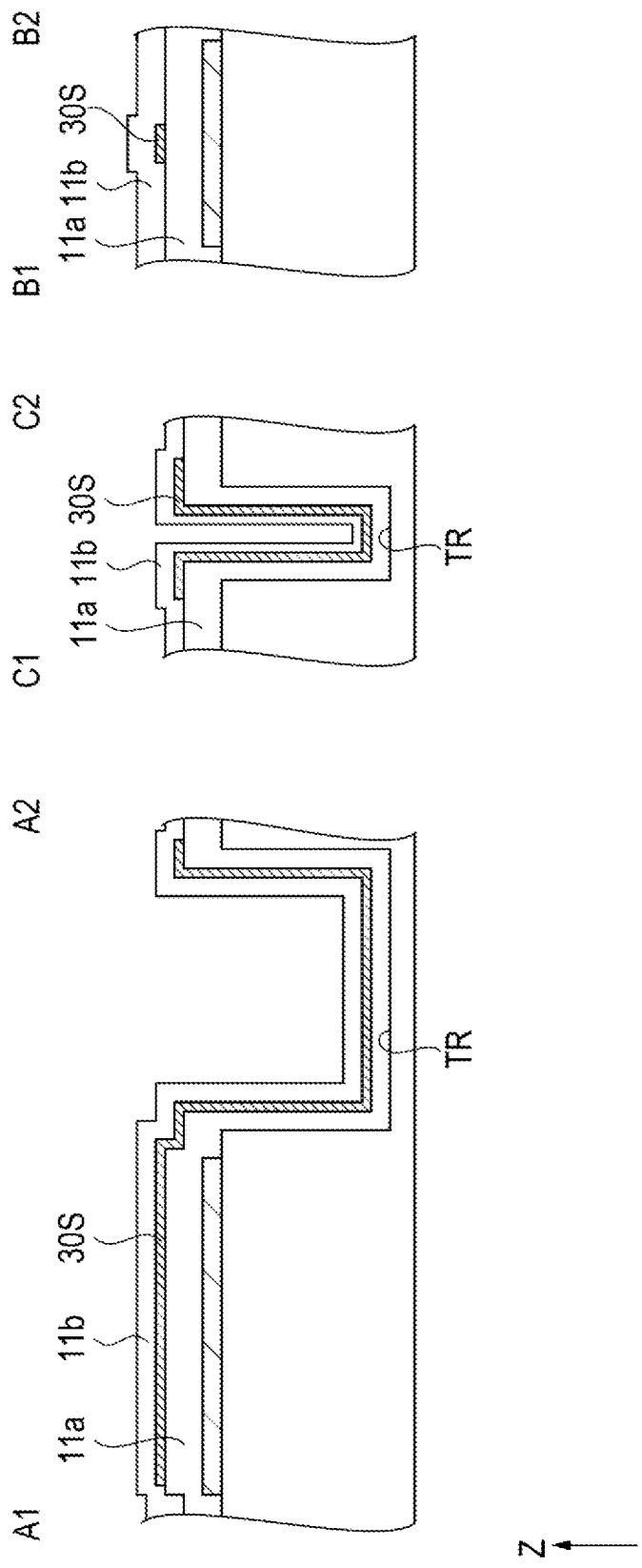
FIG. 13 is a schematic cross-sectional view illustrating the method for manufacturing the element substrate.
Figure 14:
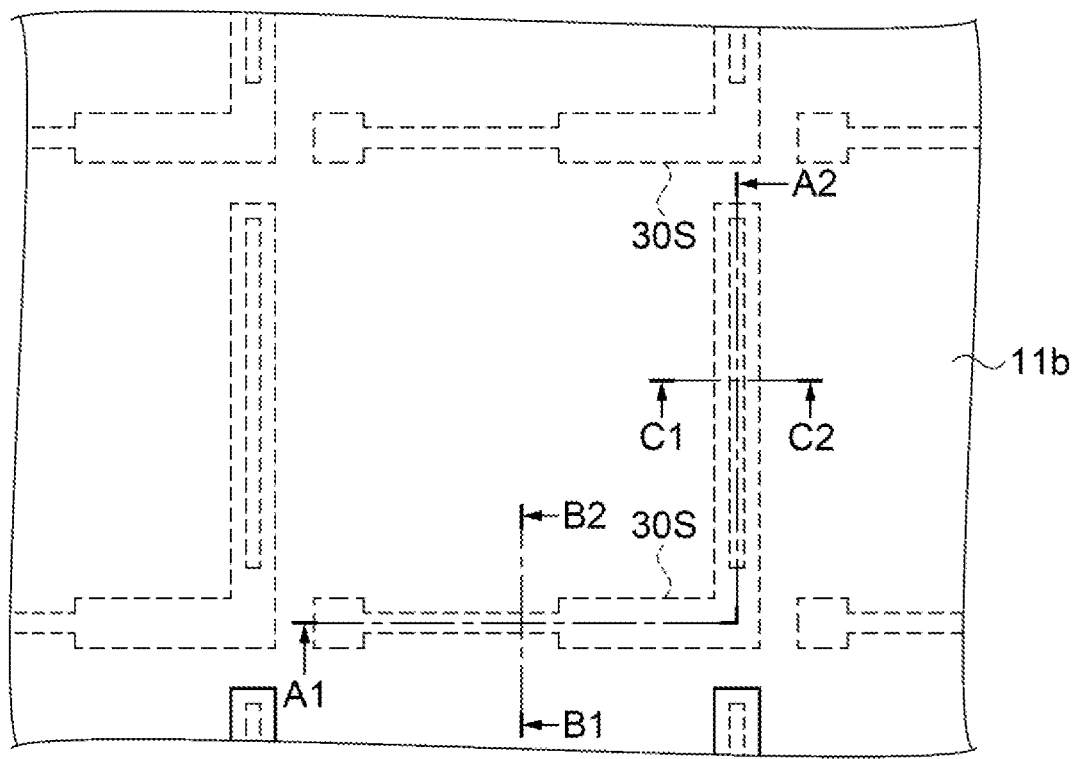
FIG. 14 is a schematic plan view illustrating the method for manufacturing the element substrate.

In step S4, as illustrated in FIG. 13 and FIG. 14, the gate insulation layer 11b is provided in a solid form, on the semiconductor layer 30S and the first interlayer insulating layer 11a. When, for example, double structure including two types of silicon oxide is adopted for the gate insulation layer 11b, a first silicon oxide film obtained by thermal oxidation of the polysilicon film is provided, and then a second silicon oxide film is provided under high temperature conditions at 700° C. to 900° C. using the reduced pressure CVD method. At this time, the inside of the trench TR is also covered with the gate insulation layer 11b. Then the processing proceeds to step S5.

Figure 16:
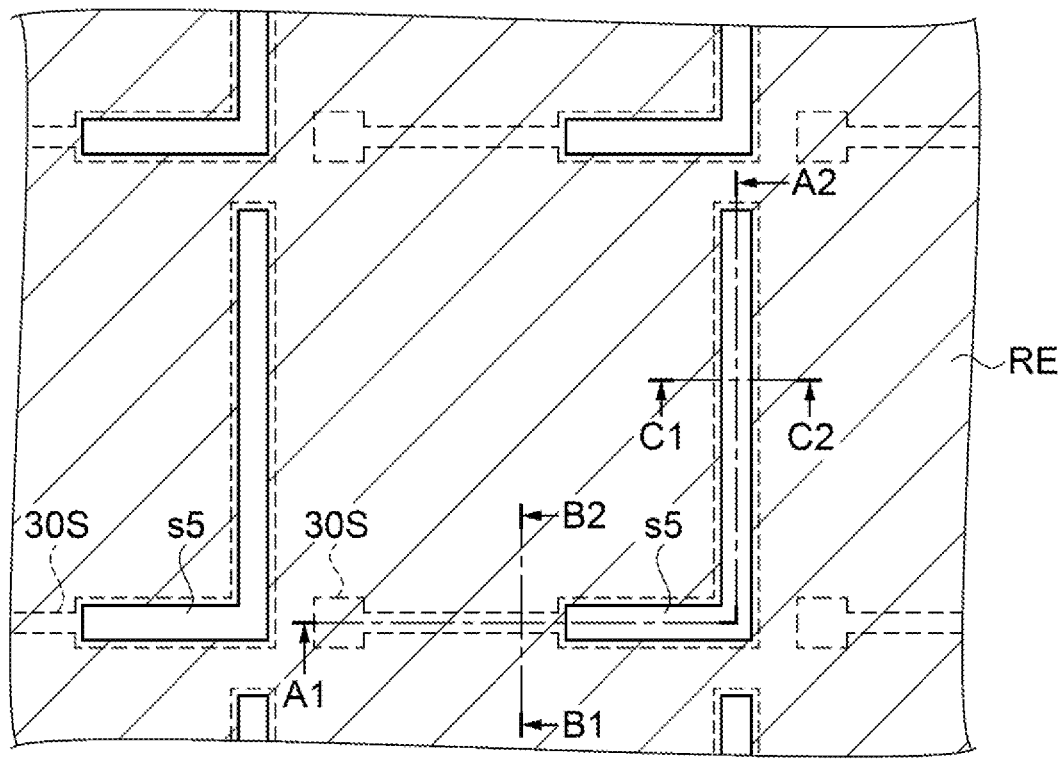
FIG. 16 is a schematic plan view illustrating the method for manufacturing the element substrate.

In step S5, the other source drain region s5 that is the lower capacitance electrode of the capacitance element 16 is formed. First, as illustrated in FIG. 16, a resist RE is formed in a region excluding the inside of the trench TR and the rim of the trench TR. The region in which the resist RE is not disposed corresponds to a site of the other source drain region s5 of the semiconductor layer 30S that functions as the lower capacitance electrode of the capacitance element 16.

Figure 15A:
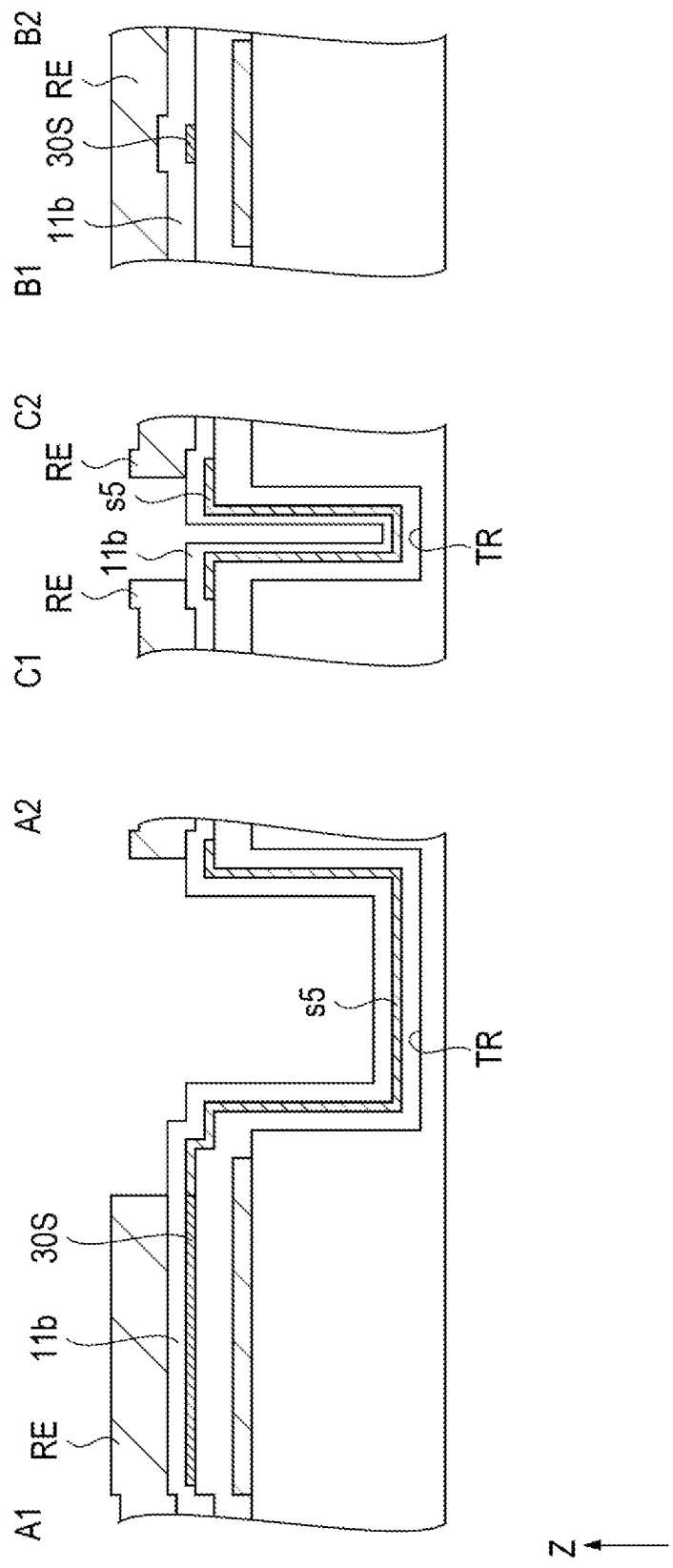
FIG. 15A is a schematic cross-sectional view illustrating the method for manufacturing the element substrate.

Next, ion implantation is performed for the semiconductor layer 30S. First, electrical conductivity is imparted to the semiconductor layer 30S on the inside of the trench TR and the rim of the trench TR, that is the region in which the resist RE is not disposed. At this time, ions are implanted into the semiconductor layer 30S via the gate insulation layer 11b. Accordingly, as illustrated in FIG. 15A, the semiconductor layer 30S on the inside of the trench TR and the rim of the trench TR turns to the other source drain region s5. The ions implanted are, for example, phosphorus (P).

Figure 15B:
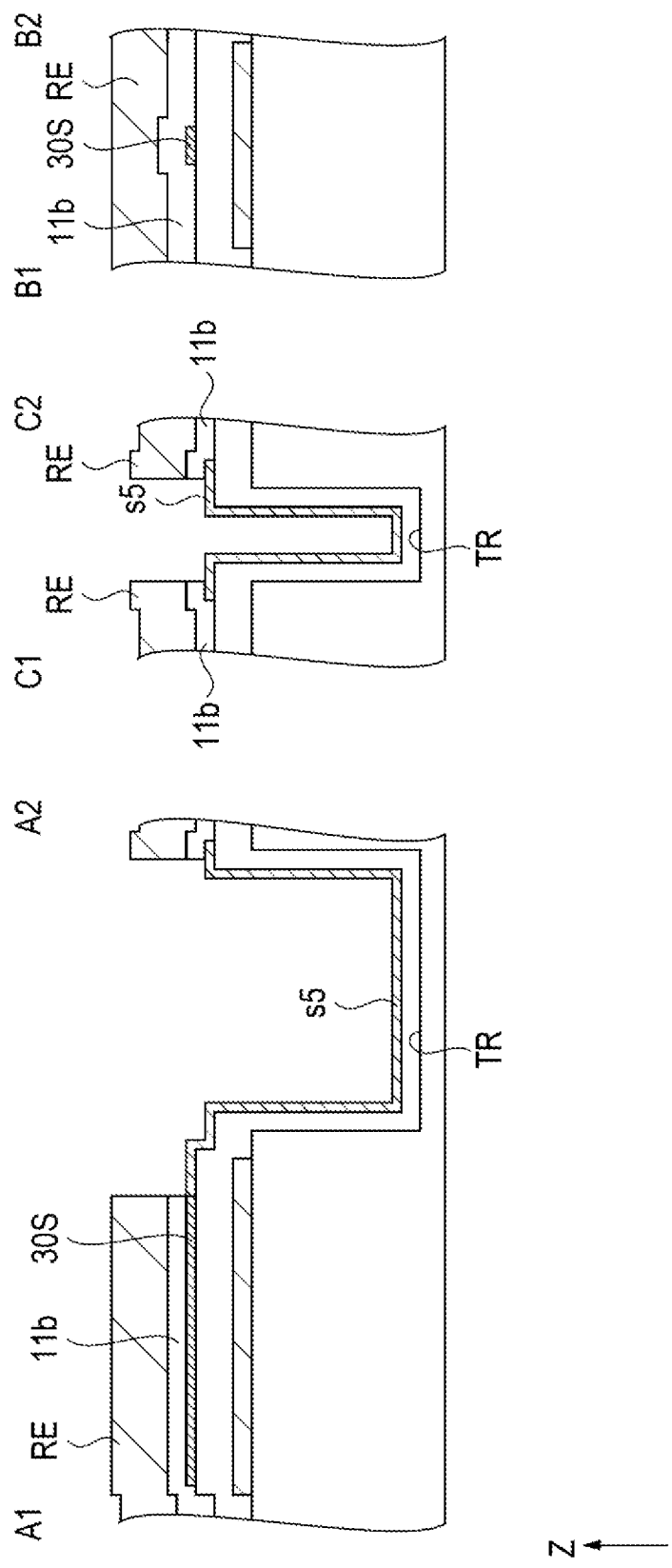
FIG. 15B is a schematic cross-sectional view illustrating the method for manufacturing the element substrate.

Next, the gate insulation layer 11b on the inside of the trench TR and the rim of the trench TR in which the resist RE is not disposed is removed by wet etching. This state is illustrated in FIG. 15B. Thereafter, all of the resist RE is removed. Then the processing proceeds to step S6.

Figure 17:
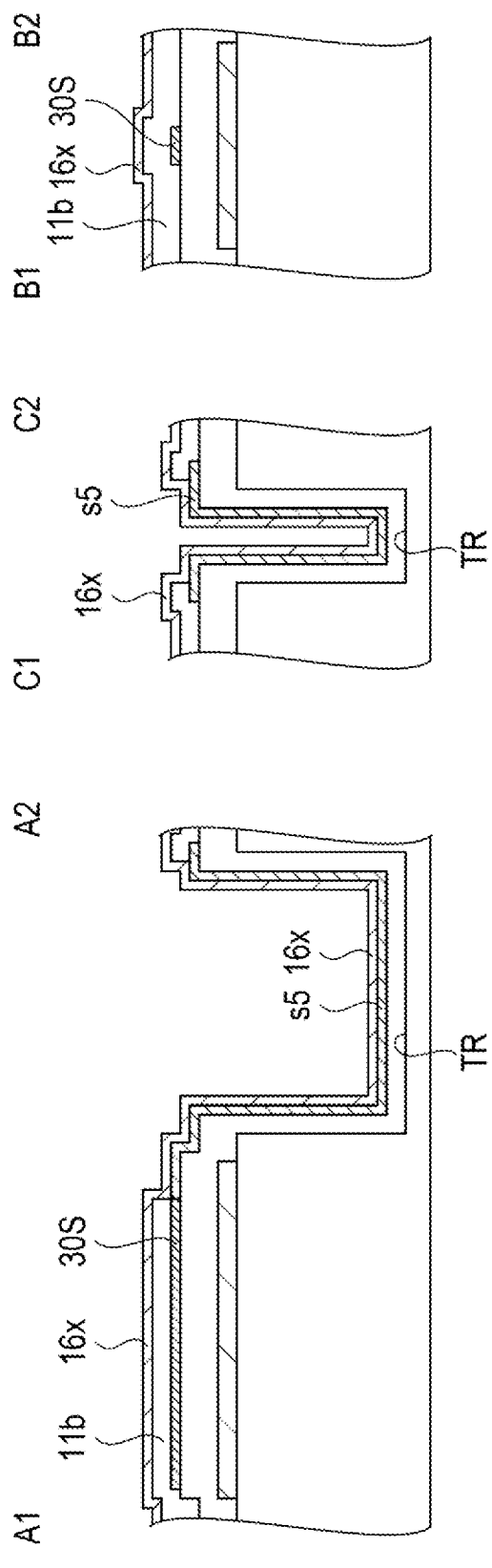
FIG. 17 is a schematic cross-sectional view illustrating the method for manufacturing the element substrate.
Figure 18:
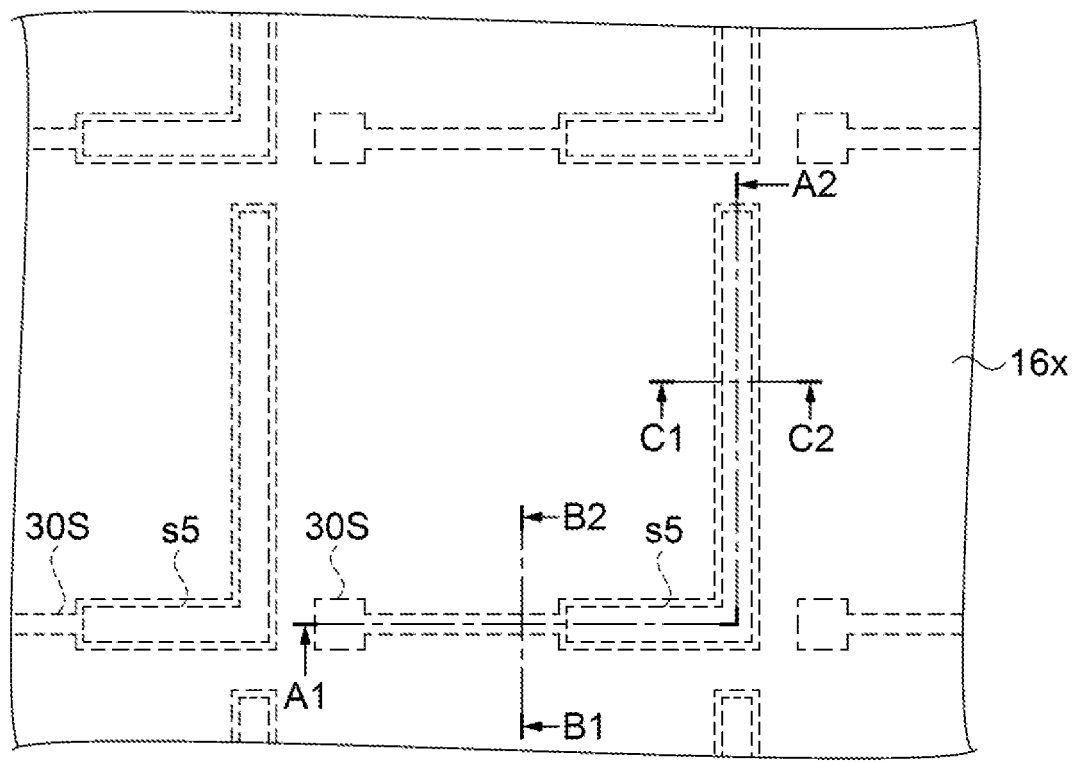
FIG. 18 is a schematic plan view illustrating the method for manufacturing the element substrate.
Figure 18:
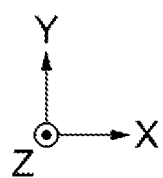

In step S6, an insulating layer 16x is formed. The insulating layer 16x is a layer turning to the capacitance insulation layer 16b in a step that follows. As illustrated in FIG. 17 and FIG. 18, the insulating layer 16x is provided in a solid form, on the other source drain region s5 on the inside of the trench TR and the rim of the trench TR, and on the gate insulation layer 11b. Specifically, the insulating layer 16x is provided by the reduced pressure CVD method, the plasma CVD method, or the like using silicon nitride. Then the processing proceeds to step S7.

In step S7, a second conductive layer 16y and a third conductive layer 4x are formed. The second conductive layer 16y is a layer turning to the first gate electrode g1 and the first upper capacitance electrode 16c in a step that follows. The third conductive layer 4x is a layer turning to the second gate electrode g2 and the second upper capacitance electrode 4 in a step that follows.

First, the second conductive layer 16y is provided in a solid form on the insulating layer 16x. Specifically, after a polycrystalline silicon film is provided by the reduced pressure CVD method, phosphorus is implanted into the polycrystalline silicon film, and then diffused to form a conductive polysilicon film. Concentration of phosphorus atoms in the second conductive layer 16y is to be $1\times10^{19}$ particles/$cm^3$ or larger. At this time, the inside of the trench TR is filled with the second conductive layer 16y.

Figure 19A:
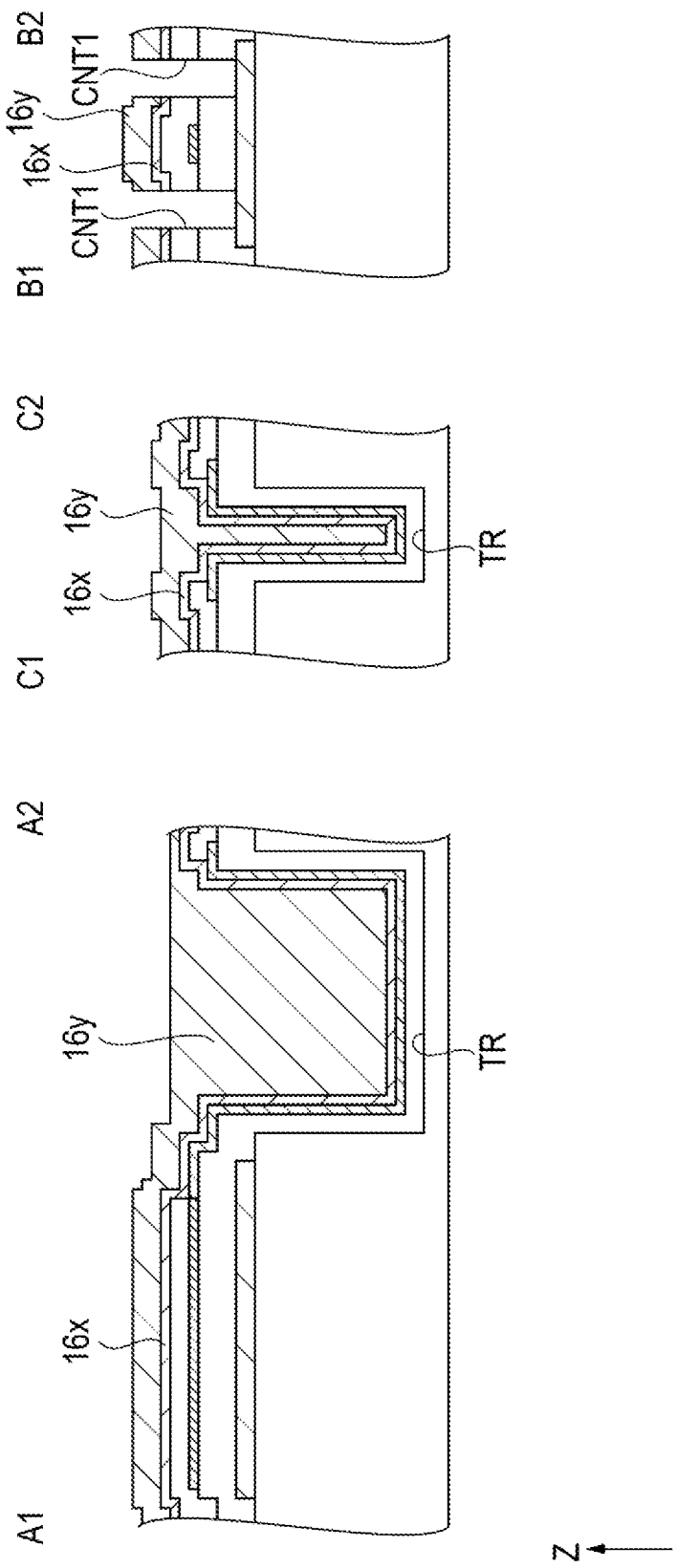
FIG. 19A is a schematic cross-sectional view illustrating the method for manufacturing the element substrate.

Next, as illustrated in FIG. 19A, the pair of second contact holes CNT 1 facing each other in the ±Y direction with the semiconductor layer 30S interposed therebetween are provided. The pair of second contact holes CNT 1 penetrate the second conductive layer 16y, the insulating layer 16x, the gate insulation layer 11b, and the first interlayer insulating layer 11a to reach as far as the scan line 3. For example, dry etching is used to form the pair of second contact holes CNT 1.

Figure 19B:
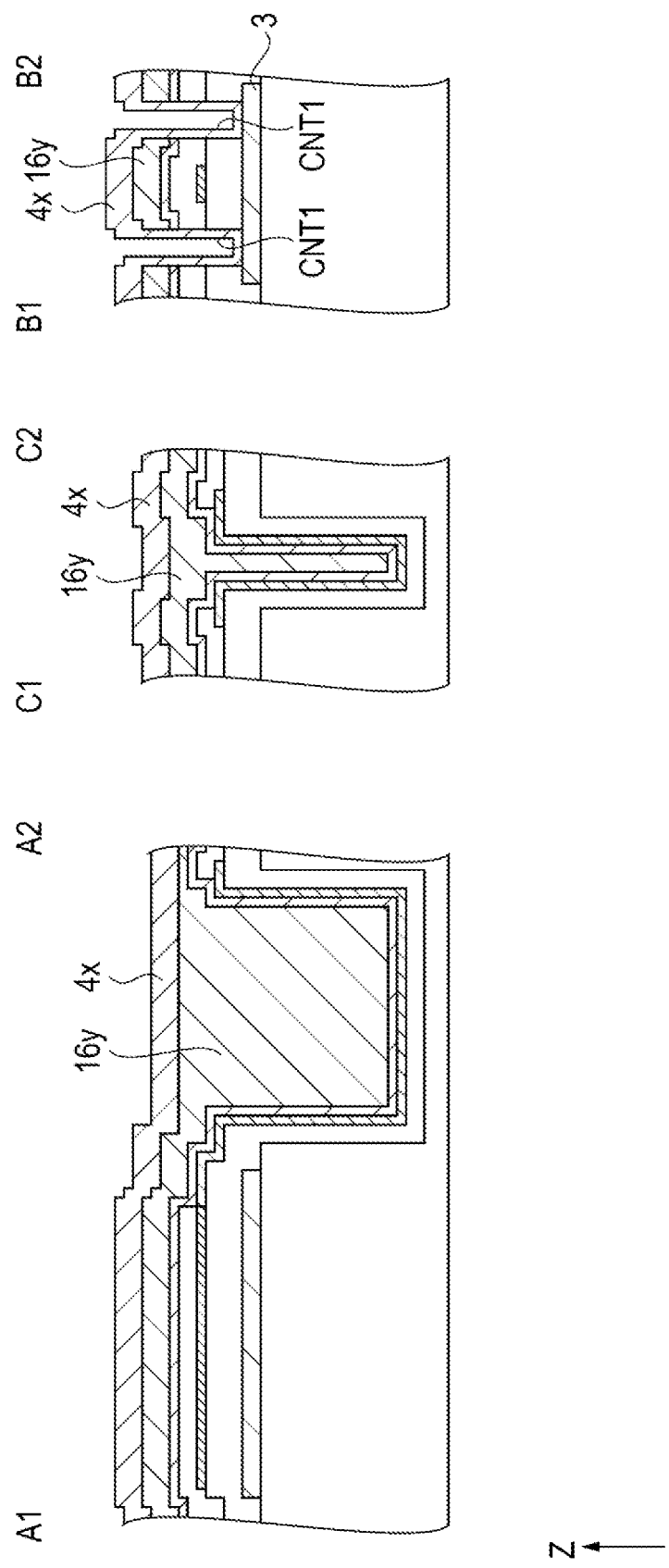
FIG. 19B is a schematic cross-sectional view illustrating the method for manufacturing the element substrate.
Figure 20:
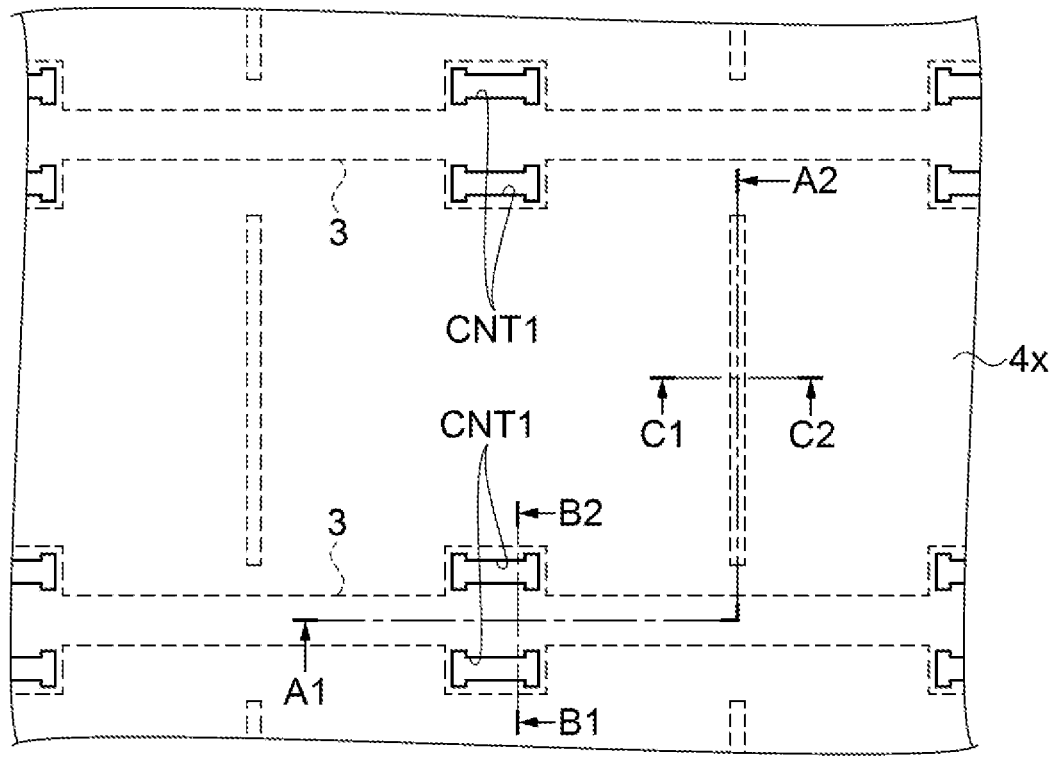
FIG. 20 is a schematic plan view illustrating the method for manufacturing the element substrate.

Next, as illustrated in FIG. 19B and FIG. 20, the third conductive layer 4x is provided in a solid form on the second conductive layer 16y. At this time, the third conductive layer 4x is provided so as to fill the pair of second contact holes CNT 1, to electrically couple the scan line 3 to the third conductive layer 4x. Then the processing proceeds to step S8.

Figure 21:
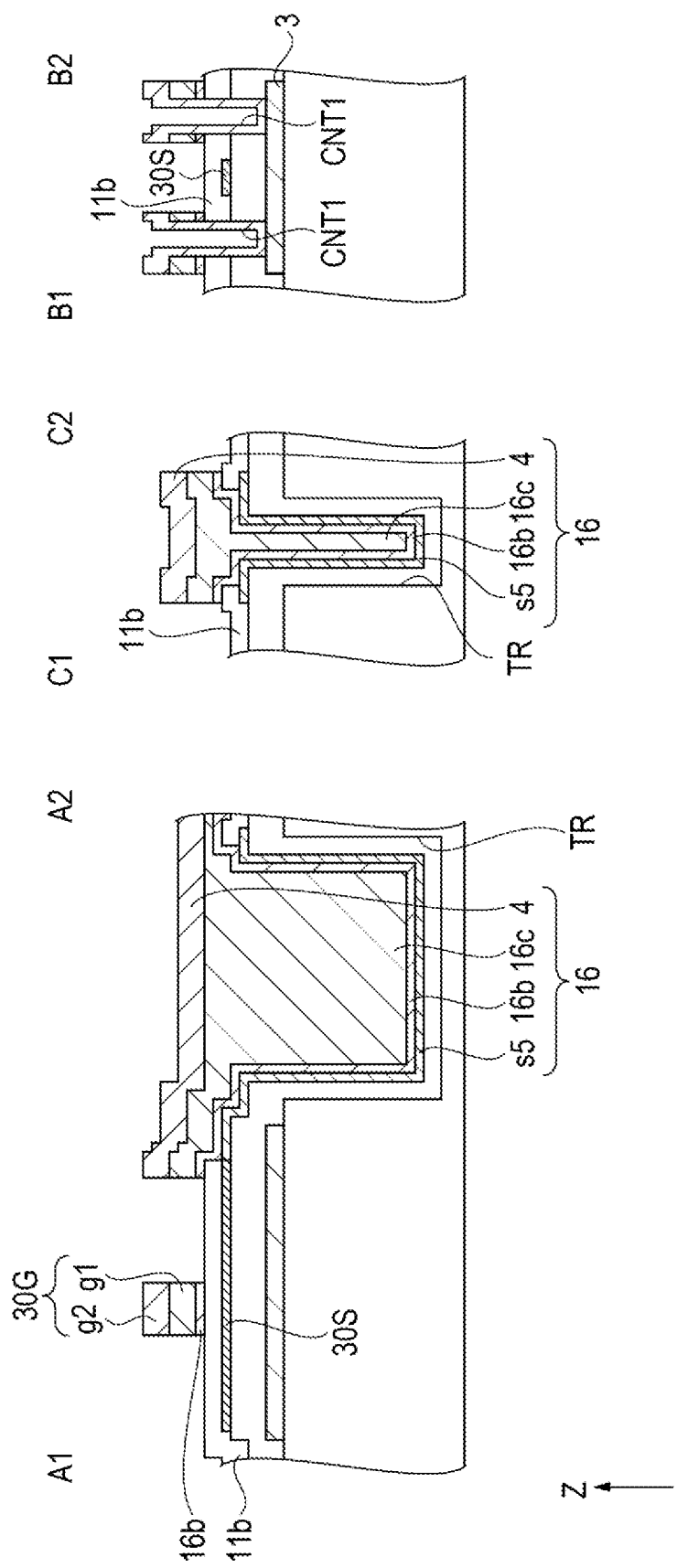
FIG. 21 is a schematic cross-sectional view illustrating the method for manufacturing the element substrate.

In step S8, as illustrated in FIG. 21, the gate electrode 30G, the capacitance element 16, and the like are formed. Specifically, the insulating layer 16x, the second conductive layer 16y, and the third conductive layer 4x are patterned using the dry etching.

Accordingly, the gate electrode 30G constituted by the first gate electrode g1 and the second gate electrode g2 is provided on the gate insulation layer 11b via the capacitance insulation layer 16b. At this time, in plan view, the insulating layer 16x of silicon nitride is removed in a region other than the gate electrode 30G and the second upper capacitance electrode 4. This facilitates hydrogenation in the semiconductor layer 30S. In other words, in a region on the semiconductor layer 30S that does not overlap with the gate electrode 30G of the semiconductor layer 30S and the capacitance insulation layer 16b below the gate electrode 30G, silicon nitride is not provided.

By the patterning described above, the capacitance element 16 is also provided that is constituted by a part of the other source drain region s5, the capacitance insulation layer 16b, the first upper capacitance electrode 16c, and the second upper capacitance electrode 4.

Figure 22:
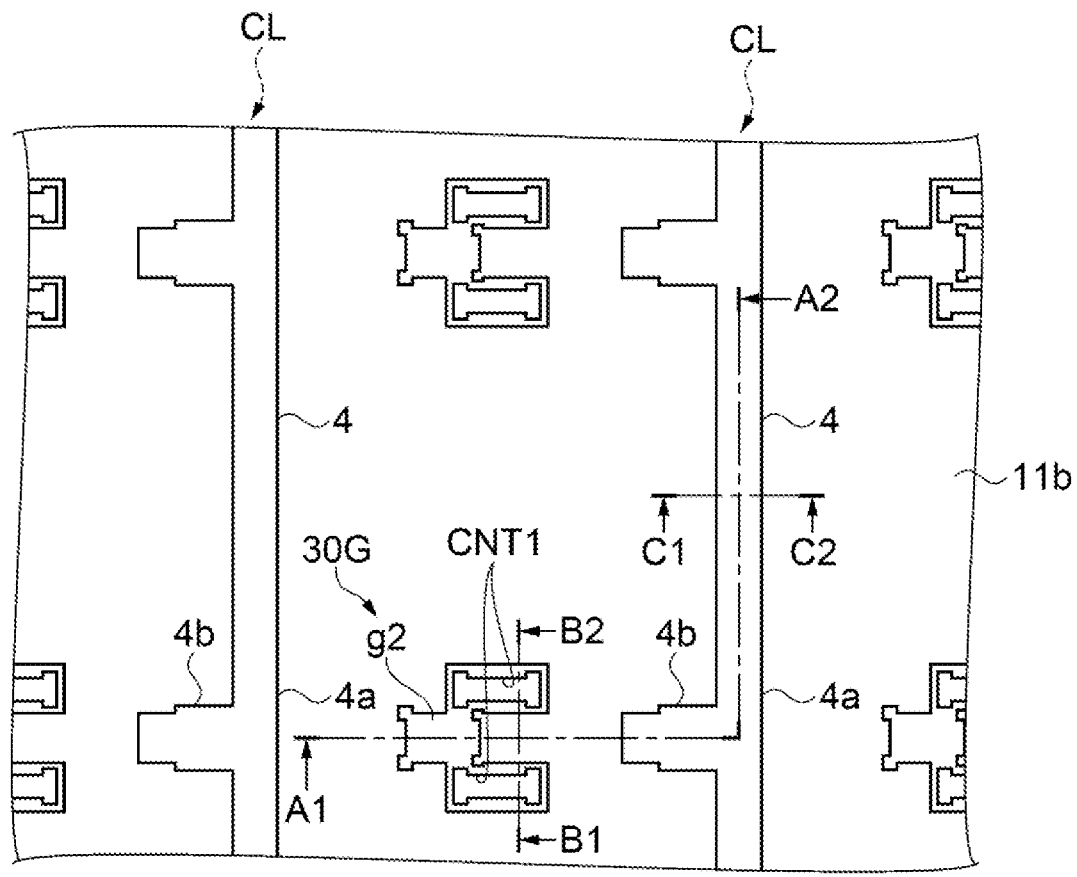
FIG. 22 is a schematic plan view illustrating the method for manufacturing the element substrate.

As illustrated in FIG. 22, the gate electrode 30G is disposed in a state of an island in plan view, and includes a site overlapping with the pair of second contact holes CNT 1, and a site overlapping with the semiconductor layer 30S (not illustrated).

The second upper capacitance electrode 4 is provided extending in the ±Y direction so as to overlap with the non-opening area CL extending in the ±Y direction. The second upper capacitance electrode 4 includes a main body portion 4a overlapping with the data line 6 provided above, and extending in the ±Y direction, and a protruding portion 4b protruding in the −X direction from the main body portion 4a. The protruding portion 4b overlaps with a site of the semiconductor layer 30S that extends in the ±X direction. The capacitance insulation layer 16b and the first upper capacitance electrode 16c are disposed so as to overlap with the second upper capacitance electrode 4. Then the processing proceeds to step S9.

Figure 23:
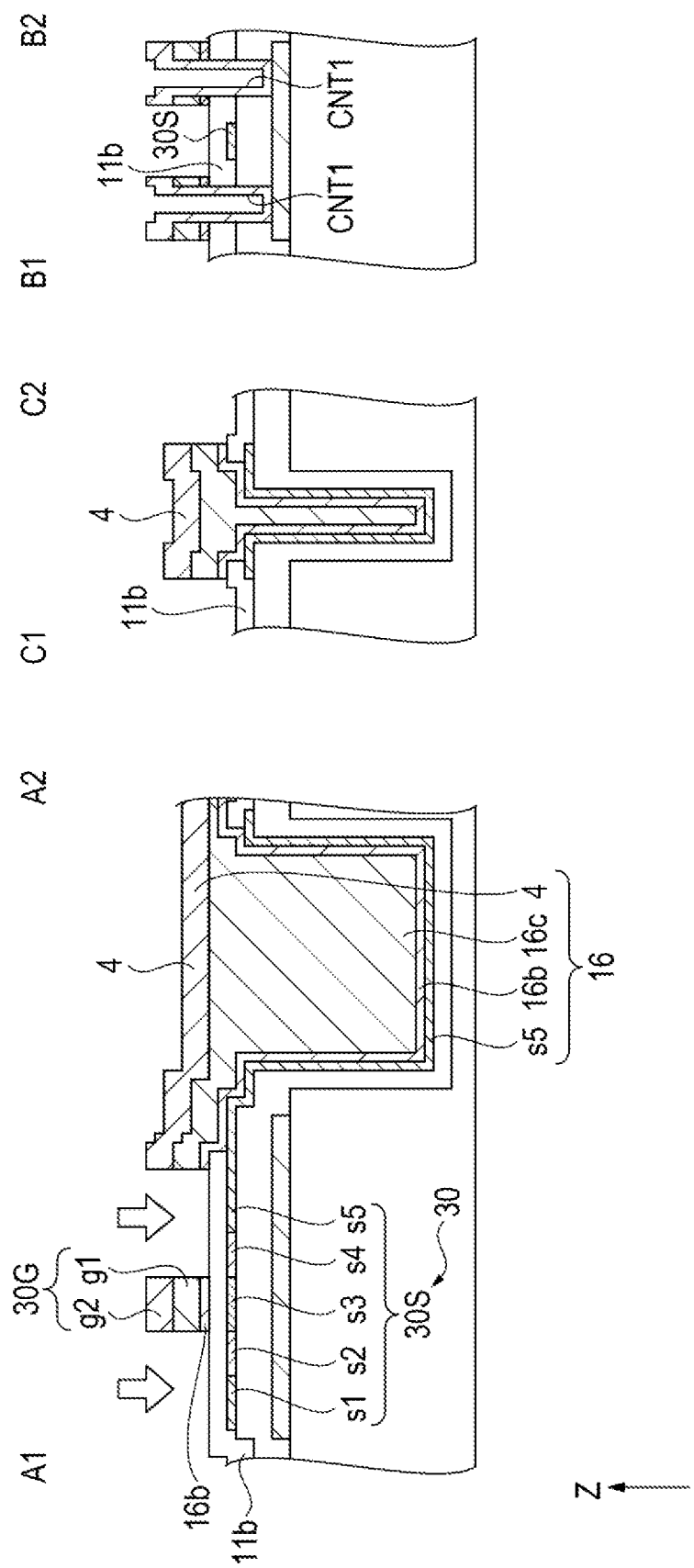
FIG. 23 is a schematic cross-sectional view illustrating the method for manufacturing the element substrate.
Figure 24:
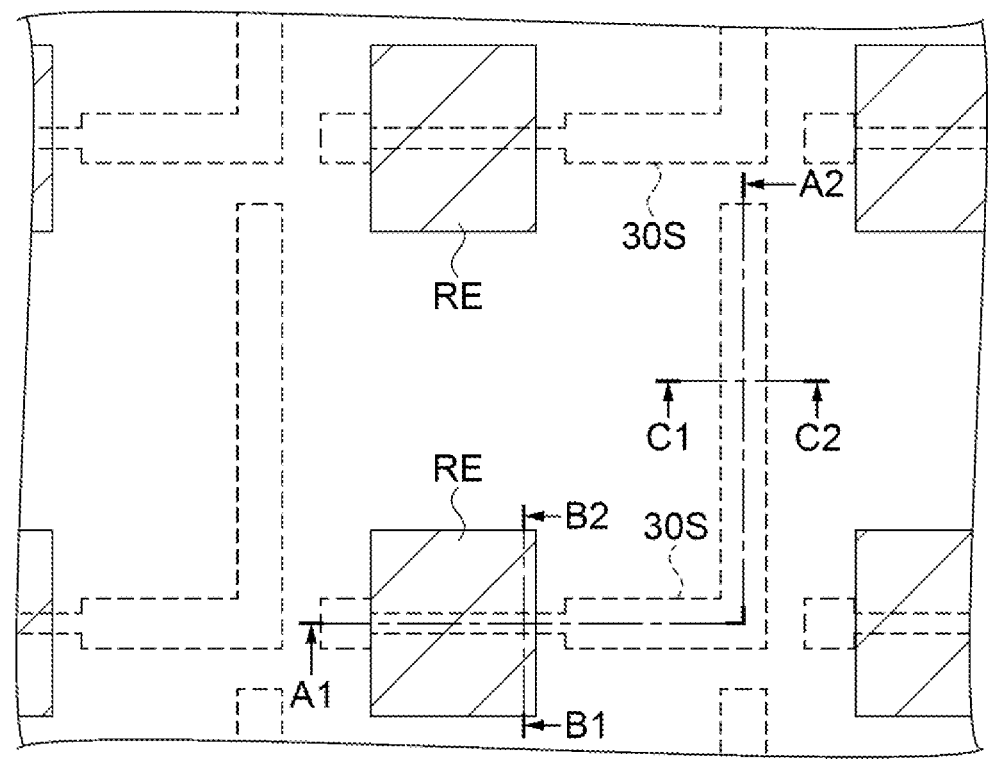
FIG. 24 is a schematic plan view illustrating the method for manufacturing the element substrate.
Figure 24:
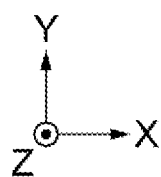

In step S9, as illustrated in FIG. 23, the one source drain region s1, the LDD regions s2 and s4, the channel region s3, and a part of the other source drain region s5 are formed in the semiconductor layer 30S by the ion implantation. Specifically, implantation of medium concentration ion and subsequent implantation of high concentration ion are performed for the semiconductor layer 30S.

First, the LDD regions s2 and s4 sandwiching the channel region s3 in the ±X direction is provided by the implantation of medium concentration ion. Next, by patterning the resist RE illustrated in FIG. 24, the LDD regions s2, s4 of the semiconductor layer 30S, and the channel region s3 are masked, and the implantation of high concentration ion is performed for the rest of the semiconductor layer 30S. This provides the source drain regions s1 and s5. Then the processing proceeds to step S10.

In step S10, the second interlayer insulating layer 11c and the like are formed. First, the second interlayer insulating layer 11c is provided on the second gate electrode g2, the second upper capacitance electrode 4, and the gate insulation layer 11b exposed upward. Examples of a method for forming silicon oxide being the second interlayer insulating layer 11c include, for example, an atmospheric pressure CVD method, the reduced pressure CVD, the plasma CVD method, or the like using, monosilane, dichlorosilane, TEOS, Triethyl Borate (TEB), and the like.

Next, impurity activation annealing is performed by heating at about 1000° C. Subsequently, hydrogen plasma processing is performed. Accordingly, defects in the semiconductor layer 30S are terminated with hydrogen, and characteristics of the switching element are improved.

Figure 25:
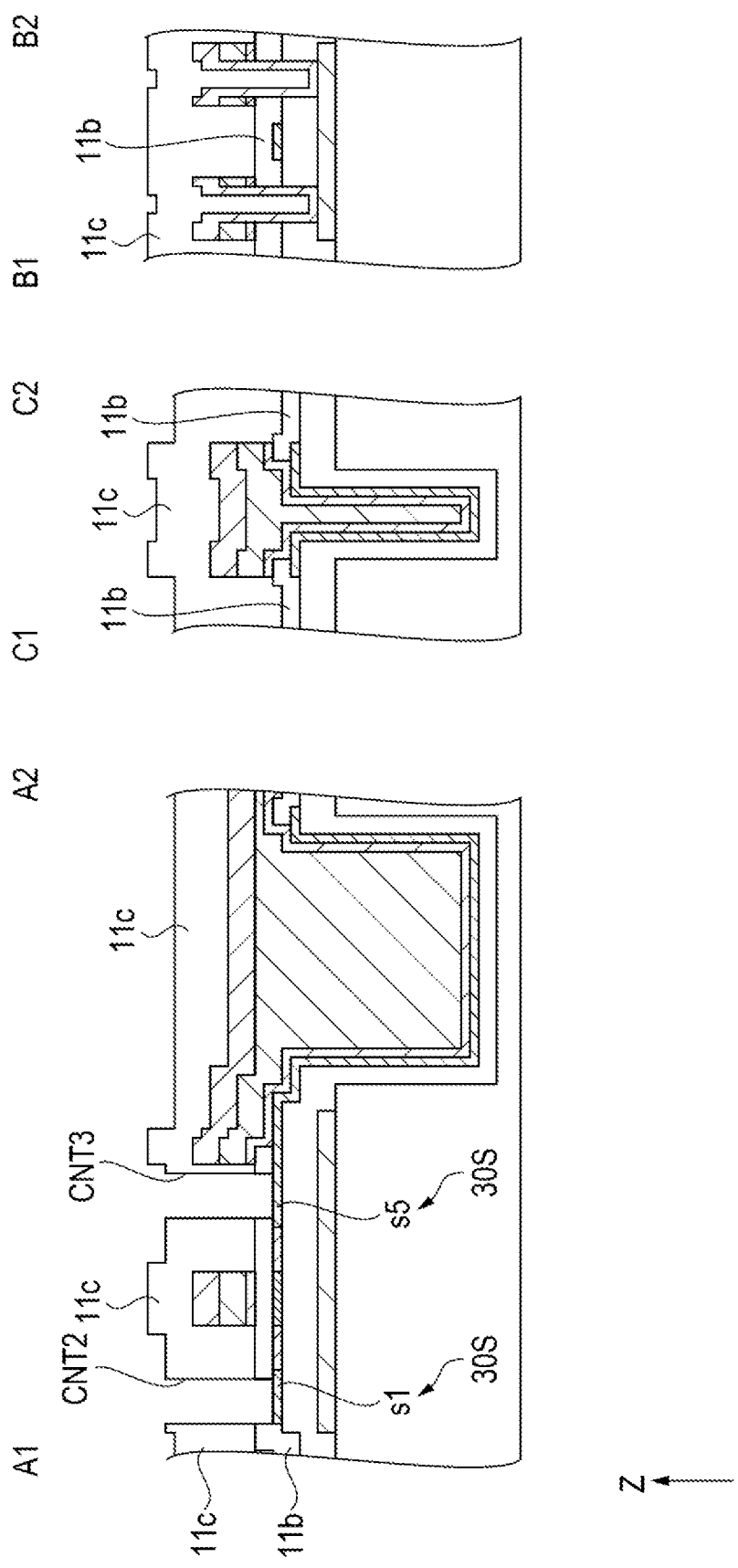
FIG. 25 is a schematic cross-sectional view illustrating the method for manufacturing the element substrate.
Figure 26:
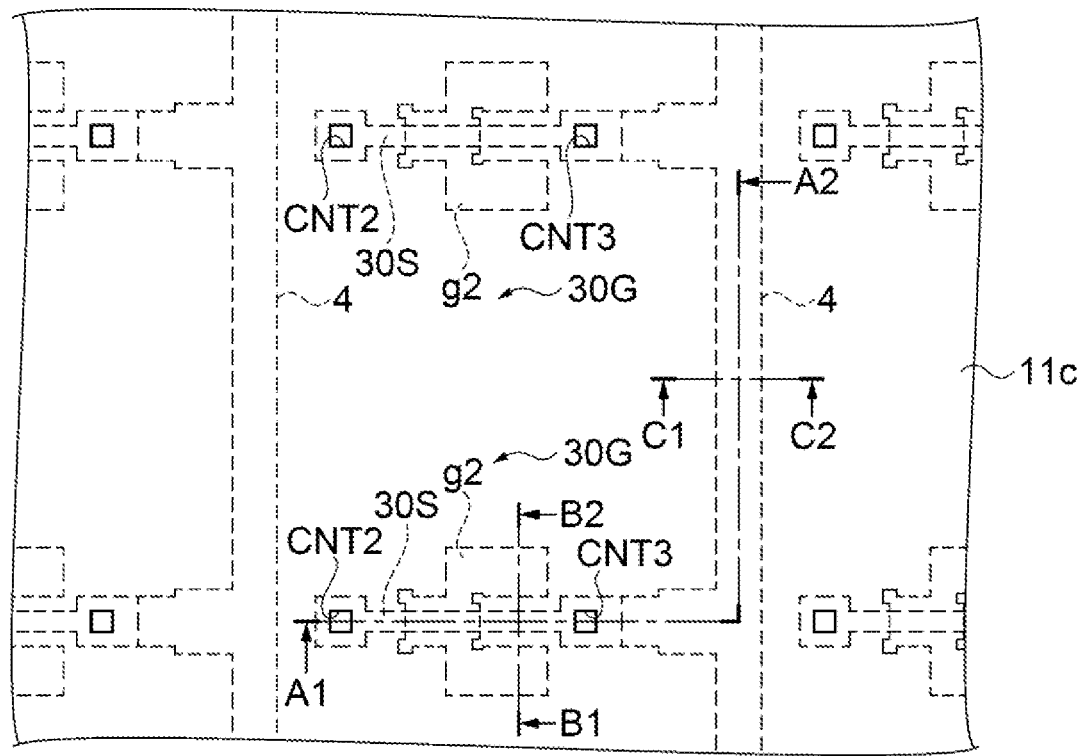
FIG. 26 is a schematic plan view illustrating the method for manufacturing the element substrate.

Next, as illustrated in FIG. 25 and FIG. 26, the contact holes CNT 2 and CNT 3 are formed by the dry etching. The contact holes CNT 2 and CNT 3 penetrate the gate insulation layer 11b and the second interlayer insulating layer 11c to reach as far as the semiconductor layer 30S. In plan view, the contact hole CNT 2 overlaps with the one source drain regions s1, and the contact hole CNT 3 overlaps with a site of the other source drain region s5 that is adjacent to the LDD region s4. Then the processing proceeds to step S11.

Figure 27:
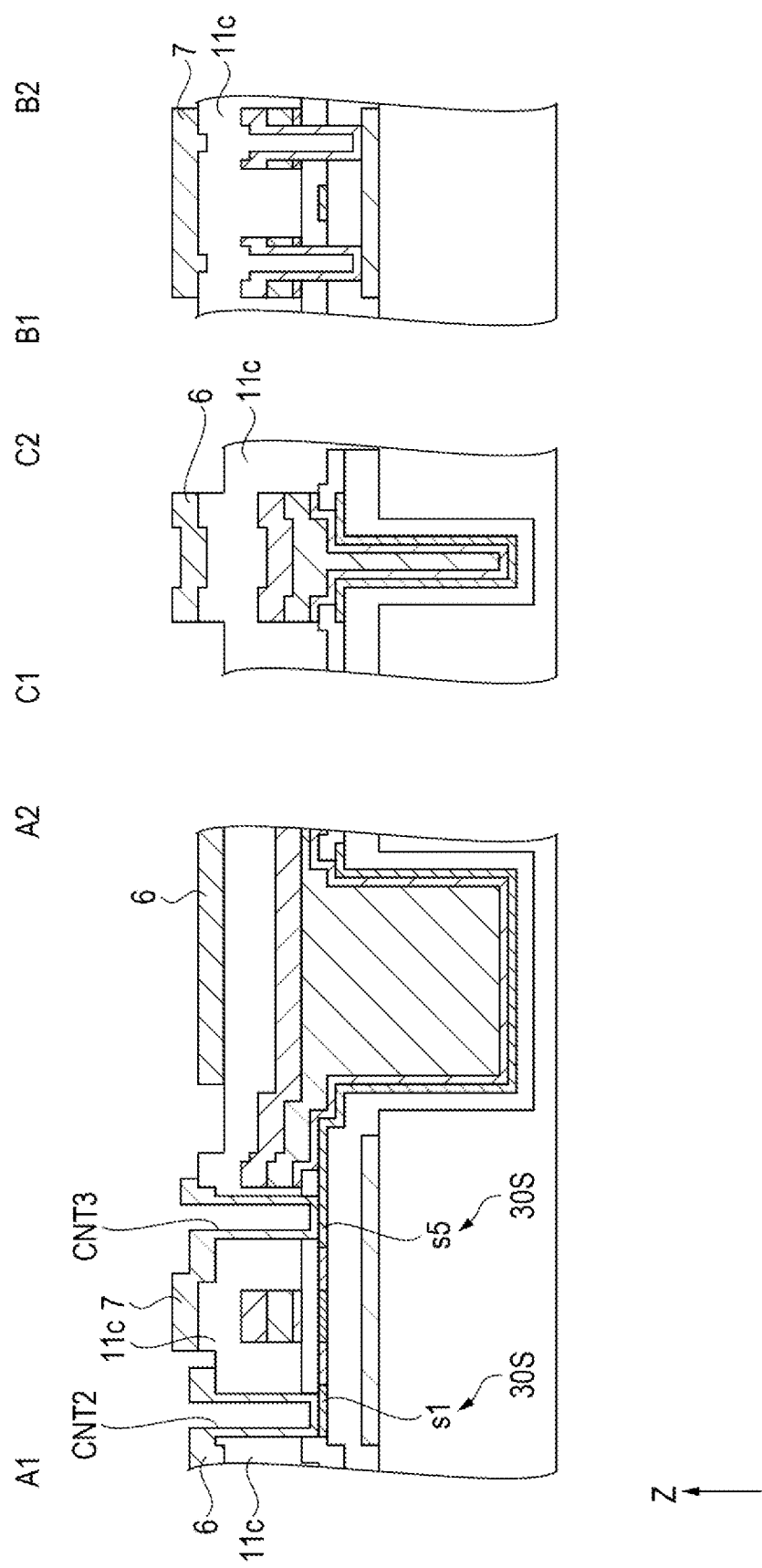
FIG. 27 is a schematic cross-sectional view illustrating the method for manufacturing the element substrate.

In step S11, the data line 6 and the second relay layer 7 are formed. At this time, as illustrated in FIG. 27, the data line 6 and the second relay layer 7 are provided so as to fill the contact holes CNT 2 and CNT 3.

Figure 28:
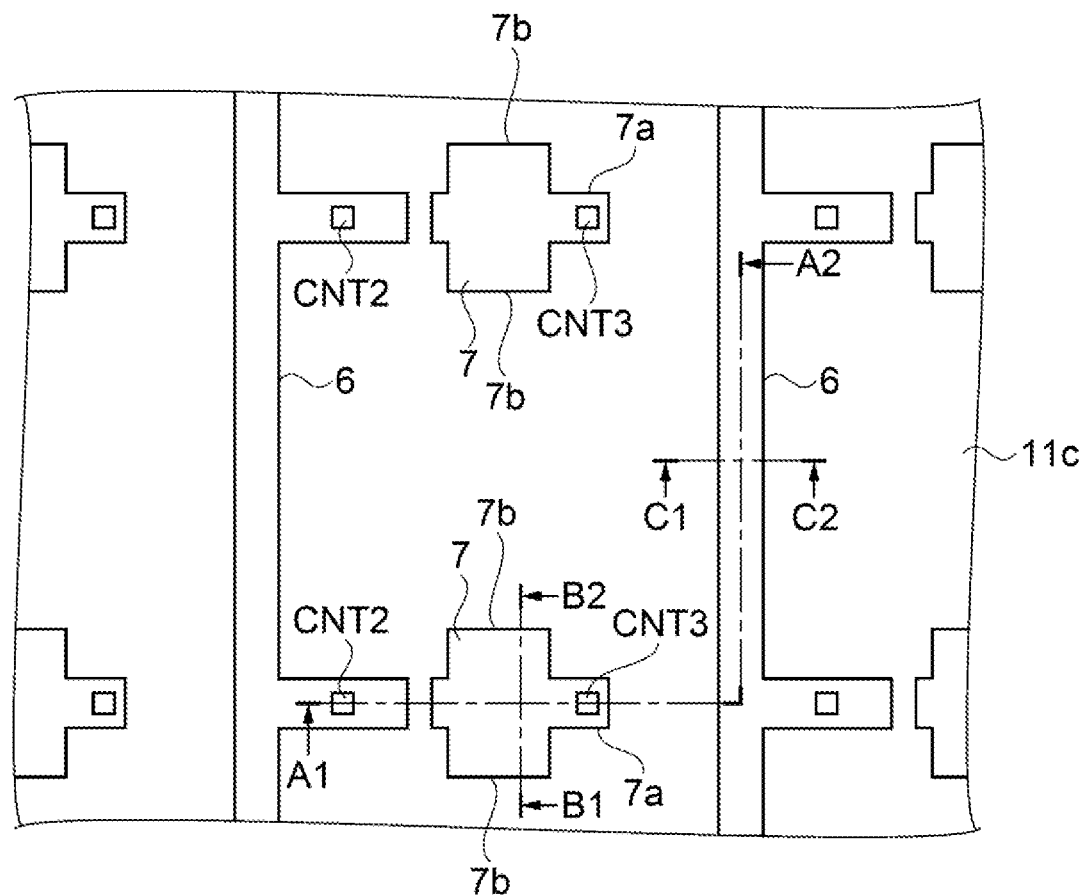
FIG. 28 is a schematic plan view illustrating the method for manufacturing the element substrate.

As illustrated in FIG. 28, the data line 6 is provided extending in the ±Y direction, and overlaps with a site of the other source drain region s5 that extends in the ±Y direction (not illustrated). In other words, the data line 6 is provided extending in the ±Y direction, and overlaps with the trench TR and the capacitance element 16 in plan view. The data line 6 has a site protruding in the +X direction that overlaps with the non-opening area CL extending in the ±X direction. The contact hole CNT 2 is provided in the site.

The second relay layer 7 is provided in a state of an island independent of the data line 6. The second relay layer 7 includes a main body portion 7a extending in the ±X direction and overlapping with a part of the semiconductor layer 30S below, and a protruding portion 7b protruding in the ±Y direction from the main body portion 7a.

The data line 6 is electrically coupled to the one source drain region s1 of the semiconductor layer 30S via the contact hole CNT 2. The second relay layer 7 is electrically coupled to the other source drain region s5 of the semiconductor layer 30S via the contact hole CNT 3. Then the processing proceeds to step S12.

In step S12, an upper layer of the data lines 6 is formed. First, the third interlayer insulating layer 12 is provided in a solid form, on the data line 6, the second relay layer 7, and the second interlayer insulating layer 11c exposed upward. The third interlayer insulating layer 12 is provided by the plasma CVD method using, for example, a silicon oxide film.

Figure 29:
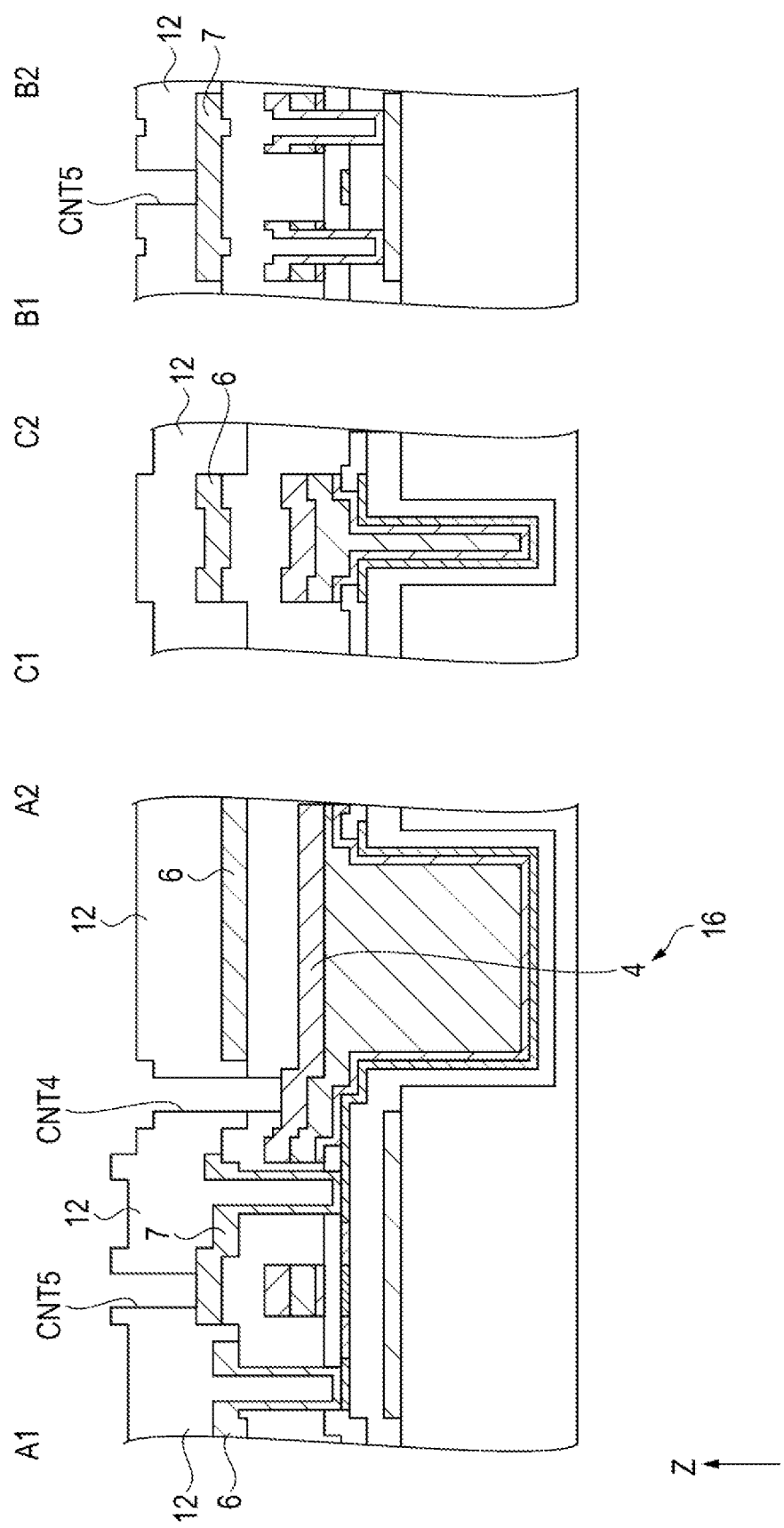
FIG. 29 is a schematic cross-sectional view illustrating a method for manufacturing the element substrate.
Figure 30:
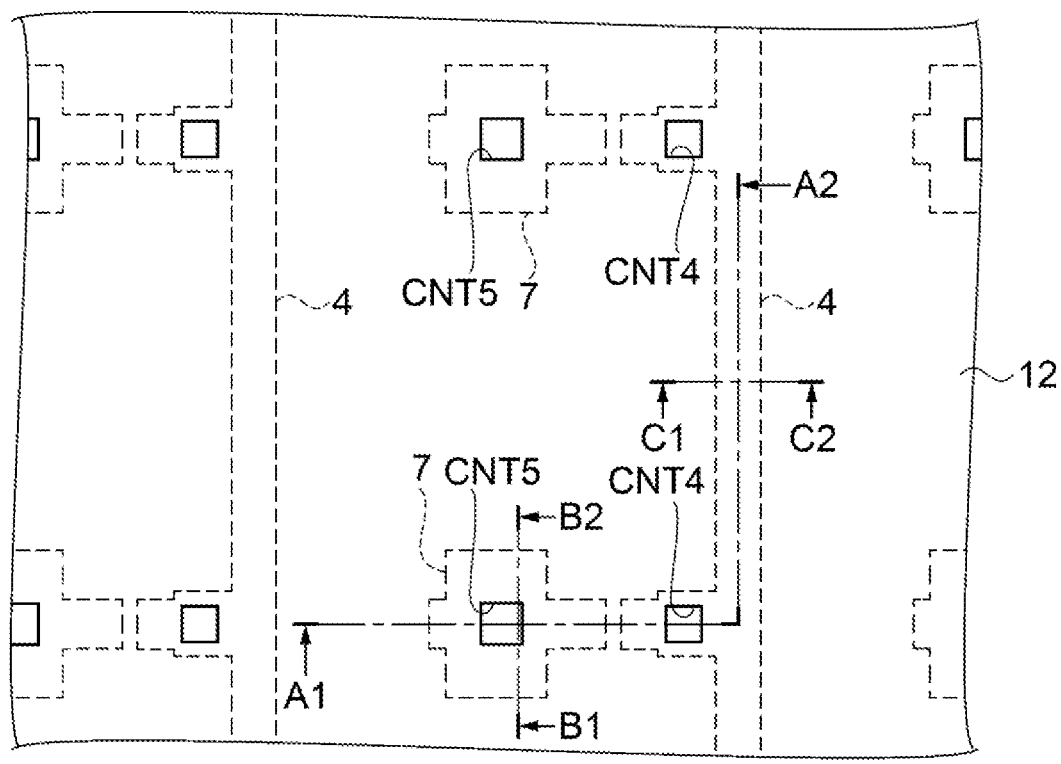
FIG. 30 is a schematic plan view illustrating the method for manufacturing the element substrate.

Next, as illustrated in FIG. 29 and FIG. 30, the contact holes CNT 4 and CNT 5 are provided by the dry etching. The contact hole CNT 4 penetrates the third interlayer insulating layer 12 and the second interlayer insulating layer 11c, and reaches as far as the second upper capacitance electrode 4 of the capacitance element 16. The contact hole CNT 5 penetrates the third interlayer insulating layer 12 and reaches as far as the second relay layer 7.

Figure 31:
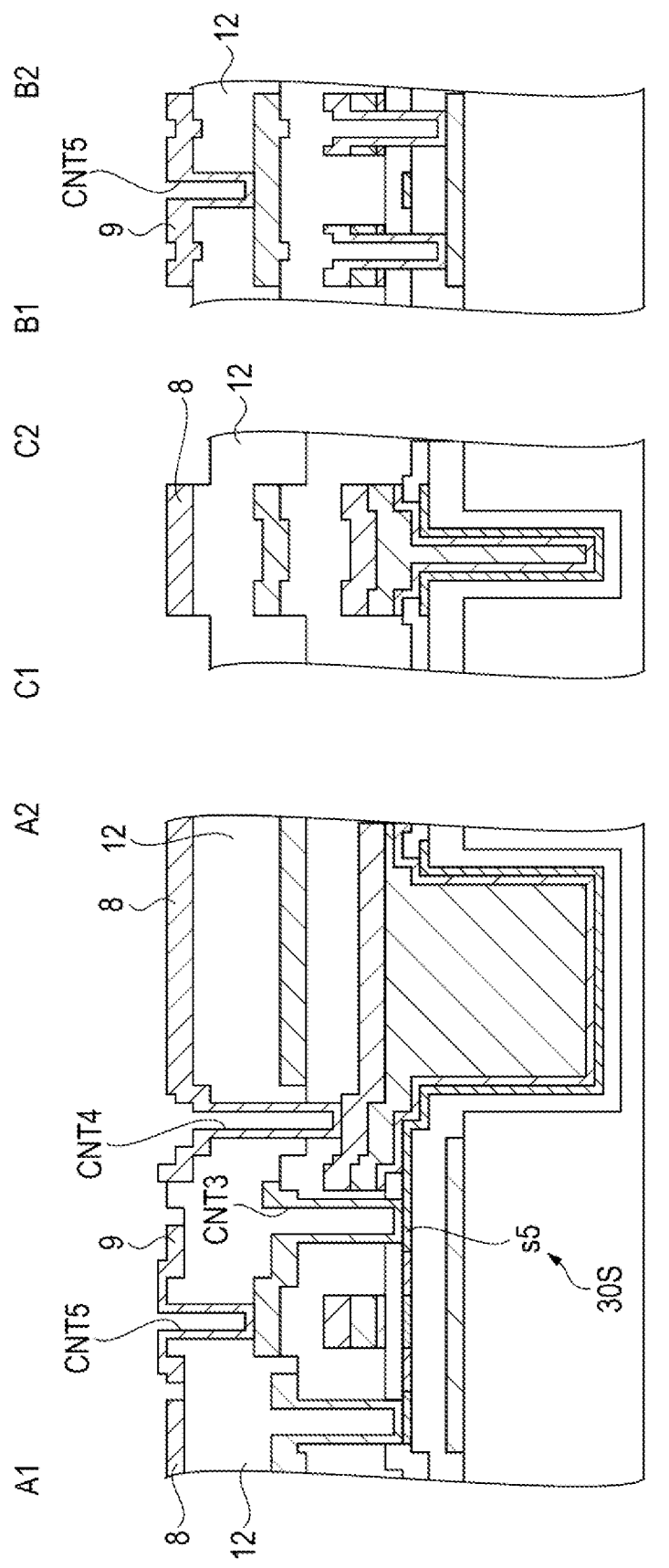
FIG. 31 is a schematic cross-sectional view illustrating the method for manufacturing the element substrate.

Next, the capacitance line 8 and the first relay layer 9 are formed. At this time, as illustrated in FIG. 31, the capacitance line 8 and the first relay layer 9 are provided so as to fill the contact holes CNT 4 and CNT 5.

The capacitance line 8 is electrically coupled to the second upper capacitance electrode 4 via the contact hole CNT 4. The first relay layer 9 is electrically coupled to the other source drain region s5 of the semiconductor layer 30S, via the contact hole CNT 5, the second relay layer 7, and the contact hole CNT 3.

Figure 32:
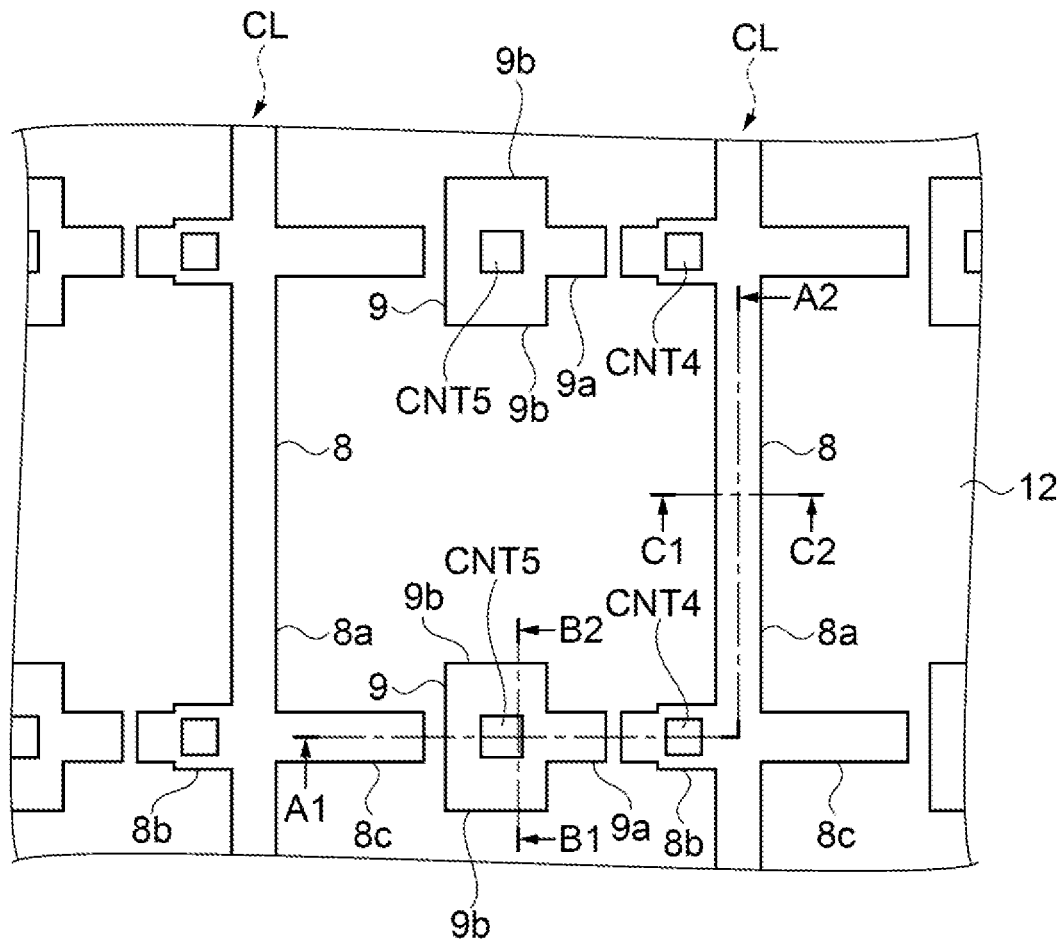
FIG. 32 is a schematic plan view illustrating the method for manufacturing the element substrate.
Figure 32:
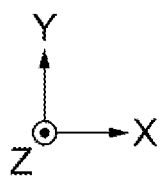

As illustrated in FIG. 32, the capacitance line 8 is provided to extend in the ±Y direction, so as to overlap with the non-opening area CL extending in the ±Y direction. The capacitance line 8 includes a main body 8a overlapping with the data line 6 provided below and extending in the ±Y direction, a protruding portion 8b protruding in the -X direction from the main body portion 8a, and another protruding portion 8c protruding from the body 8a in the +X direction opposed to the protruding portion 8b. The protruding portion 8b overlaps with a site of the semiconductor layer 30S that extends in the ±X direction. The contact hole CNT 4 is provided in the protruding portion 8b. The other protruding portion 8c overlaps with another semiconductor layer 30S (not illustrated) adjacent to the semiconductor layer 30S in the +X direction.

The first relay layer 9 is provided in a state of an island independent of the capacitance line 8, and overlaps with the contact hole CNT 5. The first relay layer 9 includes a main body portion 9a extending in the ±X direction and overlapping with a part of the semiconductor layer 30S below, and a protruding portion 9b protruding in the ±Y direction from the main body portion 9a.

Next, the fourth interlayer insulating layer 13 is provided in a solid form, on the capacitance line 8, the first relay layer 9, and the third interlayer insulating layer 12 exposed upward. The fourth interlayer insulating layer 13 is provided by the plasma CVD method using, for example, a silicon oxide film. After the third interlayer insulating layer 12 is provided, a planarization process such as a Chemical & Mechanical Polishing (CMP) process is performed to flatten unevenness caused by the structure of the lower layer.

Figure 33:
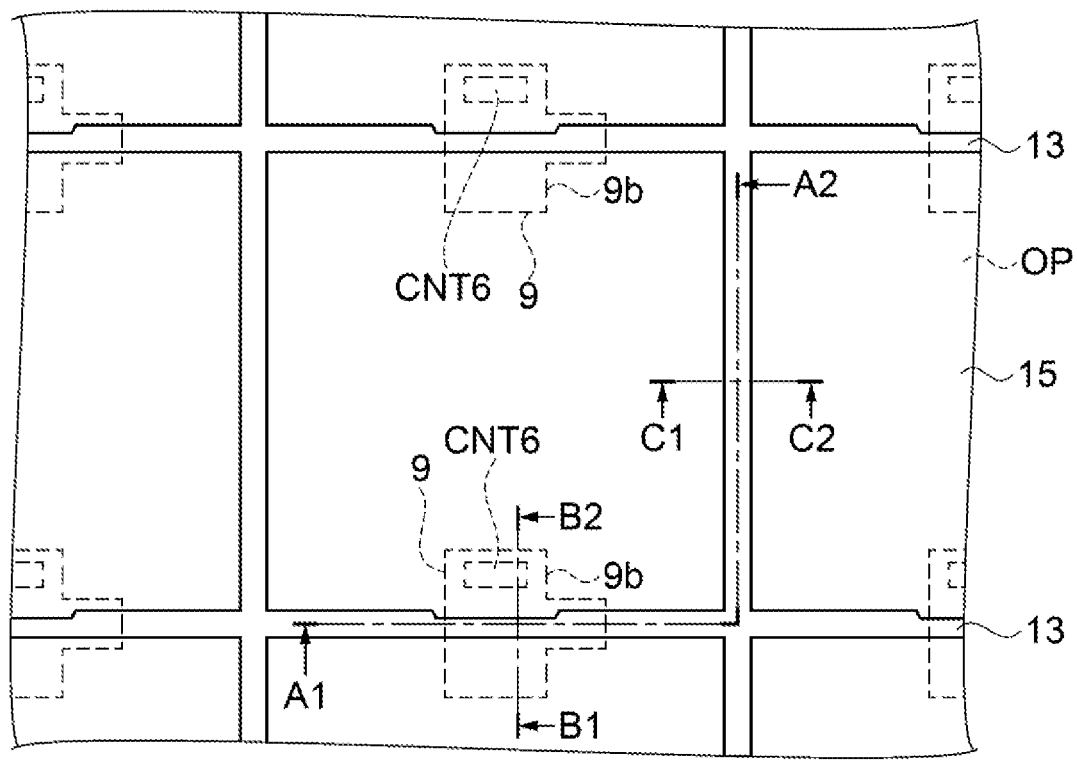
FIG. 33 is a schematic plan view illustrating the method for manufacturing the element substrate.

Next, the first contact hole CNT 6 penetrating the fourth interlayer insulating layer 13 to expose the first relay layer 9 is provided by the dry etching. Thereafter, as illustrated in FIG. 33, the pixel electrode 15 corresponding to the opening area OP is provided on the fourth interlayer insulating layer 13. At this time, the pixel electrode 15 is provided to fill the first contact hole CNT 6. Accordingly, the pixel electrode 15 is electrically coupled to the other source drain region s5 of the semiconductor layer 30S, via the first contact hole CNT 6, the first relay layer 9, the contact hole CNT 5, the second relay layer 7, and the contact hole CNT 3.

Of the method for manufacturing the element substrate 10, known techniques can be used for subsequent steps, and descriptions thereof will be omitted. According to the method for manufacturing described above, the element substrate 10 and the liquid crystal apparatus 100 are manufactured.

According to the present exemplary embodiment, the following advantages can be obtained.

The retention capacitor can be increased, and manufacturing costs can be reduced. Specifically, the one source drain regions s1 and the channel region s3 of the semiconductor layer 30S are overlapped and disposed on the scan line 3, and the other source drain region s5 and the capacitance element 16 are overlapped and disposed on the data line 6. Accordingly, an area of the capacitance element 16 is easily ensured, and a retention capacitor of the capacitance element 16 can be increased.

In addition, in the capacitance element 16, the other source drain region s5 that extends of the semiconductor layer 30S, is the lower capacitance electrode, and the first upper capacitance electrode 16c and the second upper capacitance electrode 4 that are the capacitance electrodes, are overlapped and disposed on the lower capacitance electrodes. In other words, since the part of the semiconductor layer 30S is used as the lower capacitance electrode, the manufacturing process can be simplified. As described above, the liquid crystal apparatus 100 that increases the retention capacitor, and reduces the manufacturing costs can be provided.

The capacitance element 16 is disposed on the inside of the trench TR, that is the side surface and the bottom surface of the trench TR, and the area of the capacitance element 16 is enlarged. Accordingly, the retention capacitor of the capacitance element 16 can be further increased.

Since the first interlayer insulating layer 11a is disposed in the trench TR, the trench TR is not made too wide, compared to a case where the first interlayer insulating layer 11a is not present. Thus, the data line 6 and the like disposed on the trench TR are made less likely to fall into the trench TR, and it is possible to suppress occurrence of disconnection or the like in the data line 6.

Since the first relay layer 9 overlaps with one of the pair of second contact holes CNT 1, an opening ratio in the liquid crystal apparatus 100 can be improved, compared to a case where the first relay layer 9 do not overlap with the second contact hole CNT 1.

The gate insulation layer 11b and the capacitance insulation layer 16b are disposed between the gate electrode 30G and the channel region s3 of the semiconductor layer 30S, and only the capacitance insulation layer 16b is disposed as the dielectric layer of the capacitance element 16. Accordingly, insulating properties between the gate electrode 30G and the semiconductor layer 30S can be ensured, and the dielectric layer of the capacitance element 16 can be thinned. In other words, the retention capacitor of the capacitance element 16 can be further increased.

The capacitance insulation layer 16b formed of the silicon nitride film is not provided, in plan view, on the semiconductor layer 30S in a region not overlapping with the gate electrode 30G, the first upper capacitance electrode 16c, and the second upper capacitance electrode 4, thus the defects in the semiconductor layer 30S are terminated with hydrogen in the hydrogen plasma processing step, and the characteristics of the switching element are improved.

Since the main body portion 9a of the first relay layer 9 and the main body portion 7a of the second relay layer 7 overlap with the semiconductor layer 30S, light shielding properties are improved, and occurrence of optical leakage current in the TFT 30 can be suppressed. In addition, the first contact hole CNT 6 can be provided in the protruding portion 9b of the first relay layer 9 to ensure electrical coupling to the pixel electrode 15.

The protruding portions 4b, 8b, and 8c that overlap in plan view with the semiconductor layer 30S can reduce light incident on the TFT 30, and enhance the light shielding properties for the TFT 30. Additionally, the capacitance line 8, that is a constant potential line, makes it possible to shield effects of potential fluctuations of the data line 6 and the scan line 3, and it is possible to suppress deterioration in display quality of the liquid crystal apparatus 100.

Since the capacitance element 16 is provided in a region overlapping with the non-opening area CL in plan view, the opening ratio in the liquid crystal apparatus 100 can be improved.

2. Second Exemplary Embodiment

In the present exemplary embodiment, as in the first exemplary embodiment, an active drive type liquid crystal apparatus including a TFT as a transistor for each pixel will be exemplified as an electro-optical device. The liquid crystal apparatus according to the present exemplary embodiment differs from the liquid crystal apparatus 100 of the first exemplary embodiment in a configuration of an element substrate. Thus, the same components as in the first exemplary embodiment are given the same reference signs, and redundant descriptions of these components will be omitted.

2.1. Configuration of Element Substrate

Figure 34:
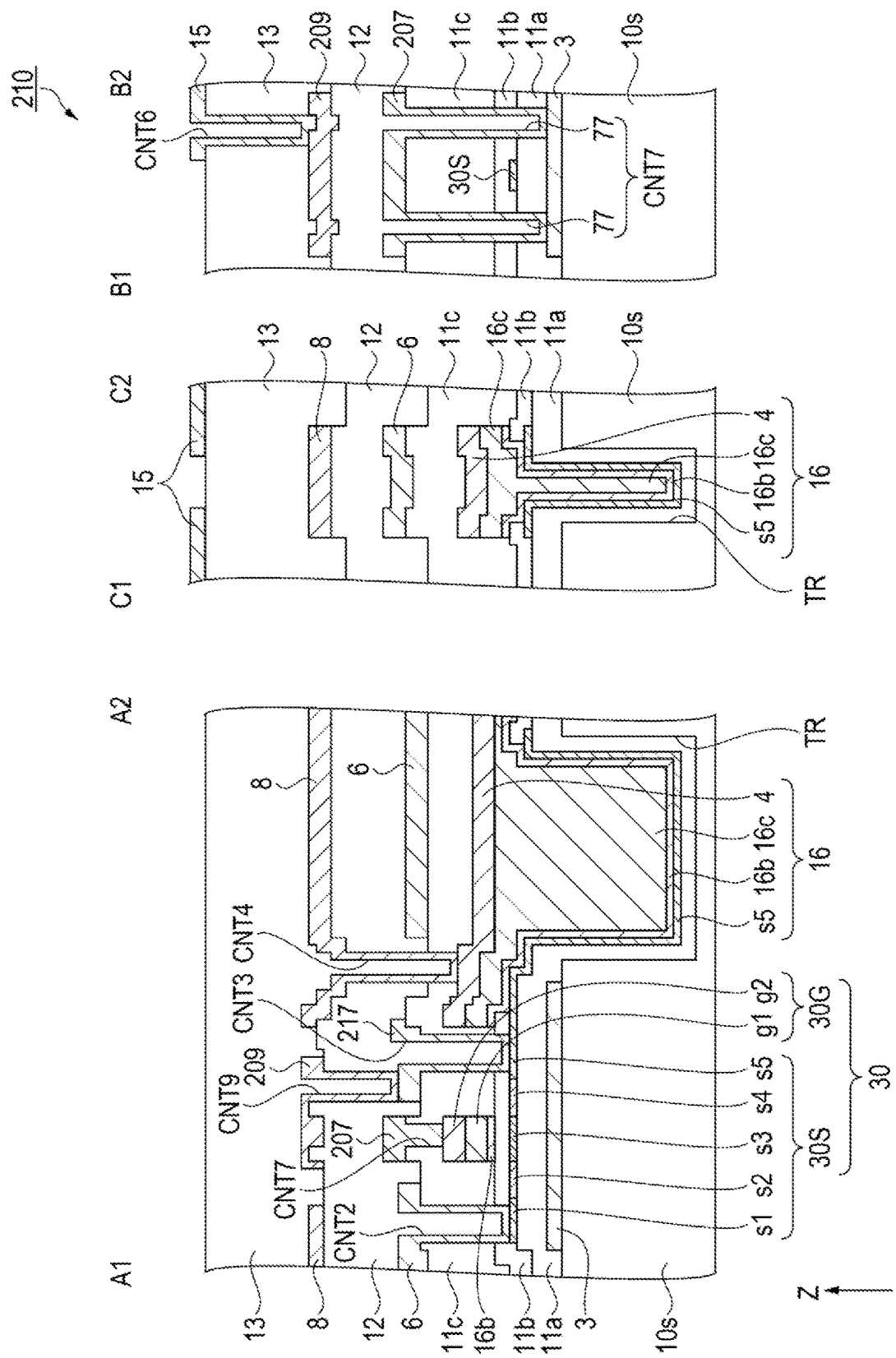
FIG. 34 is a schematic cross-sectional view illustrating structure of an element substrate in a liquid crystal apparatus according to a second exemplary embodiment.

Structure of an element substrate 210 included in the liquid crystal apparatus of the present exemplary embodiment will be described with reference to FIG. 34. FIG. 34 is a schematic cross-sectional view illustrating the structure of the element substrate in the liquid crystal apparatus according to the second exemplary embodiment. Note that, the liquid crystal apparatus according to the second exemplary embodiment has similar arrangement of pixels to that of the liquid crystal apparatus 100 in the first exemplary embodiment. Thus, in FIG. 34, three cross sections corresponding to FIG. 5 in the element substrate 10 of the liquid crystal apparatus 100 are illustrated.

As illustrated in FIG. 34, the element substrate 210 in the liquid crystal apparatus of the present exemplary embodiment includes a pair of light shielding walls 77 facing each other in the ±Y direction with the semiconductor layer 30S interposed therebetween. The light shielding wall 77 is provided in a contact hole CNT 7. The element substrate 210 of the present exemplary embodiment differs from the element substrate 10 of the first exemplary embodiment in this regard.

The light shielding wall 77 provided in the contact hole CNT 7 penetrates the first interlayer insulating layer 11a, the gate insulation layer 11b, and the second interlayer insulating layer 11c, and is electrically coupled to the scan line 3. A relay layer 207 in the fourth layer penetrates the second interlayer insulating layer 11c, and is electrically coupled to the second gate electrode g2, via the contact hole CNT 7. The Relay layer 207 includes an identical material to that of the data line 6. In other words, the metal or metal compound thereof described above is used for the relay layer 207, similar to the data line 6.

Accordingly, the second gate electrode g2 is electrically coupled to the scan line 3 via the contact hole CNT 7. In other words, the gate electrode 30G of the TFT 30 is electrically coupled to the scan line 3 via the contact hole CNT 7.

The other source drain region s5 of the semiconductor layer 30S is electrically coupled to a second relay layer 217 via the contact hole CNT 3. A formation material similar to that of the data line 6 and the relay layer 207 is used for the second relay layer 217. The second relay layer 217 is electrically coupled to a first relay layer 209 via a contact hole CNT 9 penetrating the third interlayer insulating layer 12.

A similar formation material to that of the capacitance line 8 of the fifth layer is also used for the first relay layer 209. The first relay layer 209 is electrically coupled to the pixel electrode 15 via the first contact hole CNT 6 penetrating the fourth interlayer insulating layer 13 above.

The configuration of the element substrate 210 other than the above-described configuration is similar to the configuration of the element substrate 10 of the first exemplary embodiment.

2.2. Method for Manufacturing Liquid Crystal Apparatus

A method for manufacturing the liquid crystal apparatus in the present exemplary embodiment will now be described. The method for manufacturing the liquid crystal apparatus of the present exemplary embodiment includes a method for manufacturing the element substrate 210, and known techniques can be adopted except for steps included in the method for manufacturing the element substrate 210. Additionally, the method for manufacturing the element substrate 210 includes the method of manufacturing the element substrate 10 of the first exemplary embodiment. Thus, in the following description, only steps specific in the method for manufacturing the element substrate 210 will be described. Note that, in the following method for manufacturing, known techniques can be adopted unless otherwise noted.

The method for manufacturing the element substrate 210 of the present exemplary embodiment will be described, with reference to FIG. 35A to FIG. 47. FIG. 35A, FIG. 35B, FIG. 36, FIG. 38, FIG. 39, FIG. 41, FIG. 43, and FIG. 45 are schematic cross-sectional views illustrating the method for manufacturing the element substrate. FIG. 37, FIG. 40, FIG. 42, FIG. 44, FIG. 46, and FIG. 47 are schematic plan views illustrating the method for manufacturing the element substrate. Note that, the method for manufacturing the element substrate 210 has similar steps to those of the element substrate 10 of the first exemplary embodiment, and thus FIG. 6 will also be referred to in the following description.

Figure 35A:
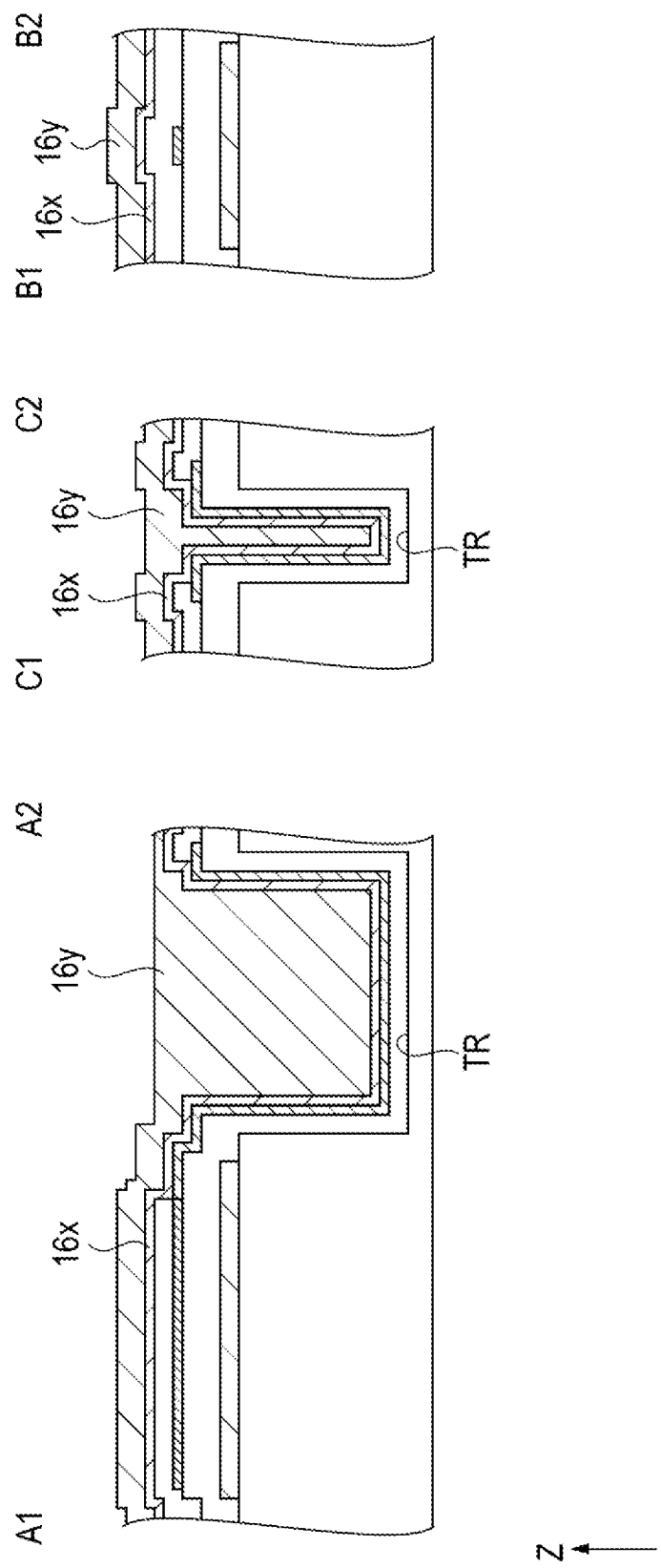
FIG. 35A is a schematic cross-sectional view illustrating a method for manufacturing the element substrate.

First, of the process flow of the first exemplary embodiment illustrated in FIG. 6, step S1 to step S6 are performed similarly to the first exemplary embodiment. Then, as illustrated in FIG. 35A, the second conductive layer 16y is provided in a solid form on the insulating layer 16x.

Figure 35B:
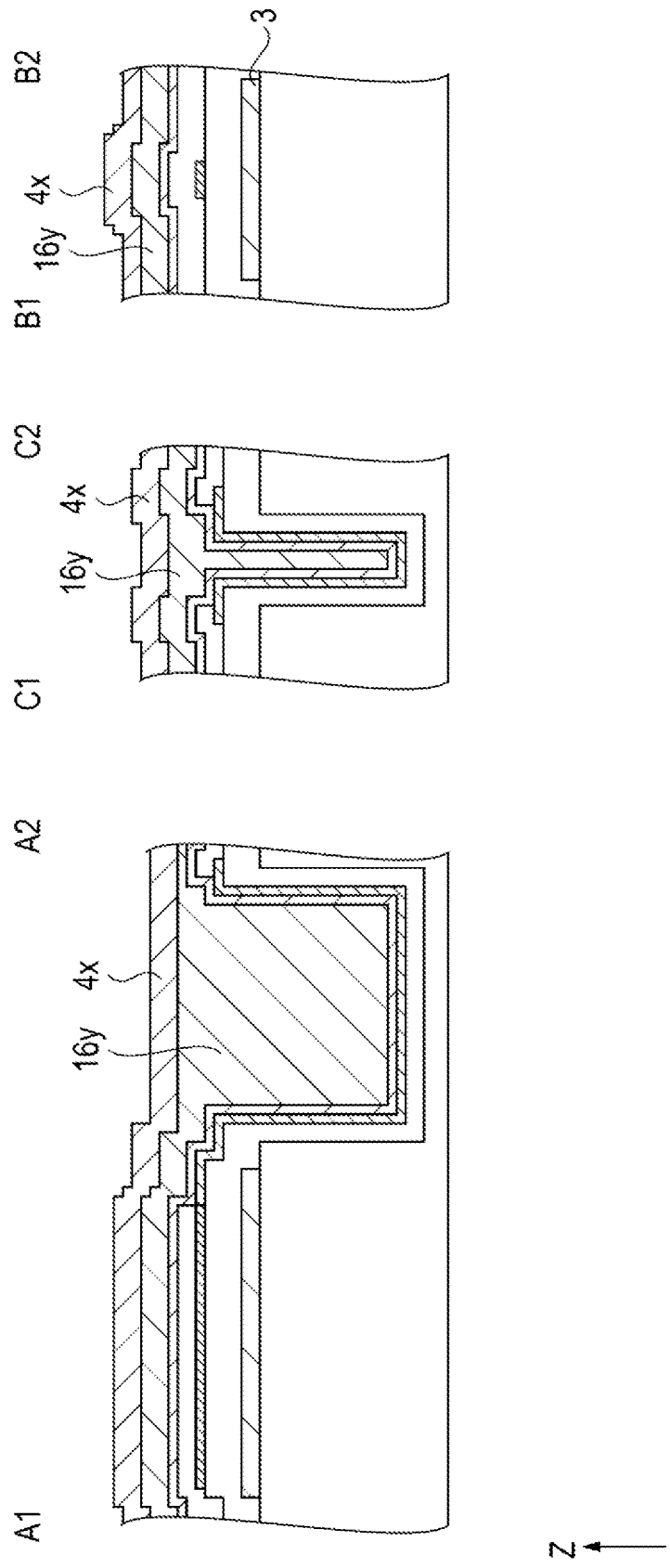
FIG. 35B is a schematic cross-sectional view illustrating the method for manufacturing the element substrate.

Next, as illustrated in FIG. 35B, the third conductive layer 4x is provided in a solid form on the second conductive layer 16y. In the element substrate 210, the third conductive layer 4x turning to the second gate electrode g2 is not electrically coupled to the scan line 3 via a contact hole.

Figure 36:
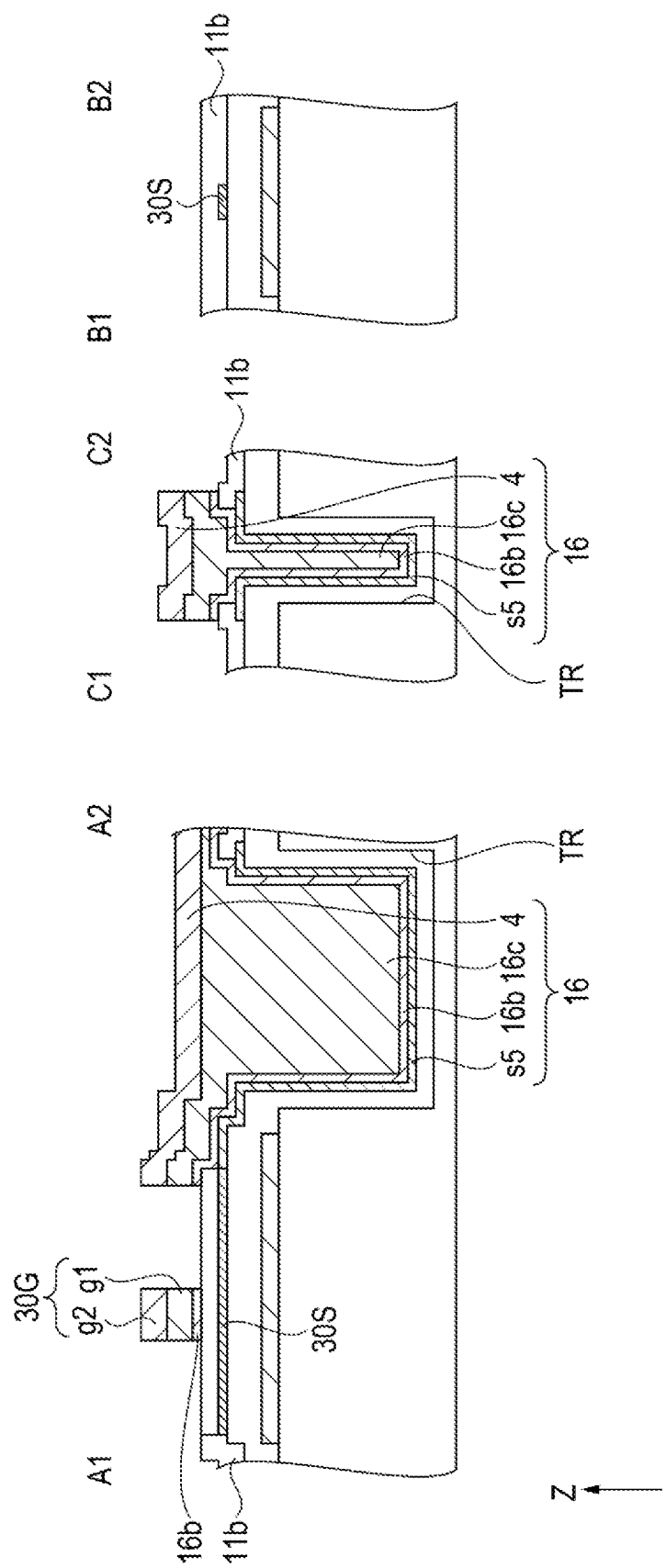
FIG. 36 is a schematic cross-sectional view illustrating the method for manufacturing the element substrate.

Next, as illustrated in FIG. 36, the gate electrode 30G, the capacitance element 16, and the like, are provided. This step corresponds to step S8 of the first exemplary embodiment. Specifically, the insulating layer 16x, the second conductive layer 16y, and the third conductive layer 4x are patterned using the dry etching.

Figure 37:
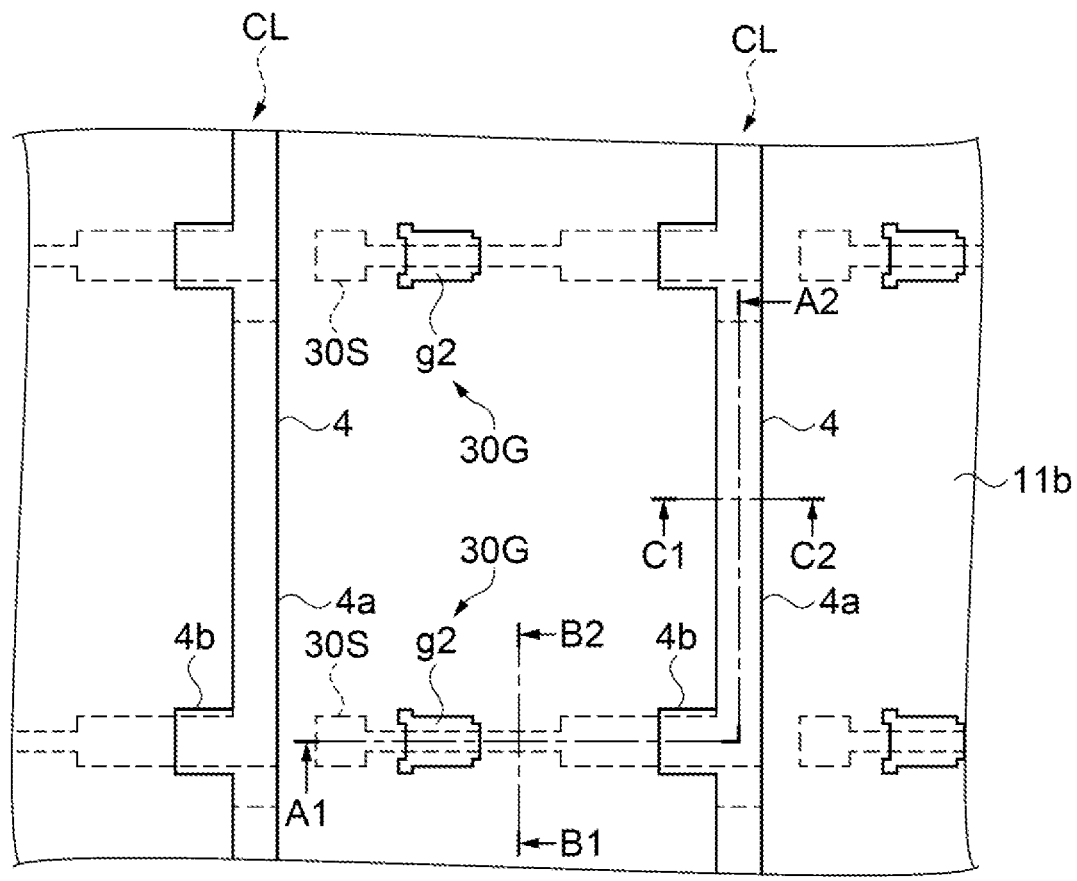
FIG. 37 is a schematic plan view illustrating the method for manufacturing the element substrate.

As illustrated in FIG. 37, the gate electrode 30G is provided in a state of an island independently of the second upper capacitance electrode 4 and the like. The second upper capacitance electrode 4 is provided extending in the ±Y direction. Note that, although not illustrated, the first gate electrode g1 and the capacitance insulation layer 16b, below the second gate electrode g2 are overlapped and disposed on the gate electrode 30G. Further, the first upper capacitance electrode 16c is overlapped and disposed on the second upper capacitance electrode 4.

At this time, as in the first exemplary embodiment, the insulating layer 16x of silicon nitride is removed in a region other than the gate electrode 30G and the second upper capacitance electrode 4. In other words, in a region on the semiconductor layer 30S that does not overlap with the gate electrode 30G of the semiconductor layer 30S and the capacitance insulation layer 16b below the gate electrode 30G, silicon nitride is not provided.

Figure 38:
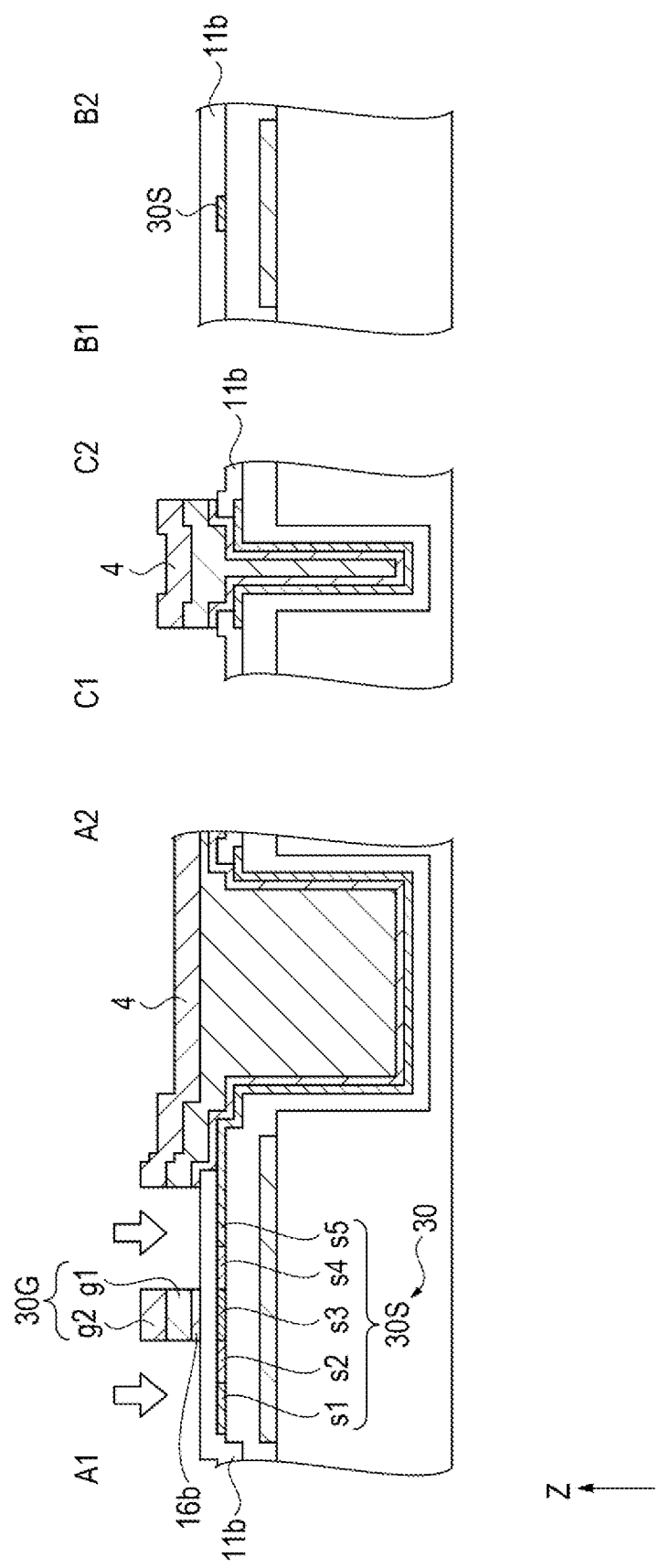
FIG. 38 is a schematic cross-sectional view illustrating the method for manufacturing the element substrate.

Next, as illustrated in FIG. 38, as in the first exemplary embodiment, the one source drain region s1, the LDD regions s2, s4, the channel region s3, and a part of the other source drain region s5 are provided on the semiconductor layer 30S. This step corresponds to step S9 of the first exemplary embodiment.

Next, the second interlayer insulating layer 11c is provided on the second gate electrode g2, the second upper capacitance electrode 4, and the gate insulation layer 11b exposed upward. Next, the impurity activation annealing at about 1000° C. is performed, and followed by the hydrogen plasma processing. This step corresponds to step S10 of the first exemplary embodiment.

Figure 39:
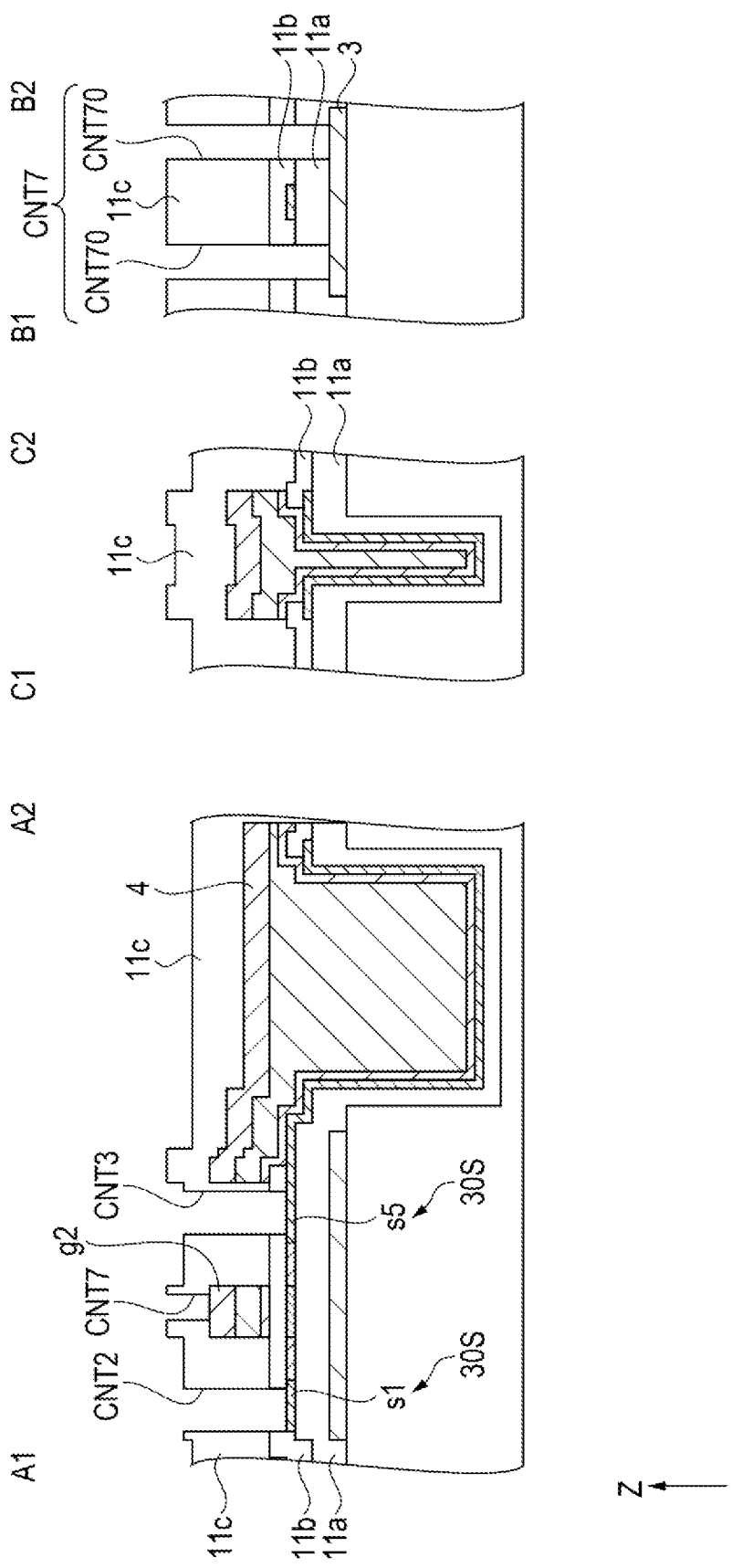
FIG. 39 is a schematic cross-sectional view illustrating the method for manufacturing the element substrate.

Next, as illustrated in FIG. 39, the contact hole CNT 7 including a pair of contact holes CNT 70 is provided by the dry etching. The pair of contact holes CNT 70 are through holes for providing the light shielding wall 77. The pair of contact holes CNT 70 penetrate the first interlayer insulating layer 11a, the gate insulation layer 11b, and the second interlayer insulating layer 11c to reach as far as the scan line 3. The pair of contact holes CNT 70 are disposed facing each other in the ±Y direction with a part of the semiconductor layer 30S interposed therebetween. A site of the contact hole CNT 7 other than the pair of contact holes CNT 70 penetrates the second interlayer insulating layer 11c and reaches as far as the second gate electrode g2.

Figure 40:
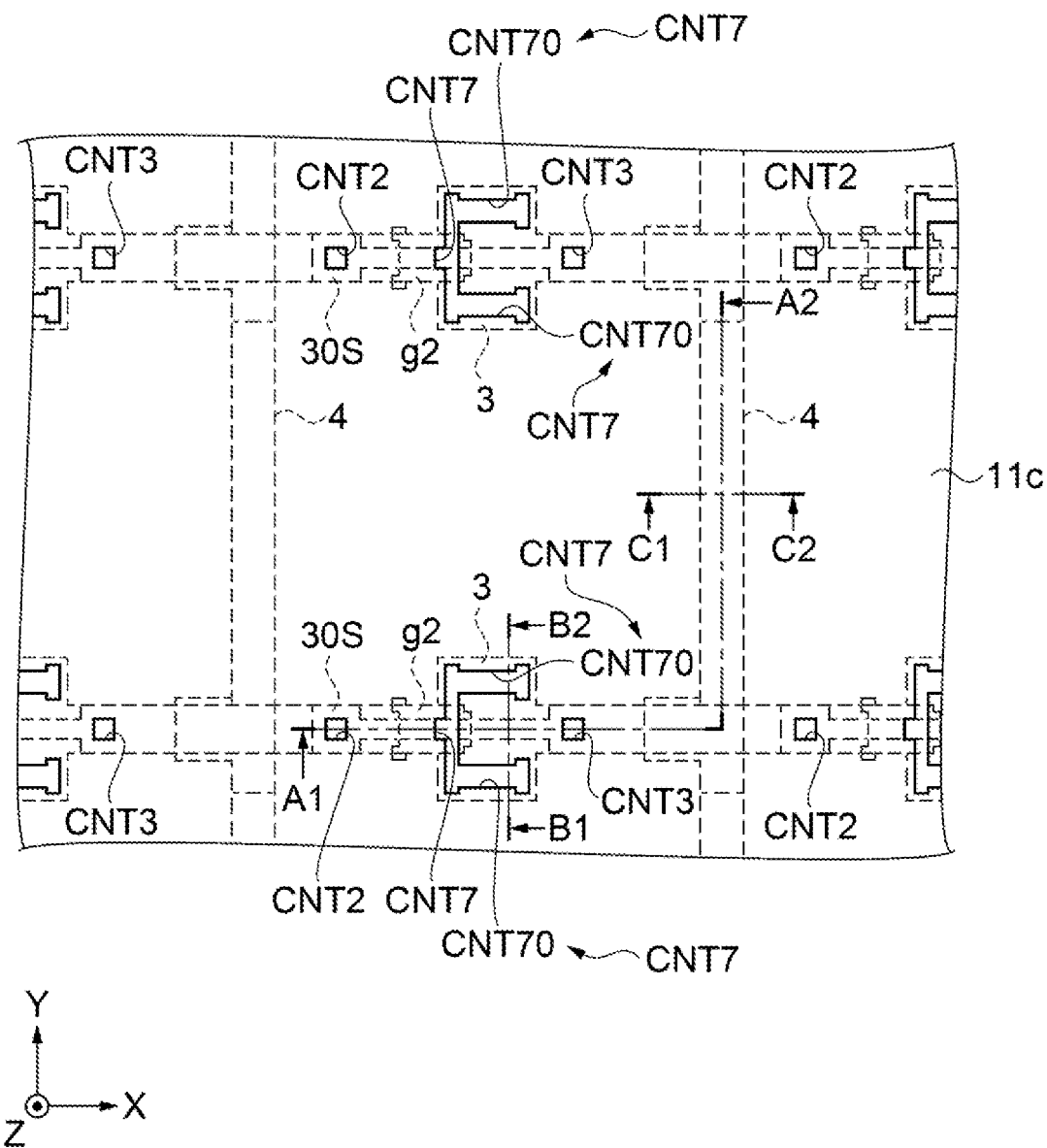
FIG. 40 is a schematic plan view illustrating the method for manufacturing the element substrate.

As illustrated in FIG. 40, the contact hole CNT 7 includes the pair of contact holes CNT 70 facing each other in the ±Y direction with the semiconductor layer 30S interposed therebetween. The site of the contact hole CNT 7 other than the pair of contact holes CNT 70 is disposed along the ±Y direction intersecting with the semiconductor layer 30S.

Figure 41:
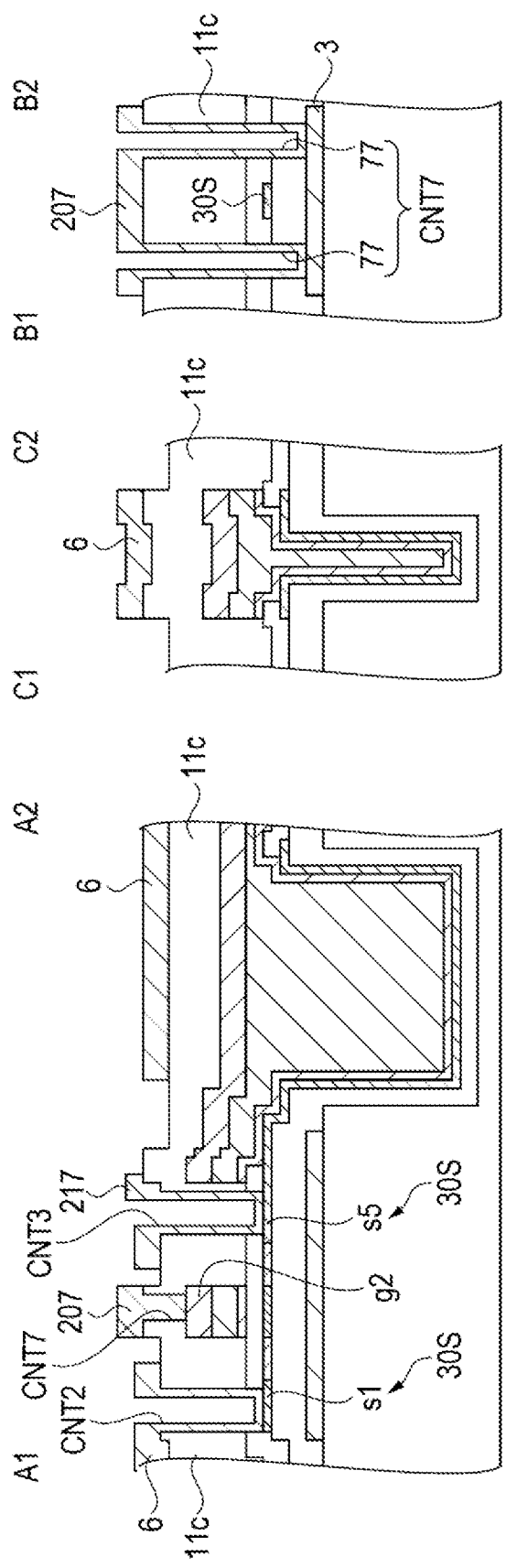
FIG. 41 is a schematic cross-sectional view illustrating the method for manufacturing the element substrate.

Next, the data line 6, the relay layer 207, and the second relay layer 217 are provided. This step corresponds to step S11 of the first exemplary embodiment. Specifically, as illustrated in FIG. 41, when the data line 6, the relay layer 207, and the second relay layer 217 are provided, the contact holes CNT 2, CNT 3, and the contact hole CNT 7 including the pair of contact holes CNT 70 are filled. The light shielding wall 77 is provided in the contact hole CNT 70 of the contact hole CNT 7.

Figure 42:
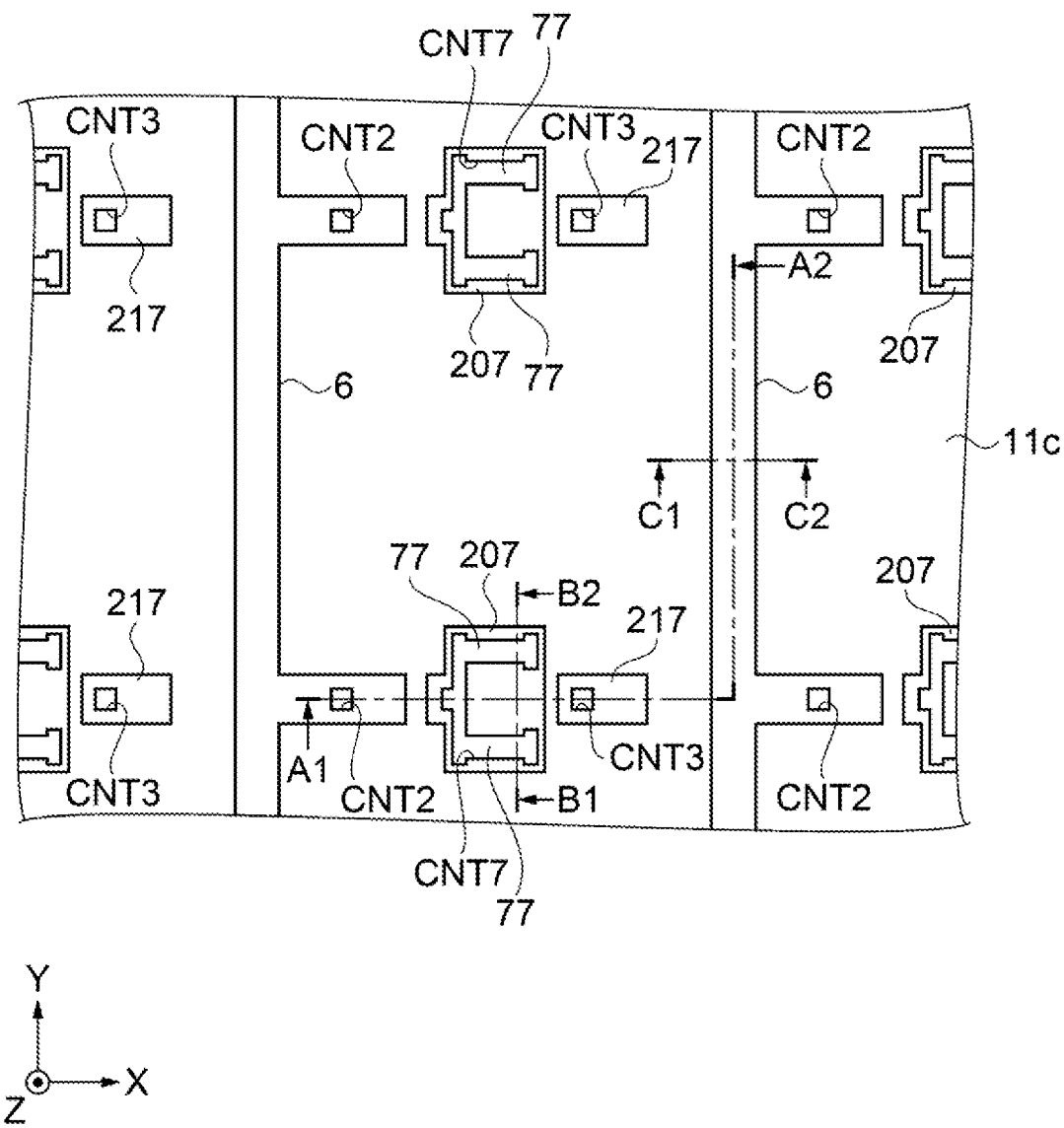
FIG. 42 is a schematic plan view illustrating the method for manufacturing the element substrate.

As illustrated in FIG. 42, the data line 6 is provided extending in the ±Y direction, and overlaps with a site of the other source drain region s5 (not illustrated) that extends in the ±Y direction. In other words, the data line 6 is provided extending in the ±Y direction, and overlaps with the trench TR and the capacitance element 16. The data line 6 has a site protruding in the +X direction that overlaps with the non-opening area CL extending in the ±X direction. The contact hole CNT 2 is provided in the site.

The relay layer 207 is provided in a state of an island independent of the data line 6, and is electrically coupled to the scan line 3 and the second gate electrode g2 via the contact hole CNT 7. The relay layer 207 includes a main body portion extending in the ±X direction and overlapping with a part of the semiconductor layer 30S below (not illustrated), and a protruding portion protruding in the ±Y direction from the main body portion.

The second relay layer 217 is provided in a state of an island independent of the data line 6 and the relay layer 207. The second relay layer 217 is electrically coupled to the other source drain region s5 of the semiconductor layer 30S, via the contact hole CNT 3.

Next, an upper layer of the data line 6 as in the first exemplary embodiment is formed. This step corresponds to step S12 of the first exemplary embodiment. First, the third interlayer insulating layer 12 is provided in a solid form, on the data line 6, the second relay layer 217, the relay layer 207, and the second interlayer insulating layer 11c exposed upward.

Figure 43:
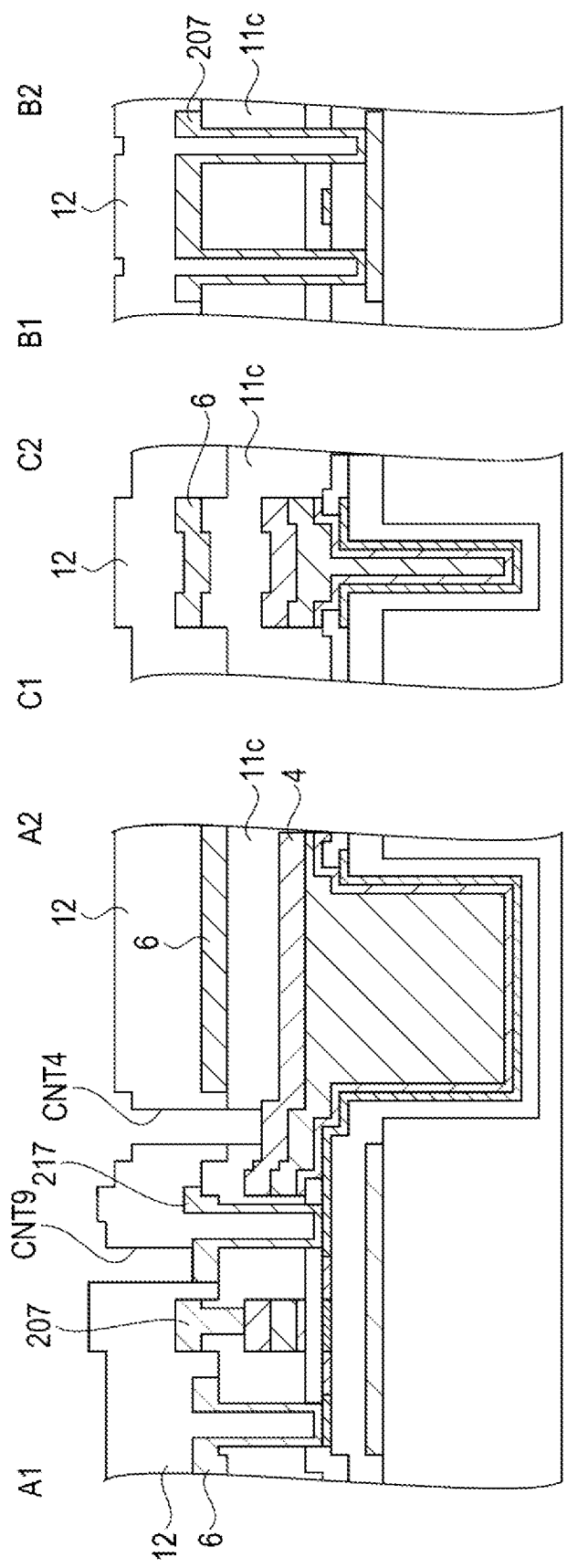
FIG. 43 is a schematic cross-sectional view illustrating the method for manufacturing the element substrate.
Figure 44:
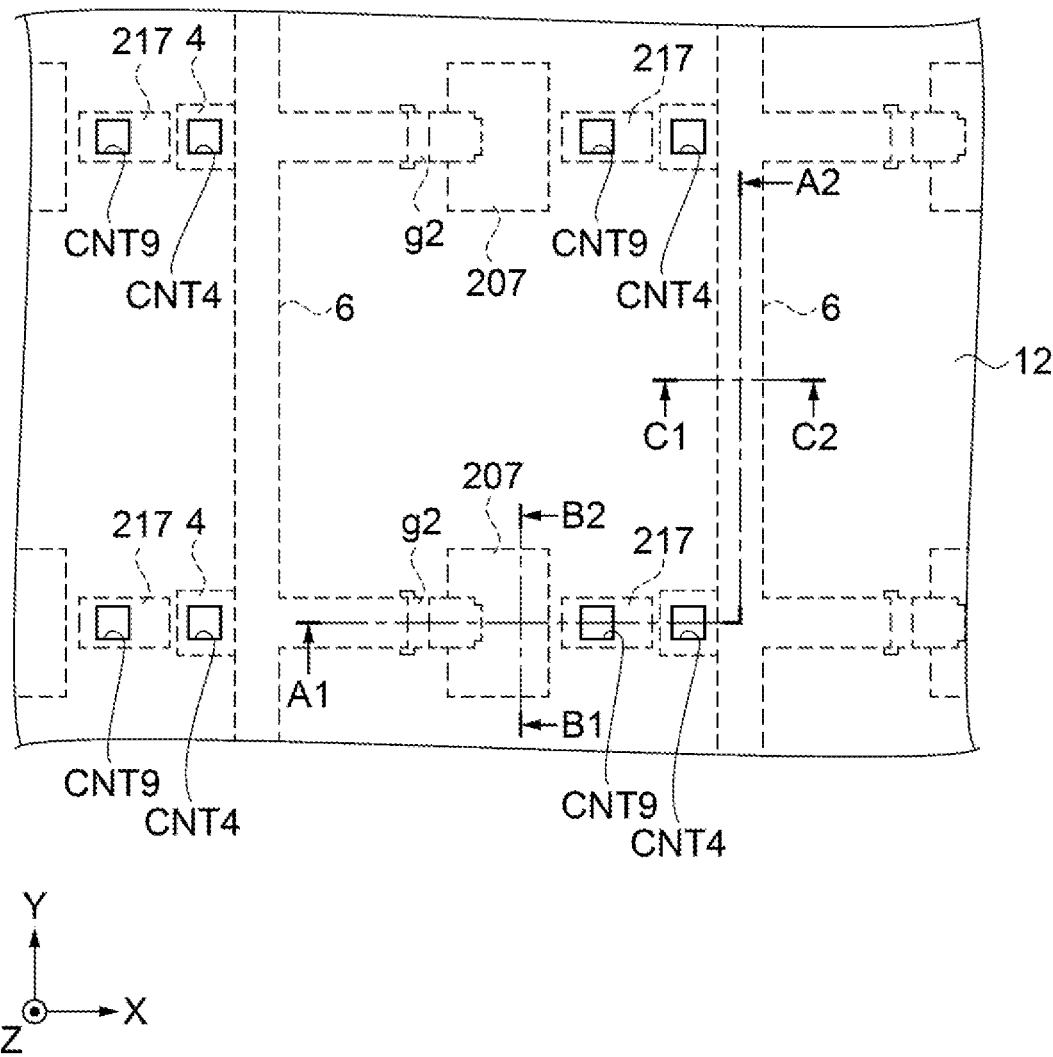
FIG. 44 is a schematic plan view illustrating the method for manufacturing the element substrate.

Next, as illustrated in FIG. 43 and FIG. 44, the contact holes CNT 4 and CNT 9 are provided by the dry etching. The contact hole CNT 4 penetrates the third interlayer insulating layer 12 and the second interlayer insulating layer 11c, and reaches as far as the second upper capacitance electrode 4 of the capacitance element 16. The contact hole CNT 9 penetrates the third interlayer insulating layer 12 and reaches as far as the second relay layer 217.

Figure 45:
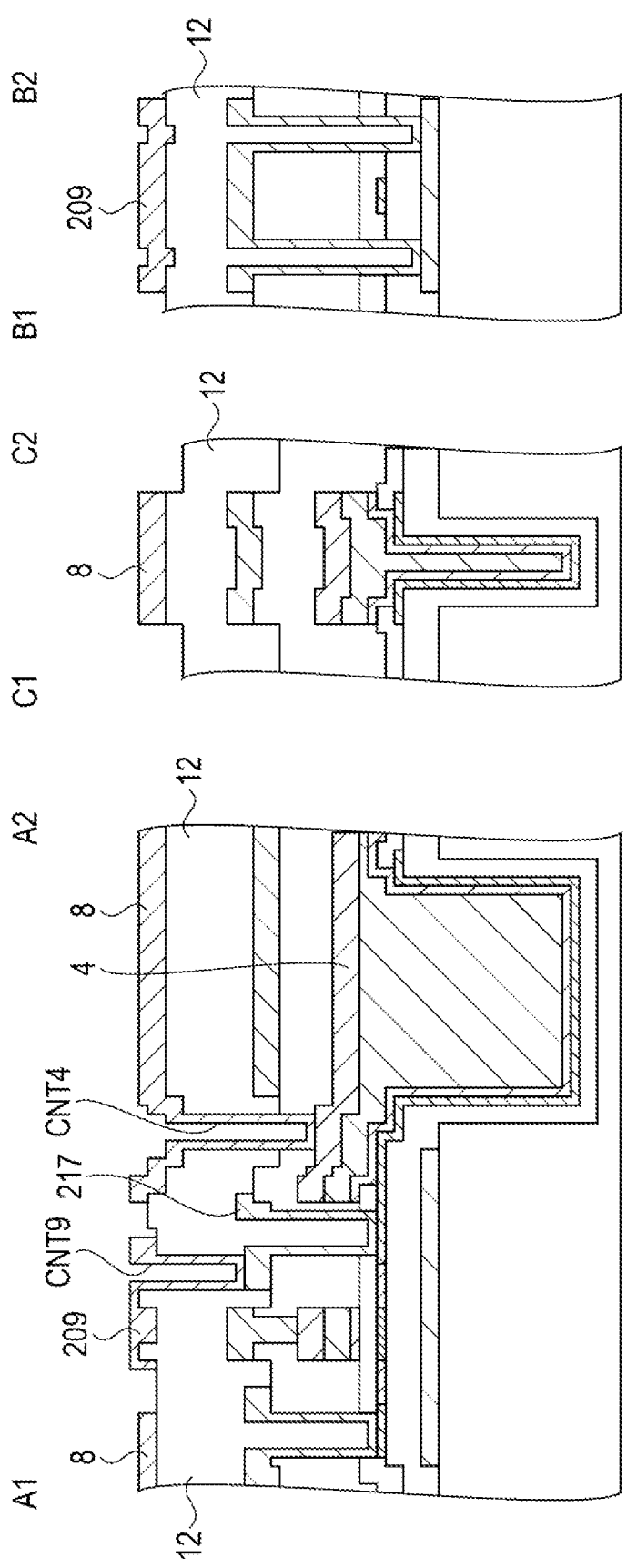
FIG. 45 is a schematic cross-sectional view illustrating the method for manufacturing the element substrate.
Figure 46:
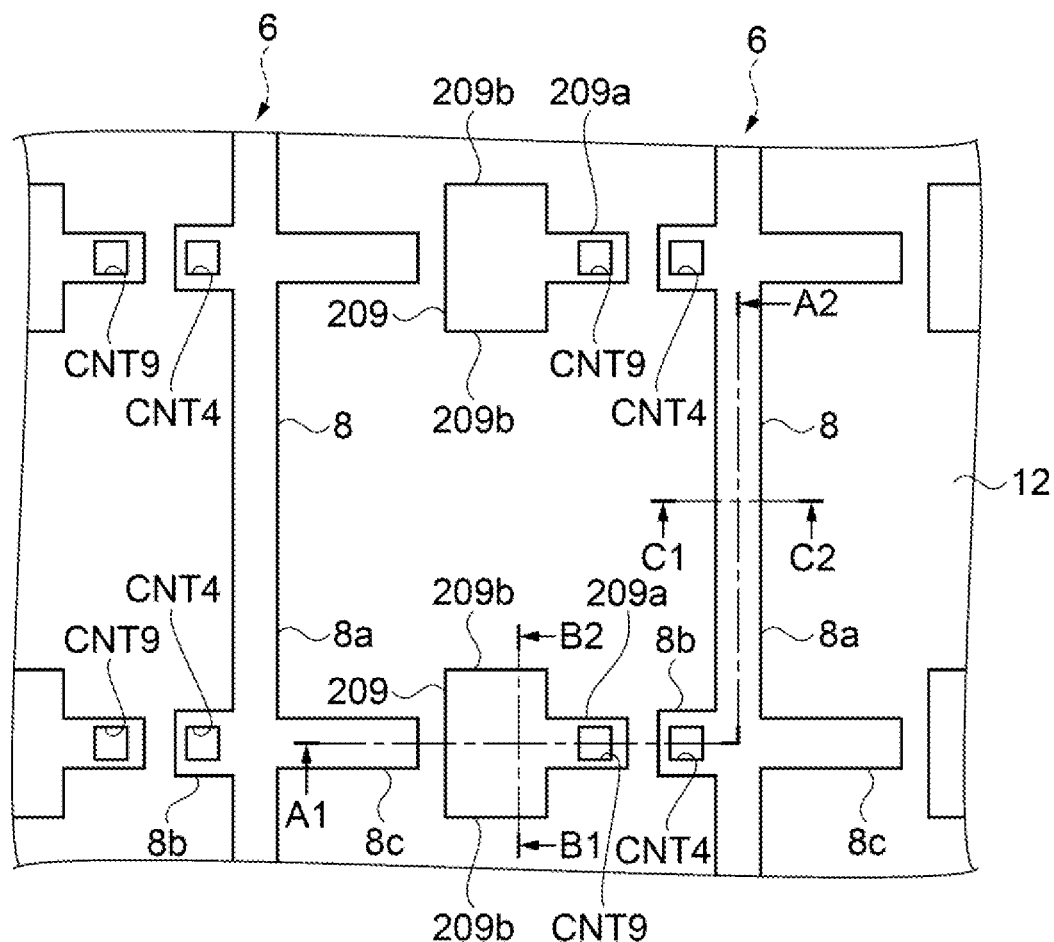
FIG. 46 is a schematic plan view illustrating the method for manufacturing the element substrate.

Next, the capacitance line 8 and the first relay layer 209 are provided. Specifically, as illustrated in FIG. 45 and FIG. 46, when the capacitance line 8 and the first relay layer 209 are provided, the contact holes CNT 4 and CNT 9 are filled.

The first relay layer 209 is provided in a state of an island independent of the capacitance line 8, and is electrically coupled to the second relay layer 217 via contact holes CNT 9. The first relay layer 209 includes a main body portion 209a extending in the ±X direction and overlapping with a part of the semiconductor layer 30S below, and a protruding portion 209b protruding in the ±Y direction from the main body portion 9a.

The first relay layer 209 is electrically coupled to the other source drain region s5 of the semiconductor layer 30S, via the contact hole CNT 9, the second relay layer 217, and the contact hole CNT 3.

Next, the fourth interlayer insulating layer 13 is provided in a solid form, on the capacitance line 8, the first relay layer 209, and the third interlayer insulating layer 12 exposed upward. Thereafter, the fourth interlayer insulating layer 13 is subjected to the planarization process such as the CMP process.

Figure 47:
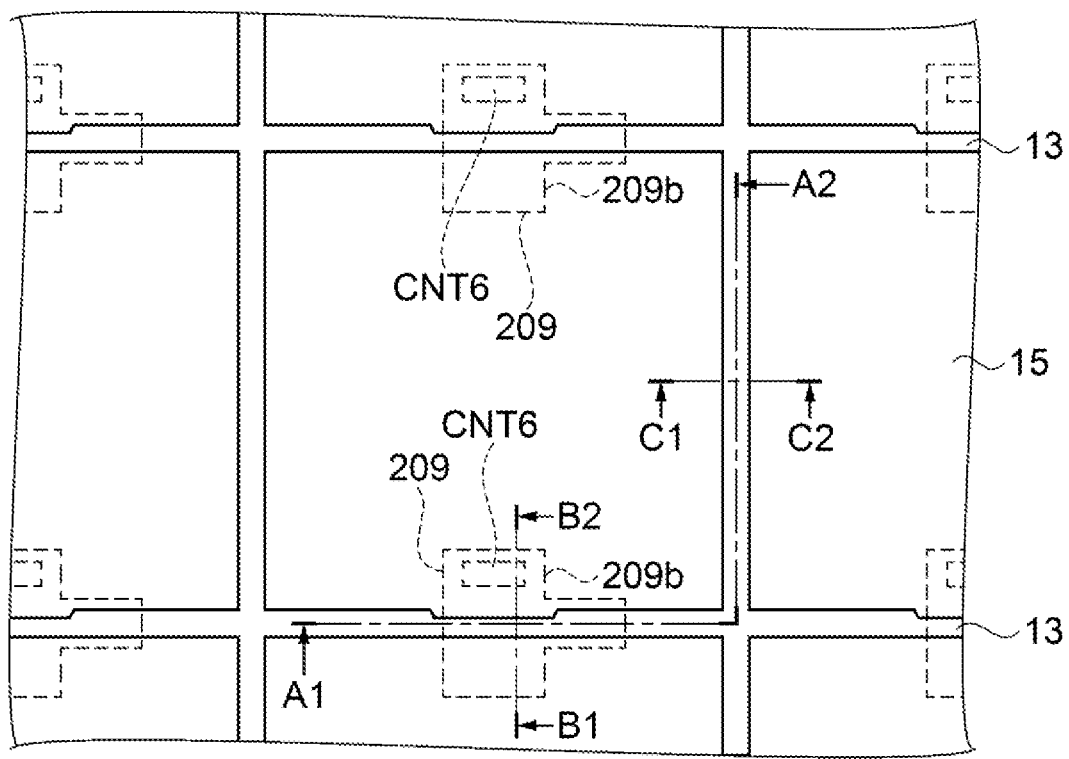
FIG. 47 is a schematic plan view illustrating the method for manufacturing the element substrate.

Next, a through hole penetrating the fourth interlayer insulating layer 13 to expose the first relay layer 209 is provided by the dry etching. Thereafter, as illustrated in FIG. 47, the pixel electrode 15 corresponding to the opening area OP is provided on the fourth interlayer insulating layer 13. At this time, the first contact hole CNT 6 is also provided so as to fill the above through hole. The pixel electrode 15 is electrically coupled to the other source drain region s5 of the semiconductor layer 30S, via the first contact hole CNT 6, the first relay layer 209, the contact hole CNT 9, the second relay layer 217, and the contact hole CNT 3.

Of the method for manufacturing the element substrate 210, known techniques can be used for subsequent steps, and descriptions thereof will be omitted. According to the method for manufacturing described above, the element substrate 210 and the liquid crystal apparatus including the element substrate 210 are manufactured.

According to the present exemplary embodiments, the following advantages can be obtained, in addition to the effects of the first exemplary embodiment.

The light shielding wall 77 can reduce light incident on the TFT 30, and further enhance light shielding properties for the TFT 30. In addition, common potential identical to that of the scan line 3 can be applied to the gate electrode 30G via the light shielding wall 77.

In the element substrate 10 of the first exemplary embodiment, the pair of contact holes CNT 1, the contact holes CNT 2, and CNT 3 are provided in the separate steps, but the pair of contact holes CNT 70 corresponding to the pair of contact holes CNT 1, contact holes CNT 2, CNT 3, and the like, are provided in one step. Thus, it is possible to reduce the etching process for providing the through hole, and the manufacturing process can be further simplified.

3. Third Exemplary Embodiment 3.1. Electronic Apparatus

Figure 48:
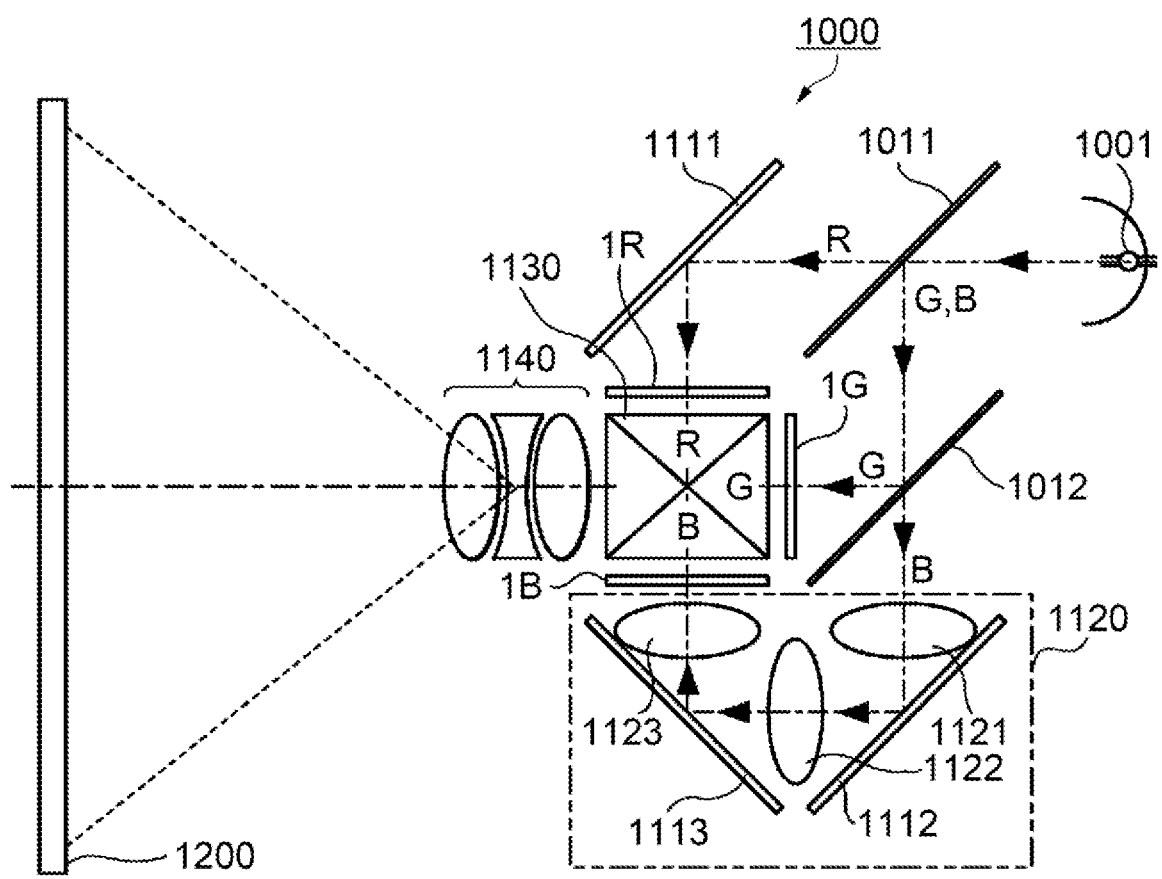
FIG. 48 is a schematic view illustrating a configuration of a projection-type display apparatus as an electronic apparatus according to a third exemplary embodiment.

With reference to FIG. 48, an electronic apparatus of the present exemplary embodiment will be described by using a projection-type display apparatus as an example. FIG. 48 is a schematic view illustrating a configuration of the projection-type display apparatus as the electronic apparatus according to a third exemplary embodiment.

As illustrated in FIG. 48, a projection-type display apparatus 1000 as the electronic apparatus according to the present exemplary embodiment includes a lamp unit 1001 as a light source, dichroic mirrors 1011, 1012 as a color separation optical system, and three liquid crystal apparatuses 1B, 1G, 1R that are electro-optical panels, three reflection mirrors 1111, 1112, 1113, three relay lenses 1121, 1122, 1123, a dichroic prism 1130 as a color synthesis optical system, and a projection lens 1140 as a projection optical system.

In the lamp unit 1001, for example, a discharge type light source is adopted. The method of the light source is not limited thereto, and a solid light source such as a light emitting diode, laser, or the like may be adopted.

Light exited from the lamp unit 1001 is separated by the two dichroic mirrors 1011 and 1012 into color light of three colors having different wavelength ranges from each other. The color light of three colors includes substantially red light, substantially green light, and substantially blue light. In the following description, the substantially red light is also referred to as red light R, the substantially green light is also referred to as green light G, and the substantially blue light is also referred to as blue light B.

The dichroic mirror 1011 transmits red light R and reflects green light G and blue light B each having a wavelength shorter than that of the red light R. The red light R transmitted through the dichroic mirror 1011 is reflected by the reflection mirror 1111 and is incident on the liquid crystal apparatus 1R. The green light G reflected by the dichroic mirror 1011 is reflected by the dichroic mirror 1012, and is then incident on the liquid crystal apparatus 1G. The blue light B reflected by the dichroic mirror 1011 transmits the dichroic mirror 1012 and is exited toward a relay lens system 1120.

The relay lens system 1120 includes the relay lenses 1121, 1122, 1123 and the reflection mirrors 1112, and 1113. Since a light path of the blue light B is longer compared to the green light G and the red light R, luminous flux tends to be larger. Thus, expansion of the luminous flux is suppressed using the relay lens 1122. The blue light B incident on the relay lens system 1120 is reflected by the reflection mirror 1112 and is converged in a vicinity of the relay lens 1122 by the relay lens 1121. Then, the blue light B is incident on the liquid crystal apparatus 1B via the reflection mirror 1113 and the relay lens 1123.

The liquid crystal apparatus 100 as the electro-optical device of the first exemplary embodiment is applied to the liquid crystal apparatuses 1R, 1G, and 1B that are light modulating devices, in the projection-type display apparatus 1000. Additionally, a liquid crystal apparatus other than the first exemplary embodiment may be applied as the liquid crystal apparatuses 1R, 1G, and 1B.

Each of the liquid crystal apparatuses 1R, 1G, and 1B is electrically coupled to an upper circuit of the projection-type display apparatus 1000. Accordingly, image signals specifying gray scale levels of the red light R, the green light G, and the blue light B are supplied from external circuits respectively, and processed by the upper circuit. Thus, the liquid crystal apparatuses 1R, 1G, and 1B are driven and the color light of each the apparatus is modulated.

The red light R, the green light G, and the blue light B modulated by the liquid crystal apparatuses 1R, 1G, and 1B, respectively are incident on the dichroic prism 1130 from three directions. The dichroic prism 1130 synthesizes the red light R, the green light G, and the blue light B entered. In the dichroic prism 1130, red light R and the blue light B are reflected by 90 degrees, and the green light G transmits. Thus, the red light R, the green light G, and the blue light B are synthesized as display light for displaying a color image and exited toward the projection lens 1140.

The projection lens 1140 is disposed so as to face outside the projection-type display apparatus 1000. The display light is expanded via the projection lens 1140 and exited, and projected onto a screen 1200 that is a target of projection.

In the present exemplary embodiment, the projection-type display apparatus 1000 is illustrated as the electronic apparatus, but electronic apparatuses to which the electro-optical device according to the present disclosure is applied is not limited thereto. For example, the electro-optical device according to the present disclosure may be applied to an electronic apparatus such as a projection type Head-Up Display (HUD), a direct view type Head Mounted Display (HMD), a personal computer, a digital camera, a liquid crystal television, or the like.

As described above, according to the projection-type display apparatus 1000 according to the present exemplary embodiment, the following advantages can be achieved.

In the liquid crystal apparatuses 1R, 1G, and 1B, potential retention capability of the pixel P is improved, occurrence of optical leakage current is suppressed, and display quality is improved. In addition, the projection-type display apparatus 1000 with reduced manufacturing costs can be provided.

Contents derived from the exemplary embodiments will be described below.

An electro-optical device includes a scan line extending in a first direction, a data line extending in a second direction that intersects with the first direction, a transistor having a semiconductor layer in which, at a position overlapping with the scan line, one source drain region and a channel region extend along the first direction, and at a position overlapping with the data line, another source drain region extends along the second direction, and a capacitance element having a capacitance electrode provided, at a position overlapping with the data line, so as to overlap with the other source drain region.

According to this configuration, a high opening ratio of a pixel can be achieved. Specifically, the one source drain region and the channel region of the semiconductor layer are overlapped and disposed on the scan line, and the other source drain region and the capacitance element are over-lapped and disposed on the data line. Thus, by thinning the scan line and the data line, the opening ratio can be easily ensured, and light utilization efficiency can be increased. Further, a retention capacitor can be increased and manufacturing costs can be reduced.

Further, in the capacitance element, the other source drain region that extends of the semiconductor layer is a lower capacitance electrode, and an upper capacitance electrode that is, for example, the capacitance electrode is disposed in the same layer as a gate electrode of the transistor, so as to overlap with the lower capacitance electrode. In other words, since a part of the layer constituting the transistor is used as the lower capacitance electrode or the upper capacitance electrode, a manufacturing process can be simplified. As described above, it is possible to provide the electro-optical device that can increase the light utilization efficiency while suppressing deterioration in display quality and reduce the manufacturing costs.

The above electro-optical device may include a substrate, the substrate may include a recessed portion at a position overlapping with the data line, and the other source drain region may extend along a side surface and a bottom surface of the recessed portion.

According to this configuration, the capacitance element is disposed on an inside of the recessed portion that is the side surface and the bottom surface of the recessed portion, and an area of the capacitance element is enlarged. Further, by deepening the recessed portion of the capacitance element, it is possible to increase the retention capacitor. Accordingly, the retention capacitor of the capacitance element can be further increased.

The above electro-optical device may include an insulating layer in the recessed portion, and the other source drain region may extend on the insulating layer.

According to this configuration, since the insulating layer is disposed in the recessed portion, the recessed portion is not made too wide, compared to a case where there is no insulating layer. Thus, the data line and the like disposed on the recessed portion are made less likely to fall in the recessed portion, and it is possible to suppress occurrence of disconnection or the like in the data line.

The above electro-optical device may include a pixel electrode provided corresponding to the transistor, and a first relay layer electrically connected to the pixel electrode via a first contact hole, and the first contact hole may overlap with a second contact hole for electrically coupling a gate electrode of the transistor to the scan line.

According to this configuration, since the first relay layer overlaps with the second contact hole, the opening ratio in the electro-optical device can be improved, compared to a case where the first relay layer does not overlap with the second contact hole.

In the above electro-optical device, a gate insulation layer of the transistor includes a silicon oxide film and a silicon nitride film, and a capacitance insulation layer of the capacitance element may be constituted only by a silicon nitride film.

According to this configuration, insulating properties of the gate insulation layer can be ensured, and the capacitance insulation layer can be made thinner than the gate insulation layer. In other words, the retention capacitor of the capacitance element can be further increased.

In the above electro-optical device, a silicon nitride film may not be provided in a region of the semiconductor layer that does not overlap with the gate electrode and the capacitance electrode.

According to this configuration, in a hydrogen plasma processing step, defects in the semiconductor layer are terminated with hydrogen, and characteristics of a switching element are improved.

The above electro-optical device may include the pixel electrode provided corresponding to the transistor, the first relay layer electrically connected to the pixel electrode, and a second relay layer electrically connected to the first relay layer, the first relay layer and the second relay layer may each include a main body portion extending in the first direction, and overlapping with the semiconductor layer, and a protruding portion protruding in the second direction from the main body portion.

According to this configuration, since the respective main body portions of the first relay layer and the second relay layer overlap with the semiconductor layer, a light shielding property is improved, and occurrence of light leakage current in the transistor can be suppressed. In addition, the respective protruding portions of the first relay layer and the second relay layer can improve the light shielding property, and by providing contact holes, electrical coupling to an upper layer or a lower layer can be ensured.

The above electro-optical device may include a capacitance wiring line electrically connected to the capacitance electrode, and the capacitance wiring line and the capacitance electrode may each include a main body portion extending in the second direction, and overlapping with the data line, and a protruding portion protruding in the first direction from the main body portion, and overlapping with the semiconductor layer extending in the first direction.

According to this configuration, light incident on the transistor is reduced by the protruding portion overlapping with the semiconductor layer, and the light shielding property for the transistor can be improved.

In the above electro-optical device, the capacitance wiring line may include another protruding portion protruding toward an opposite side to the protruding portion, and overlapping with another semiconductor layer adjacent to the semiconductor layer.

According to this configuration, light incident on the transistor of the other semiconductor layer is reduced by the other protruding portion, and the light shielding property for the transistor can be further improved. Additionally, effects of potential fluctuations of the data line and the scan line can be electrically shielded by the capacitance wiring line to which constant potential is applied and a protruding portion of the capacitance wiring line, and deterioration in display quality can be prevented.

The above electro-optical device may include a light shielding wall provided along a part of the semiconductor layer, and the light shielding wall may include an identical material to that of the data line.

According to this configuration, light incident on the transistor is reduced by the light shielding wall, and the light shielding property for the transistor can be further improved.

In the above electro-optical device, the gate electrode of the transistor may be electrically connected to the scan line via the light shielding wall.

According to this configuration, the gate electrode can be provided with identical potential to potential applied to the scan line.

An electronic apparatus includes the above electro-optical device.

According to this configuration, the electronic apparatus can be provided, in which display quality of the mounted electro-optical device is improved, with manufacturing costs reduced.

What is claimed is:
1. An electro-optical device, comprising:
  a scan line extending along a first direction;
  a first data line including:
    a first body portion extending along a second direction that intersects with the first direction, and
    a first protrusion portion protruding from the first body portion along the first direction;
  a second data line adjacent to the first data line, the second data line including:
    a second body portion extending along the second direction, and a second protrusion portion protruding from the second body portion along the first direction;

a transistor having a semiconductor layer which includes one source drain region at least partially overlapping with the scan line in plan view and electrically connected to the first protrusion portion of the first data line, a channel region at least partially overlapping with the scan line in plan view, and another source drain region at least partially overlapping with the second body portion of the second data line in plan view, and in which, at a position overlapping with the scan line in plan view, the one source drain region and the channel region extend along the first direction, and at a position overlapping with the second body portion of the second data line in plan view, the other source drain region extends along the second direction; and a capacitance element having a capacitance electrode provided, at a position overlapping with the second body portion of the second data line, so as to overlap with the other source drain region in plan view.

2. The electro-optical device according to claim 1, further comprising a substrate, wherein the substrate includes a recessed portion at a position overlapping with the second body portion of the second data line, and the other source drain region extends along a side surface and a bottom surface of the recessed portion.

3. The electro-optical device according to claim 2, further comprising:

an insulating layer in the recessed portion, wherein the other source drain region extends at the insulating layer.

4. The electro-optical device according to claim 1, further comprising:

a pixel electrode provided corresponding to the transistor; and a first relay layer electrically connected to the pixel electrode via a first contact hole, wherein the first contact hole overlaps, in plan view, with a second contact hole for electrically coupling a gate electrode of the transistor to the scan line.

5. The electro-optical device according to claim 1, wherein a gate insulation layer of the transistor includes a silicon oxide film and a silicon nitride film, and a capacitance insulation layer of the capacitance element only includes a silicon nitride film.

6. The electro-optical device according to claim 5, wherein a silicon nitride film is not provided in a region of the semiconductor layer that does not overlap, in plan view, with the gate electrode and the capacitance electrode.

7. The electro-optical device according to claim 1, comprising:

a pixel electrode provided corresponding to the transistor, a first relay layer electrically connected to the pixel electrode, and a second relay layer electrically connected to the first relay layer, wherein the first relay layer and the second relay layer each extend in the first direction, and include a main body portion overlapping with the semiconductor layer in plan view and a protruding portion protruding in the second direction from the main body portion.

8. The electro-optical device according to claim 7, further comprising:

a capacitance wiring line electrically connected to the capacitance electrode, wherein the capacitance wiring line and the capacitance electrode each extend in the second direction, and include a main body portion overlapping with the first data line in plan view and a protruding portion protruding in the first direction from the main body portion, and overlapping, in plan view, with the semiconductor layer extending in the first direction.

9. The electro-optical device according to claim 8, wherein the capacitance wiring line includes another protruding portion protruding toward an opposite side to the protruding portion, and overlapping with another semiconductor layer adjacent to the semiconductor layer in plan view.

10. The electro-optical device according to claim 1, comprising:

a light shielding wall provided along a part of the semiconductor layer, wherein the light shielding wall includes an identical material to a material of the first data line.

11. The electro-optical device according to claim 10, wherein a gate electrode of the transistor is electrically connected to the scan line via the light shielding wall.

12. An electronic apparatus comprising the electro-optical device according to claim 1.

* * * * *